United States Patent
Van Ostrand et al.

(10) Patent No.: US 11,906,564 B2
(45) Date of Patent: Feb. 20, 2024

(54) ANALOG AND DIGITAL FREQUENCY DOMAIN DATA SENSING CIRCUIT

(71) Applicant: SigmaSense, LLC., Wilmington, DE (US)

(72) Inventors: Daniel Keith Van Ostrand, Leander, TX (US); Gerald Dale Morrison, Redmond, WA (US); Patrick Troy Gray, Cedar Park, TX (US); Richard Stuart Seger, Jr., Belton, TX (US)

(73) Assignee: SigmaSense, LLC., Wilmington, DE (US)

( * ) Notice: Subject to any disclaimer, the term of this patent is extended or adjusted under 35 U.S.C. 154(b) by 0 days.

(21) Appl. No.: 18/059,480

(22) Filed: Nov. 29, 2022

(65) Prior Publication Data

US 2023/0098237 A1 Mar. 30, 2023

Related U.S. Application Data

(63) Continuation of application No. 17/249,260, filed on Feb. 25, 2021, which is a continuation of application
(Continued)

(51) Int. Cl.
*H03K 5/1252* (2006.01)
*G01R 29/26* (2006.01)
(Continued)

(52) U.S. Cl.
CPC ............. *G01R 29/26* (2013.01); *G01R 31/40* (2013.01); *H03F 3/45475* (2013.01);
(Continued)

(58) Field of Classification Search
CPC .... G01R 19/0053; G01R 29/26; G01R 31/40; H03F 2200/129; H03F 2203/45116;
(Continued)

(56) References Cited

U.S. PATENT DOCUMENTS 4,007,340 A   2/1977   Russell
5,437,178 A   8/1995   Esin et al.
(Continued)

FOREIGN PATENT DOCUMENTS

CN   103995626 A   8/2014
CN   104182105 A   12/2014
(Continued)

OTHER PUBLICATIONS

Baker; How delta-sigma ADCs work, Part 1; Analog Applications Journal; Oct. 1, 2011; 6 pgs.
(Continued)

*Primary Examiner* — Jeffery S Zweizig
(74) *Attorney, Agent, or Firm* — Garlick & Markison; Timothy W. Markison

(57) ABSTRACT

A method includes providing, by a signal source circuit of a sensing circuit, a signal to a sensor via a conductor. When the sensor is exposed to a condition and is receiving the signal, an electrical characteristic of the sensor affects the signal. The signal includes at least one of: a direct current (DC) component and an oscillating component. When the sensing circuit is in a noisy environment, transient noise couples with the signal to produce a noisy signal. The method further includes comparing, by a transient circuit of the sensing circuit, the noisy signal with a representation of the noisy signal. When the noisy signal compares unfavorably with the representation of the noisy signal, supplying, by the transient circuit, a compensation signal to the conductor. A level of the compensation signal corresponds to a level at which the noisy signal compares unfavorably with the representation of the noisy signal.

19 Claims, 38 Drawing Sheets

Related U.S. Application Data

No. 16/195,349, filed on Nov. 19, 2018, now Pat. No. 10,935,585.

(51) Int. Cl.
| | |
|---|---|
| *G01R 31/40* | (2020.01) |
| *H03K 5/24* | (2006.01) |
| *H03F 3/45* | (2006.01) |
| *H03M 1/66* | (2006.01) |
| *H03K 5/00* | (2006.01) |
| *H03M 1/12* | (2006.01) |

(52) U.S. Cl.
CPC ............ *H03K 5/1252* (2013.01); *H03K 5/24* (2013.01); *H03F 2200/129* (2013.01); *H03F 2203/45116* (2013.01); *H03K 2005/00078* (2013.01); *H03M 1/12* (2013.01); *H03M 1/66* (2013.01)

(58) Field of Classification Search
CPC ...... H03F 3/45475; H03K 2005/00078; H03K 5/1252; H03K 5/24; H03M 1/12; H03M 1/66
USPC ......................................................... 327/552
See application file for complete search history.

(56) References Cited

U.S. PATENT DOCUMENTS

| | | | |
|---|---|---|---|
| 6,218,972 B1 | 4/2001 | Groshong | |
| 6,665,013 B1 | 12/2003 | Fossum et al. | |
| 7,476,233 B1 | 1/2009 | Wiener et al. | |
| 7,528,755 B2 | 5/2009 | Hammerschmidt | |
| 8,031,094 B2 | 10/2011 | Hotelling | |
| 8,089,289 B1 | 1/2012 | Kremin et al. | |
| 8,279,180 B2 | 10/2012 | Hotelling et al. | |
| 8,537,110 B2 | 9/2013 | Kruglick | |
| 8,547,114 B2 | 10/2013 | Kremin | |
| 8,587,535 B2 | 11/2013 | Oda et al. | |
| 8,625,726 B2 | 1/2014 | Kuan | |
| 8,657,681 B2 | 2/2014 | Kim | |
| 8,966,400 B2 | 2/2015 | Yeap | |
| 8,982,097 B1 | 3/2015 | Kuzo et al. | |
| 9,081,437 B2 | 7/2015 | Oda | |
| 9,201,547 B2 | 12/2015 | Elias | |
| 10,007,335 B2 | 6/2018 | Lee | |
| 2003/0052657 A1 | 3/2003 | Koernle et al. | |
| 2003/0214486 A1 | 11/2003 | Roberts | |
| 2005/0235758 A1 | 10/2005 | Kowal et al. | |
| 2006/0232461 A1* | 10/2006 | Felder .................. | H03M 1/462 341/161 |
| 2011/0063154 A1 | 3/2011 | Hotelling et al. | |
| 2011/0285368 A1* | 11/2011 | Carter .................... | G05B 11/01 323/282 |
| 2011/0298745 A1 | 12/2011 | Souchkov | |
| 2012/0278031 A1 | 11/2012 | Oda | |
| 2013/0278447 A1 | 10/2013 | Kremin | |
| 2013/0308656 A1 | 11/2013 | Malkin | |
| 2014/0327644 A1 | 11/2014 | Mohindra | |
| 2015/0091847 A1 | 4/2015 | Chang | |
| 2015/0091859 A1 | 4/2015 | Rosenberg | |
| 2015/0346889 A1 | 12/2015 | Chen | |
| 2016/0188049 A1 | 6/2016 | Yang et al. | |
| 2017/0245072 A1* | 8/2017 | Agarwal .................. | H04R 5/04 |
| 2018/0157354 A1 | 6/2018 | Blondin et al. | |
| 2018/0275824 A1 | 9/2018 | Li | |

FOREIGN PATENT DOCUMENTS

| | | |
|---|---|---|
| CN | 104536627 A | 4/2015 |
| CN | 107771273 A | 3/2018 |
| EP | 2284637 A1 | 2/2011 |

OTHER PUBLICATIONS

Brian Pisani, Digital Filter Types in Delta-Sigma ADCs, Application Report SBAA230, May 2017, pp. 1-8, Texas Instruments Incorporated, Dallas, Texas.

European Patent Office; Extended European Search Report; Application No. 19853507.2; dated Jun. 13, 2023; 7 pgs.

\* cited by examiner communication system 10 computing device 12 computing device 14 computing device 18

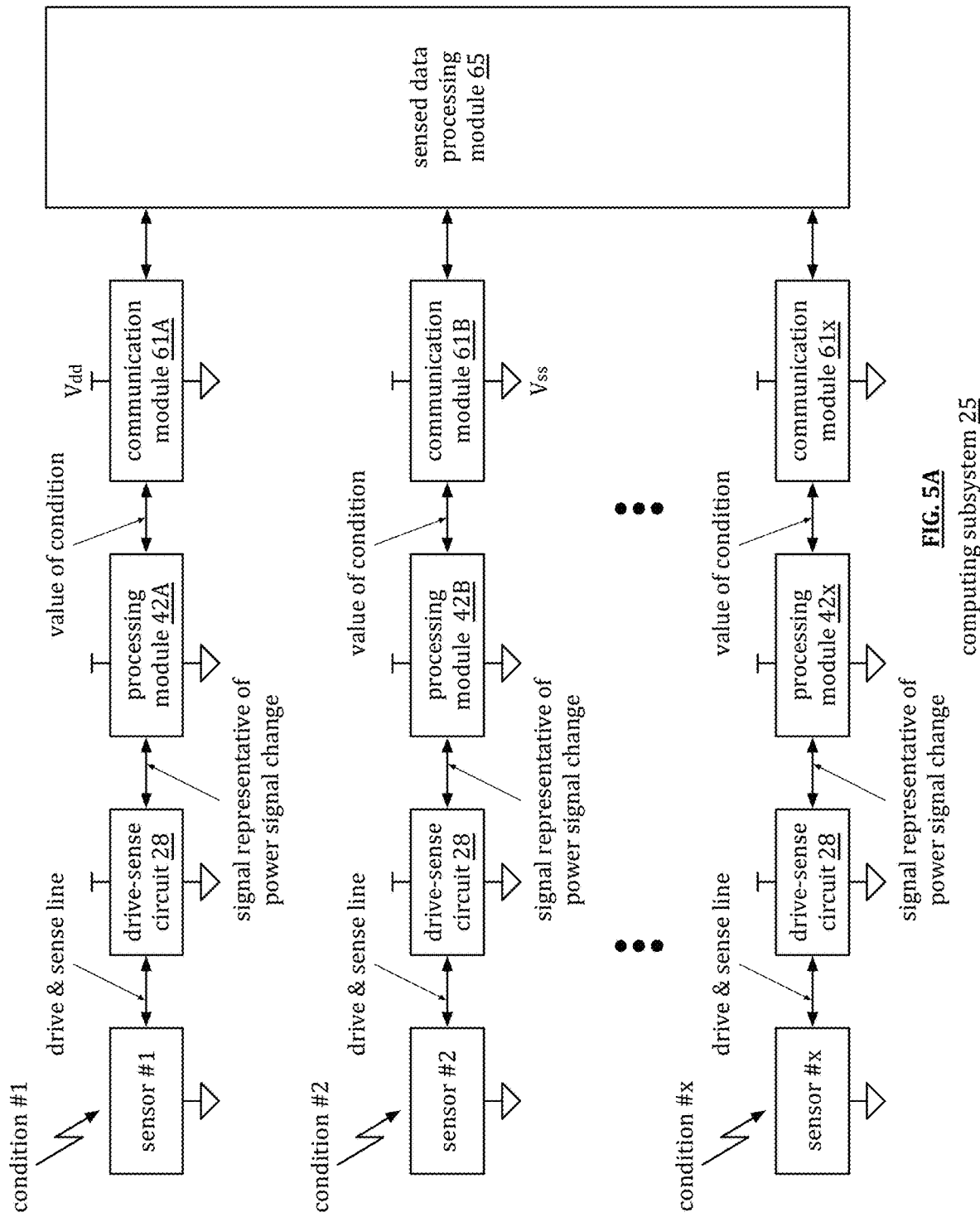
FIG. 5A computing subsystem 25

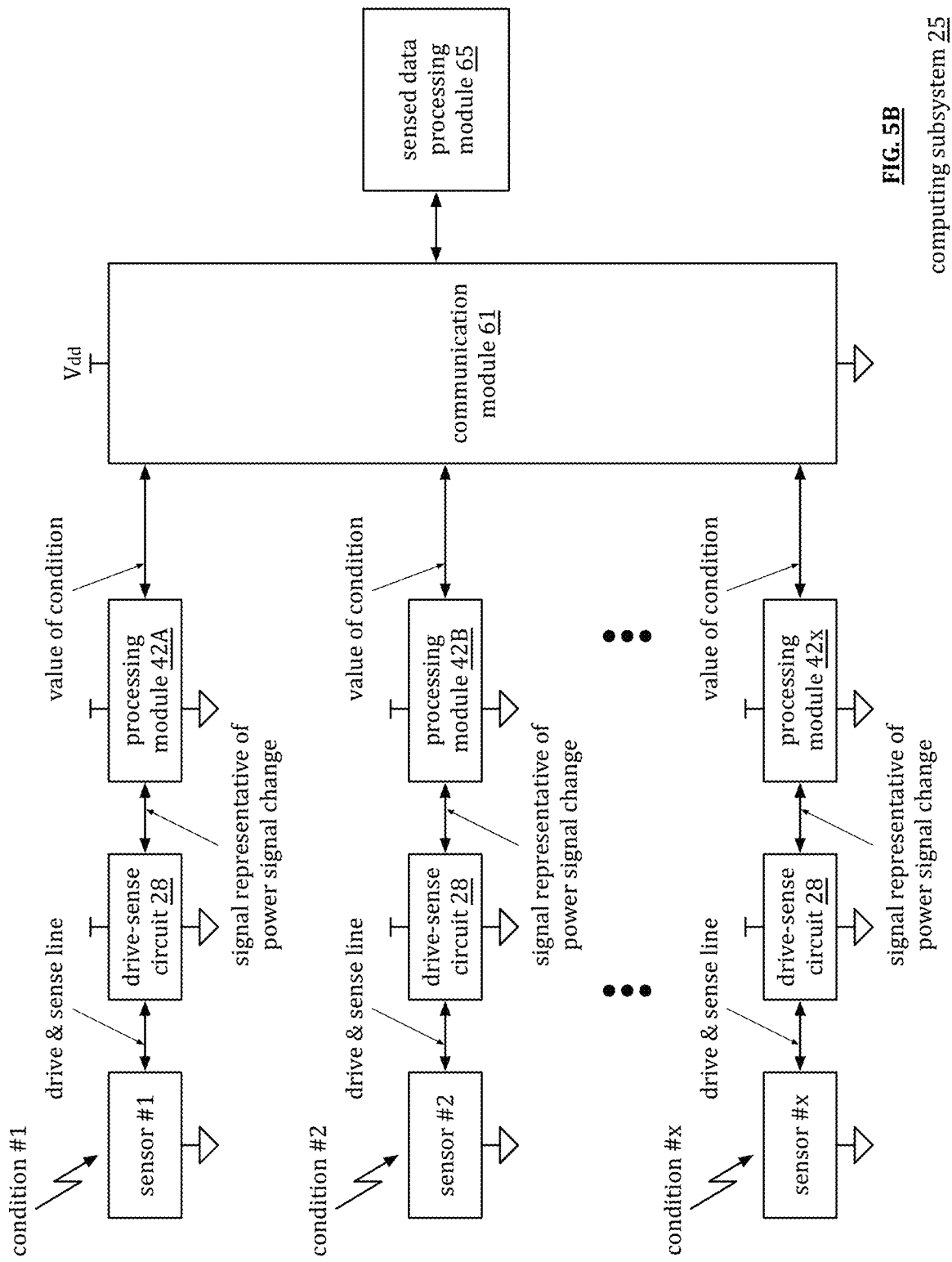

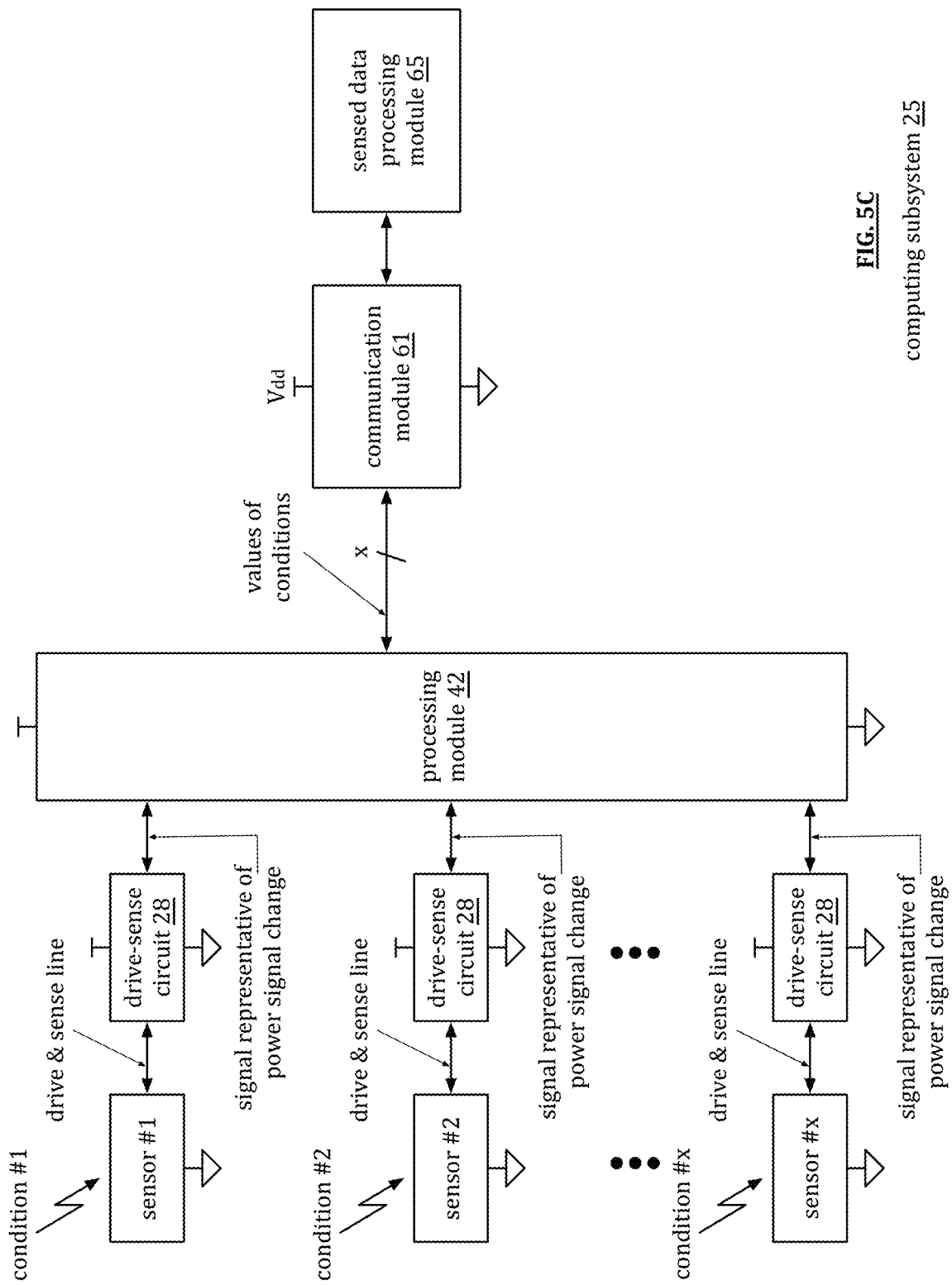

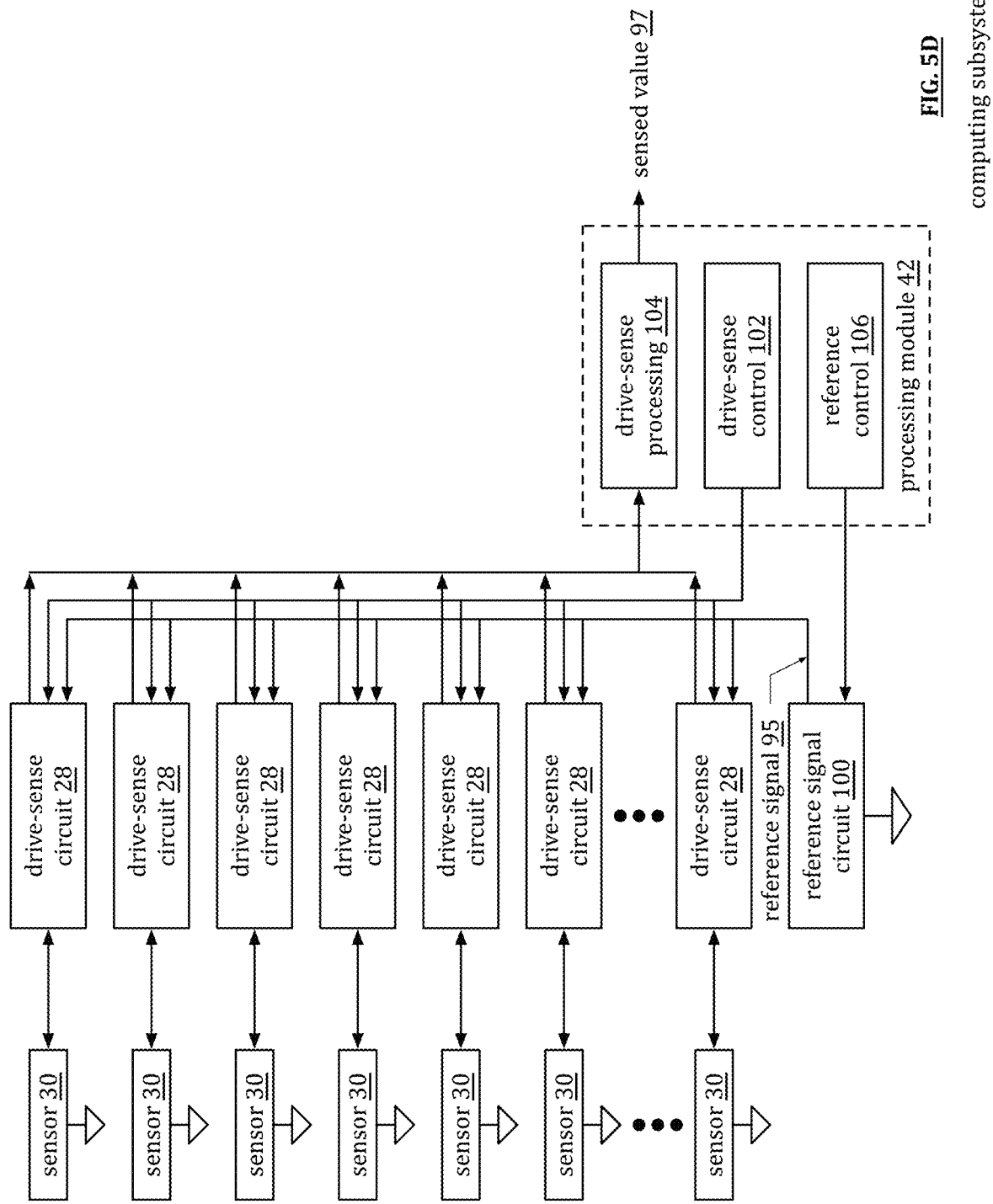

computing subsystem 25 sensor graph power signal graph power signal graph power signal graph power signal graph power signal graph data sensing circuit 200 data sensing circuit 200 data circuit 230

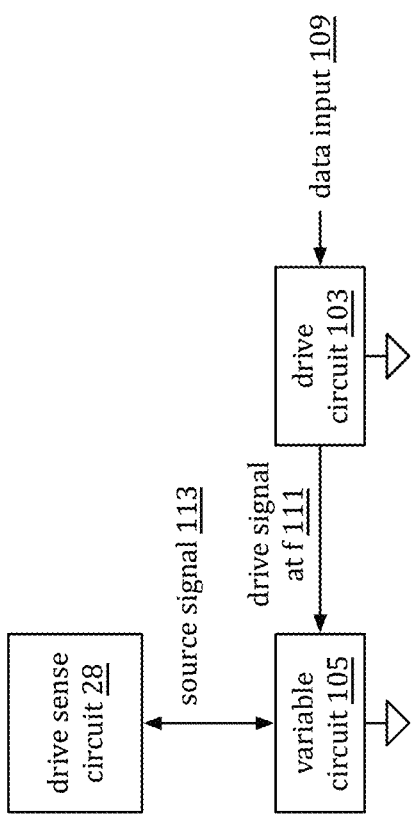
FIG. 22
data communication circuit 101
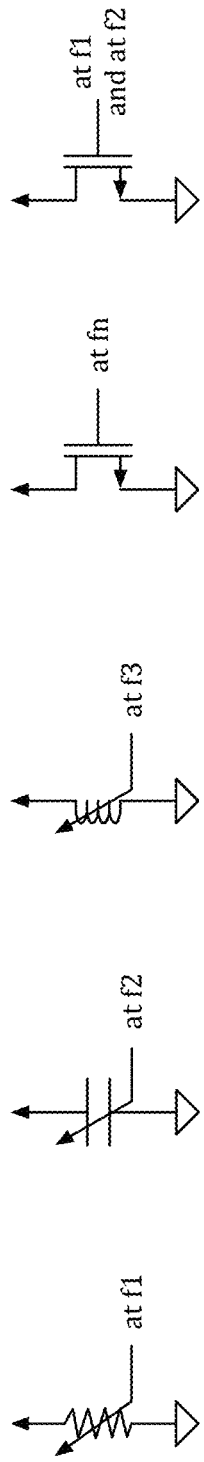
FIG. 23
variable circuit 105
FIG. 24
variable circuit 105
FIG. 25
variable circuit 105
FIG. 26A
variable circuit 105
FIG. 26B
variable circuit 105 data circuit 250 no touch programmable sensing system 151 programmable sensing system 151-1 programmable reference signal unit 153 coupling network 145 and/or 149 programmable reference signal generator 149

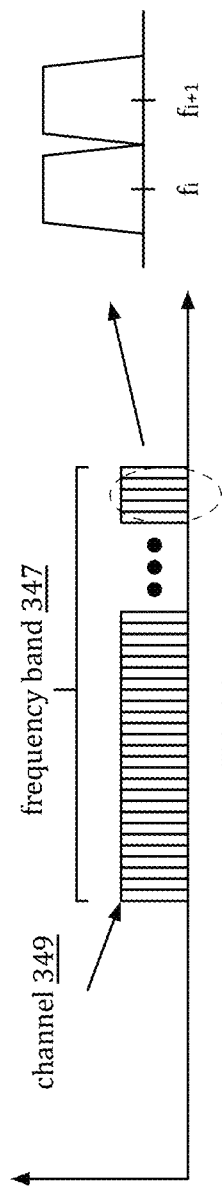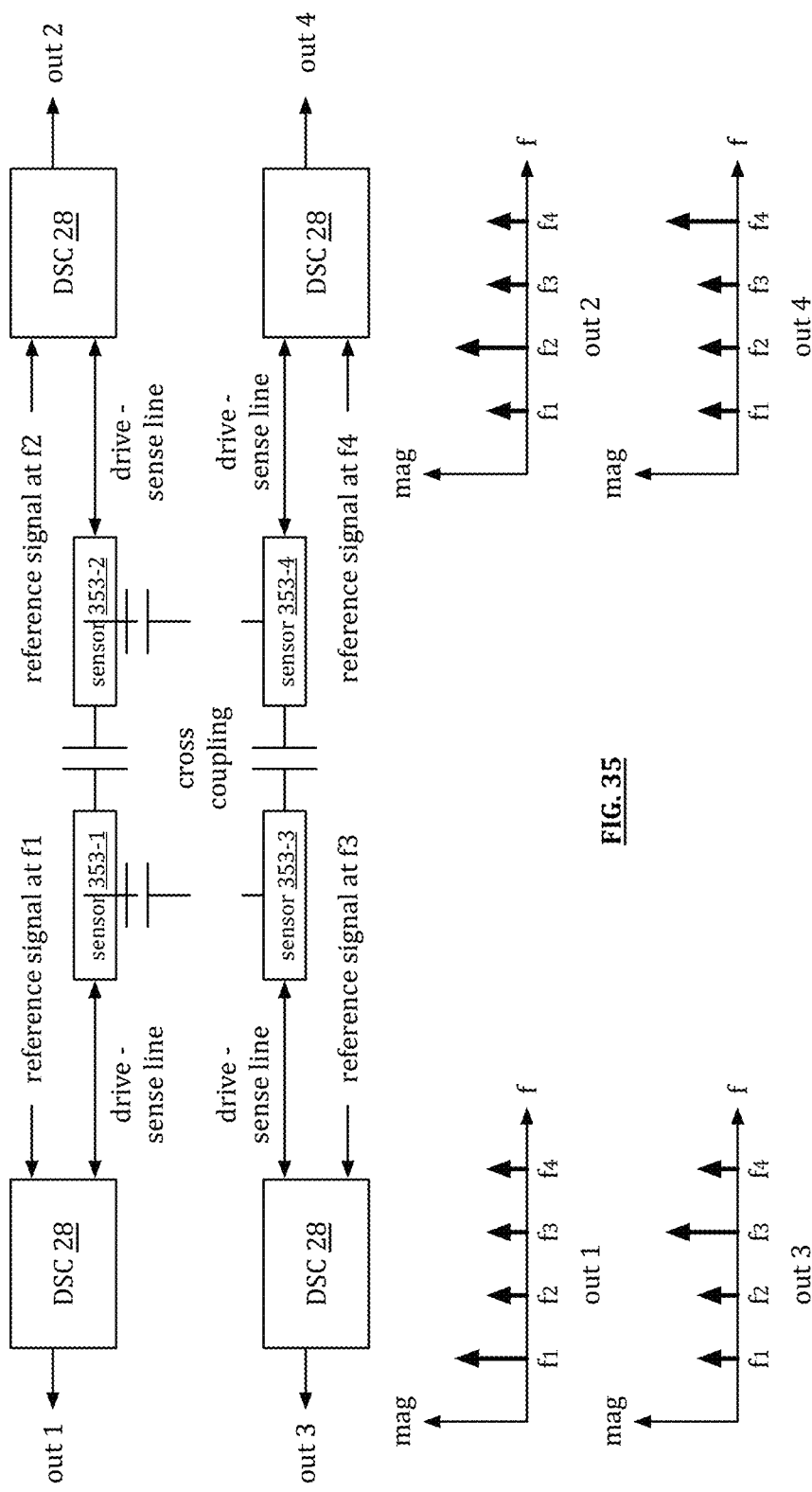
FIG. 34
FIG. 35 drive-sense circuit 28-c drive-sense circuit 28-d

US 11,906,564 B2

ANALOG AND DIGITAL FREQUENCY DOMAIN DATA SENSING CIRCUIT

CROSS-REFERENCE TO RELATED APPLICATIONS

The present U.S. Utility patent application claims priority pursuant to 35 U.S.C. § 120 as a continuation of U.S. Utility application Ser. No. 17/249,260, entitled "DRIVE SENSE CIRCUIT WITH TRANSIENT SUPPRESSION", filed Feb. 25, 2021, which is a continuation of U.S. Utility application Ser. No. 16/195,349, entitled "DRIVE SENSE CIRCUIT WITH TRANSIENT SUPPRESSION," filed Nov. 19, 2018, issued as U.S. Pat. No. 10,935,585 on Mar. 2, 2021, both of which are hereby incorporated herein by reference in their entirety and made part of the present U.S. Utility patent application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to data communication systems and more particularly to sensed data collection and/or communication.

Description of Related Art

Sensors are used in a wide variety of applications ranging from in-home automation, to industrial systems, to health care, to transportation, and so on. For example, sensors are placed in bodies, automobiles, airplanes, boats, ships, trucks, motorcycles, cell phones, televisions, touch-screens, industrial plants, appliances, motors, checkout counters, etc. for the variety of applications.

In general, a sensor converts a physical quantity into an electrical or optical signal. For example, a sensor converts a physical phenomenon, such as a biological condition, a chemical condition, an electric condition, an electromagnetic condition, a temperature, a magnetic condition, mechanical motion (position, velocity, acceleration, force, pressure), an optical condition, and/or a radioactivity condition, into an electrical signal.

A sensor includes a transducer, which functions to convert one form of energy (e.g., force) into another form of energy (e.g., electrical signal). There are a variety of transducers to support the various applications of sensors. For example, a transducer is capacitor, a piezoelectric transducer, a piezoresistive transducer, a thermal transducer, a thermal-couple, a photoconductive transducer such as a photoresistor, a photodiode, and/or phototransistor.

A sensor circuit is coupled to a sensor to provide the sensor with power and to receive the signal representing the physical phenomenon from the sensor. The sensor circuit includes at least three electrical connections to the sensor: one for a power supply; another for a common voltage reference (e.g., ground); and a third for receiving the signal representing the physical phenomenon. The signal representing the physical phenomenon will vary from the power supply voltage to ground as the physical phenomenon changes from one extreme to another (for the range of sensing the physical phenomenon).

The sensor circuits provide the received sensor signals to one or more computing devices for processing. A computing device is known to communicate data, process data, and/or store data. The computing device may be a cellular phone, a laptop, a tablet, a personal computer (PC), a work station, a video game device, a server, and/or a data center that support millions of web searches, stock trades, or on-line purchases every hour.

The computing device processes the sensor signals for a variety of applications. For example, the computing device processes sensor signals to determine temperatures of a variety of items in a refrigerated truck during transit. As another example, the computing device processes the sensor signals to determine a touch on a touch screen. As yet another example, the computing device processes the sensor signals to determine various data points in a production line of a product.

BRIEF DESCRIPTION OF THE SEVERAL VIEWS OF THE DRAWING(S)

FIG. 5A is a schematic plot diagram of a computing subsystem in accordance with the present invention;

FIG. 5B is a schematic block diagram of another embodiment of a computing subsystem in accordance with the present invention;

FIG. 5C is a schematic block diagram of another embodiment of a computing subsystem in accordance with the present invention;

FIG. 5D is a schematic block diagram of another embodiment of a computing subsystem in accordance with the present invention;

FIG. 22 is a schematic block diagram of an embodiment of a data communication circuit in accordance with the present invention;

Figure 27:
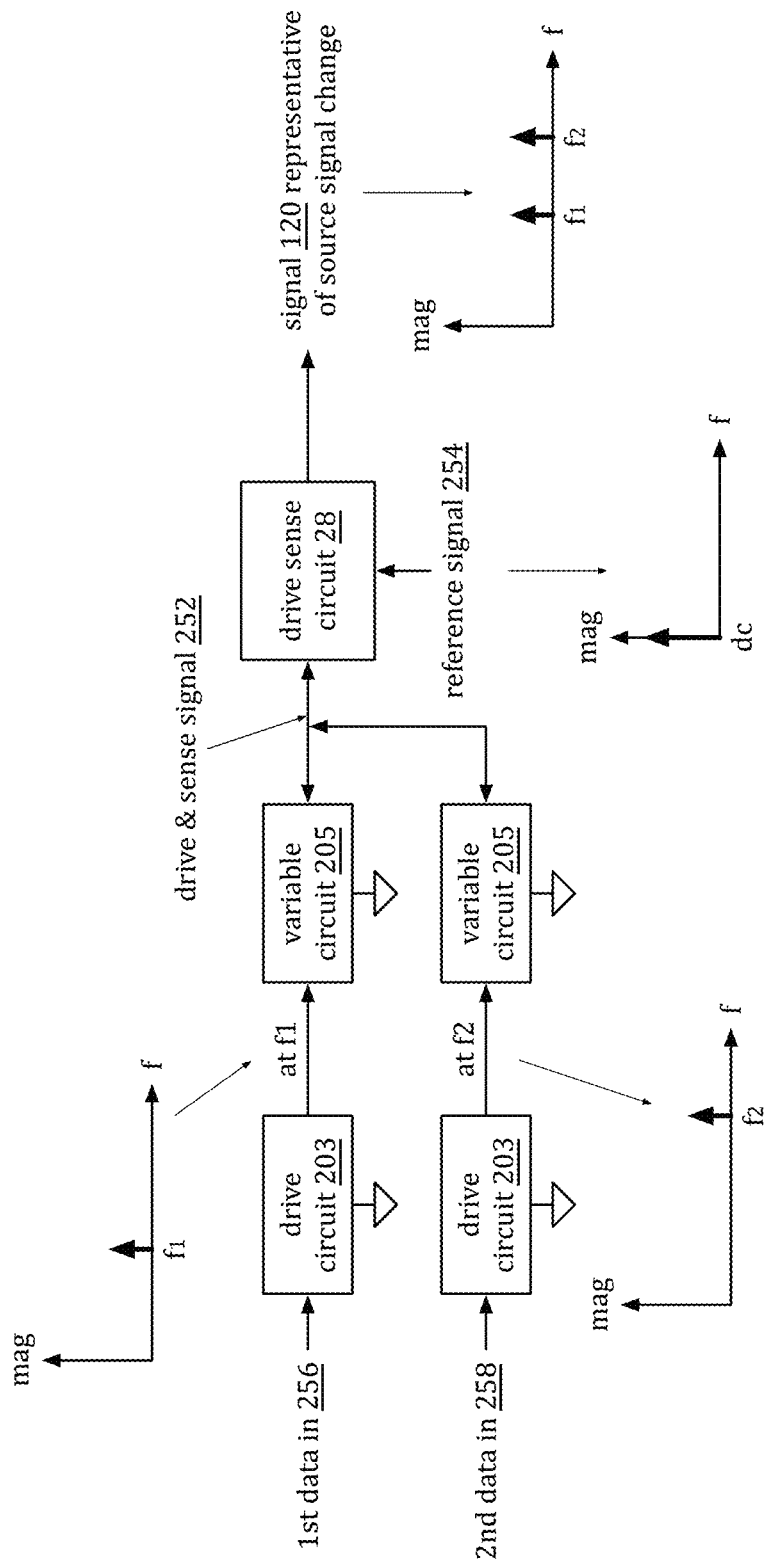
Figure 28:
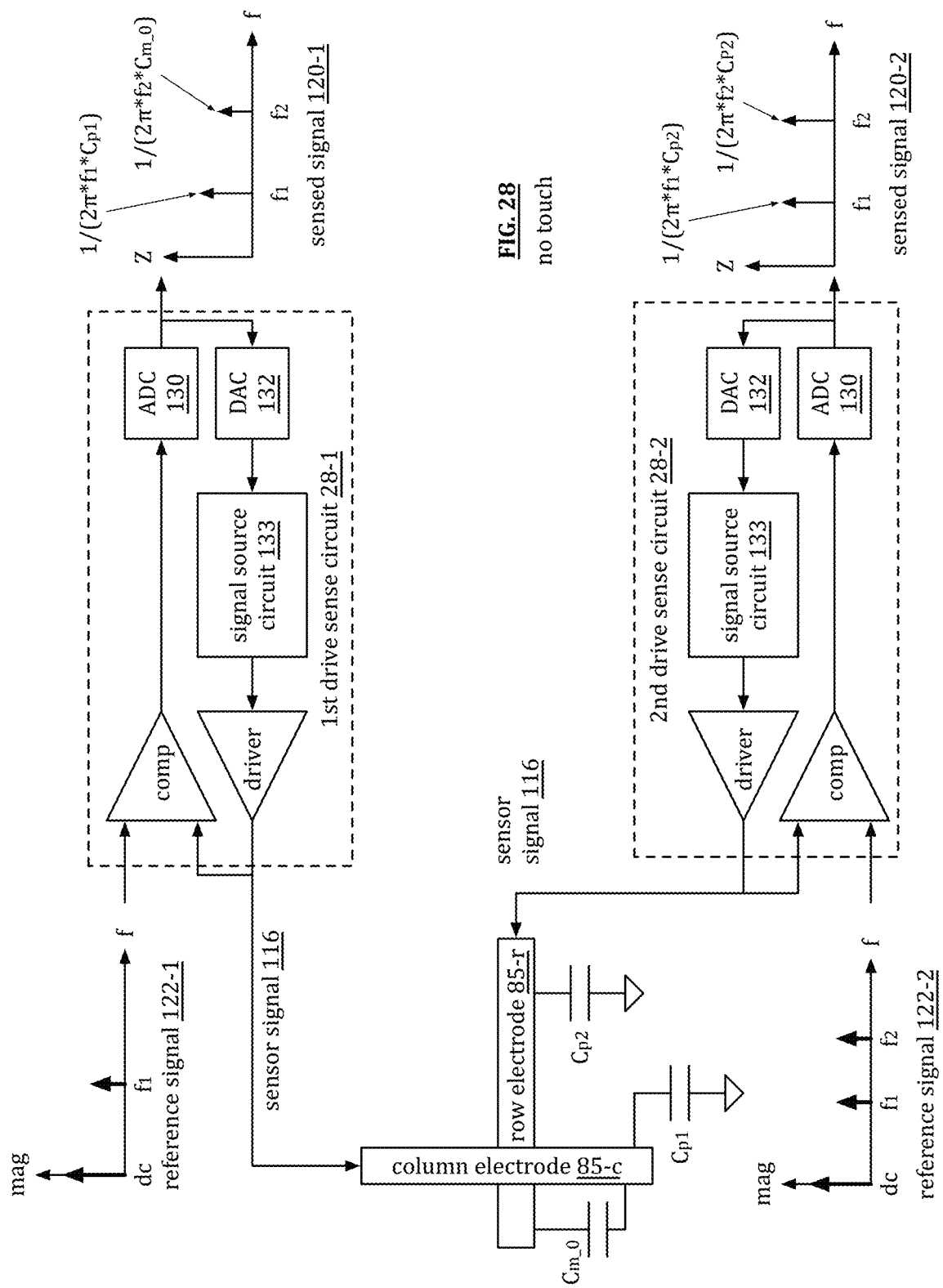
Figure 29:
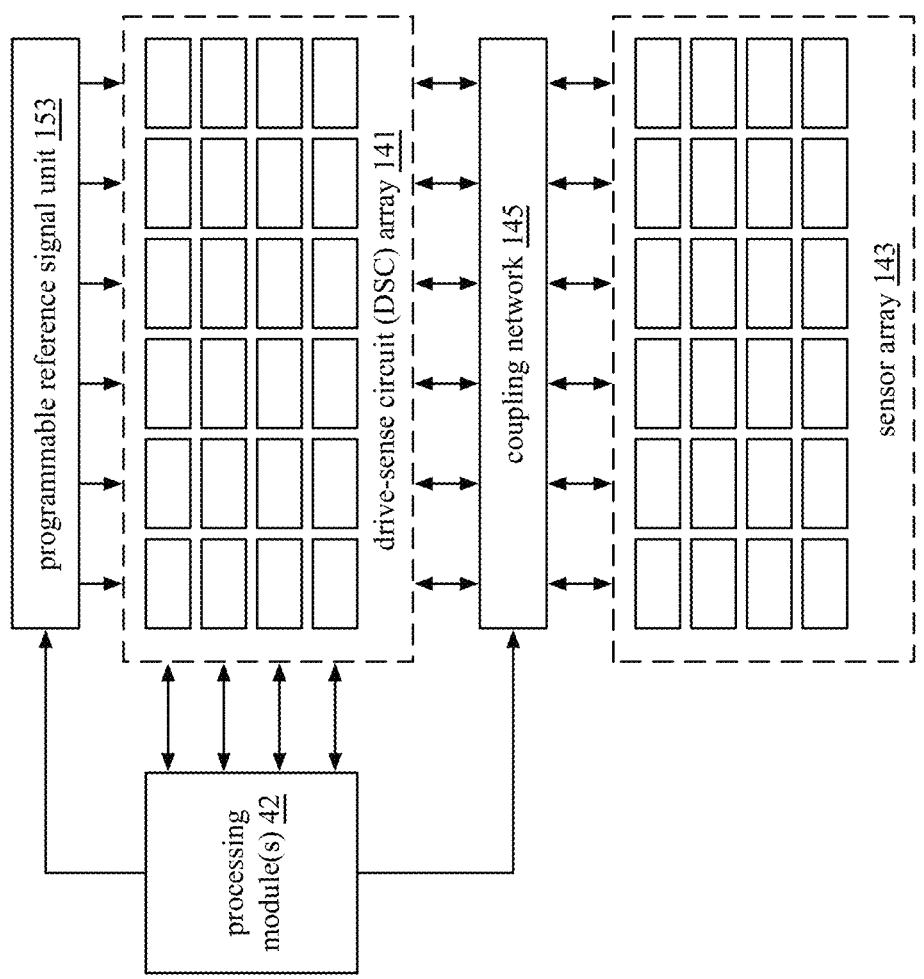
Figure 30:
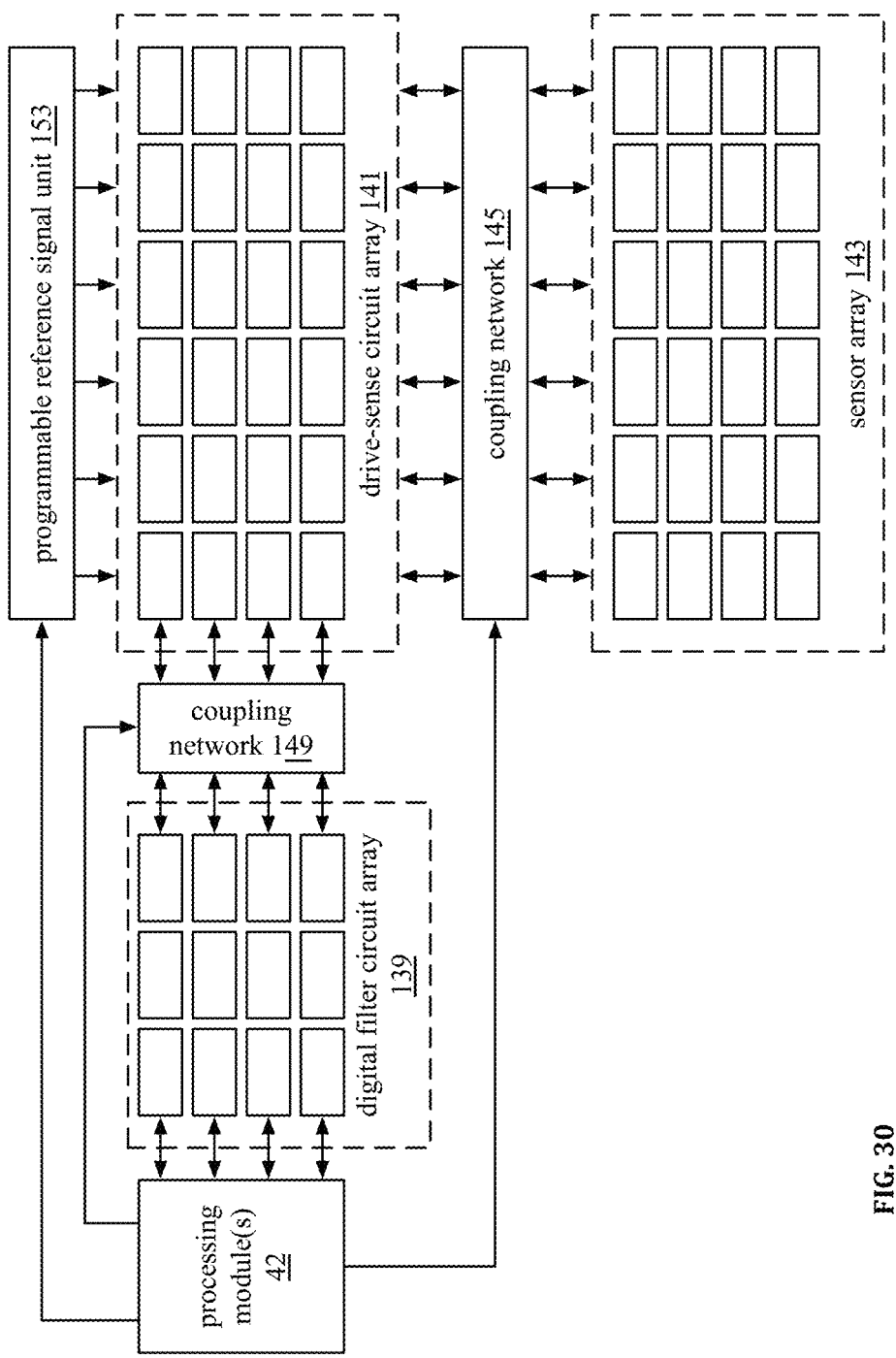
Figure 31B:
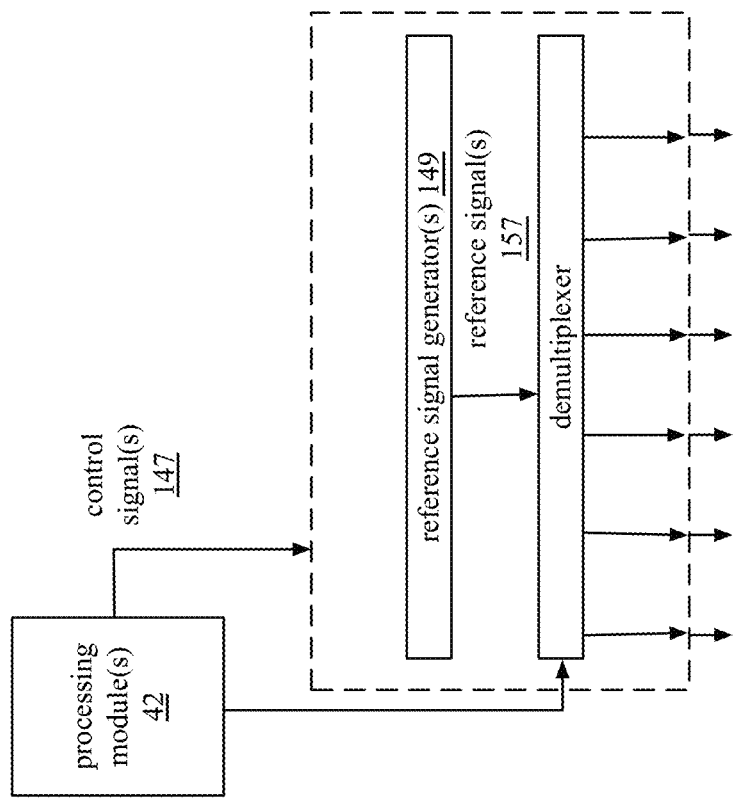
Figure 31A:
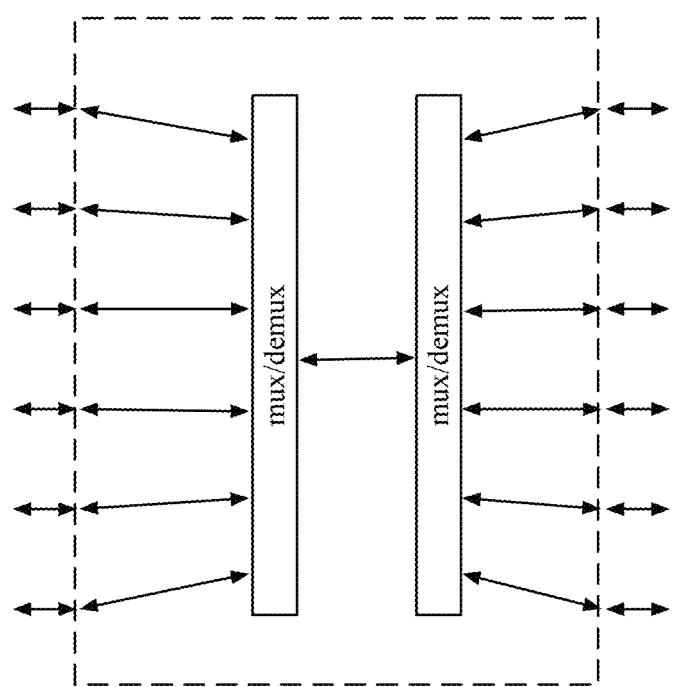
Figure 32A:
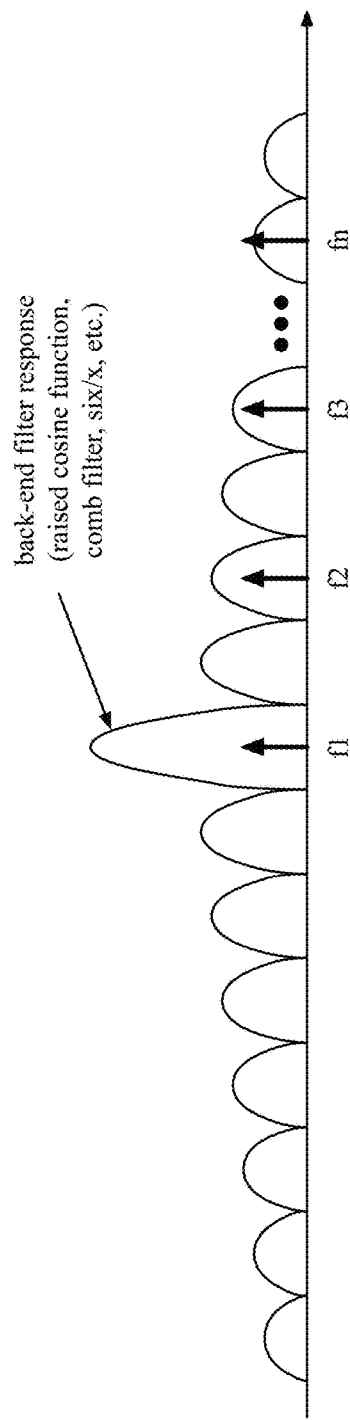
Figure 32B:
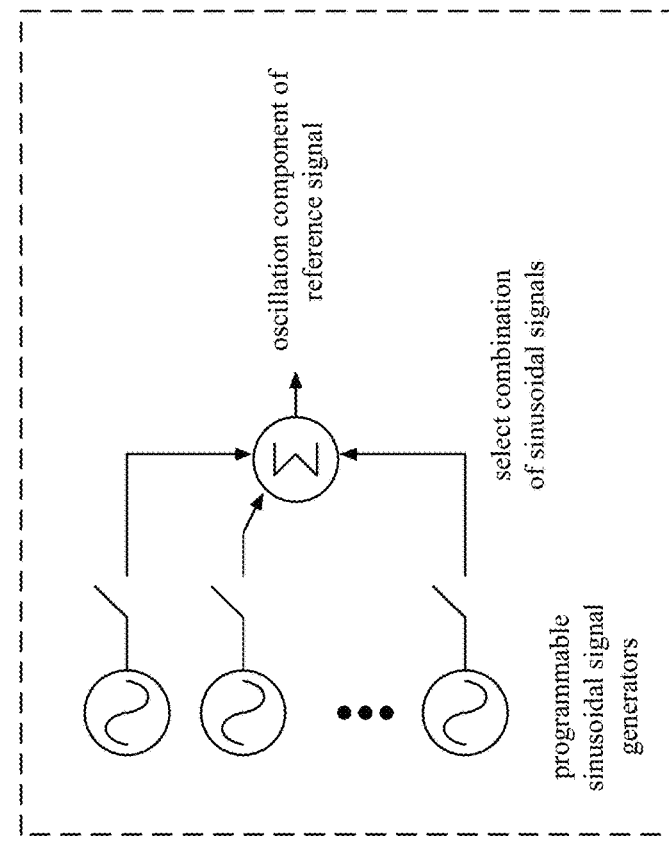
Figure 33:
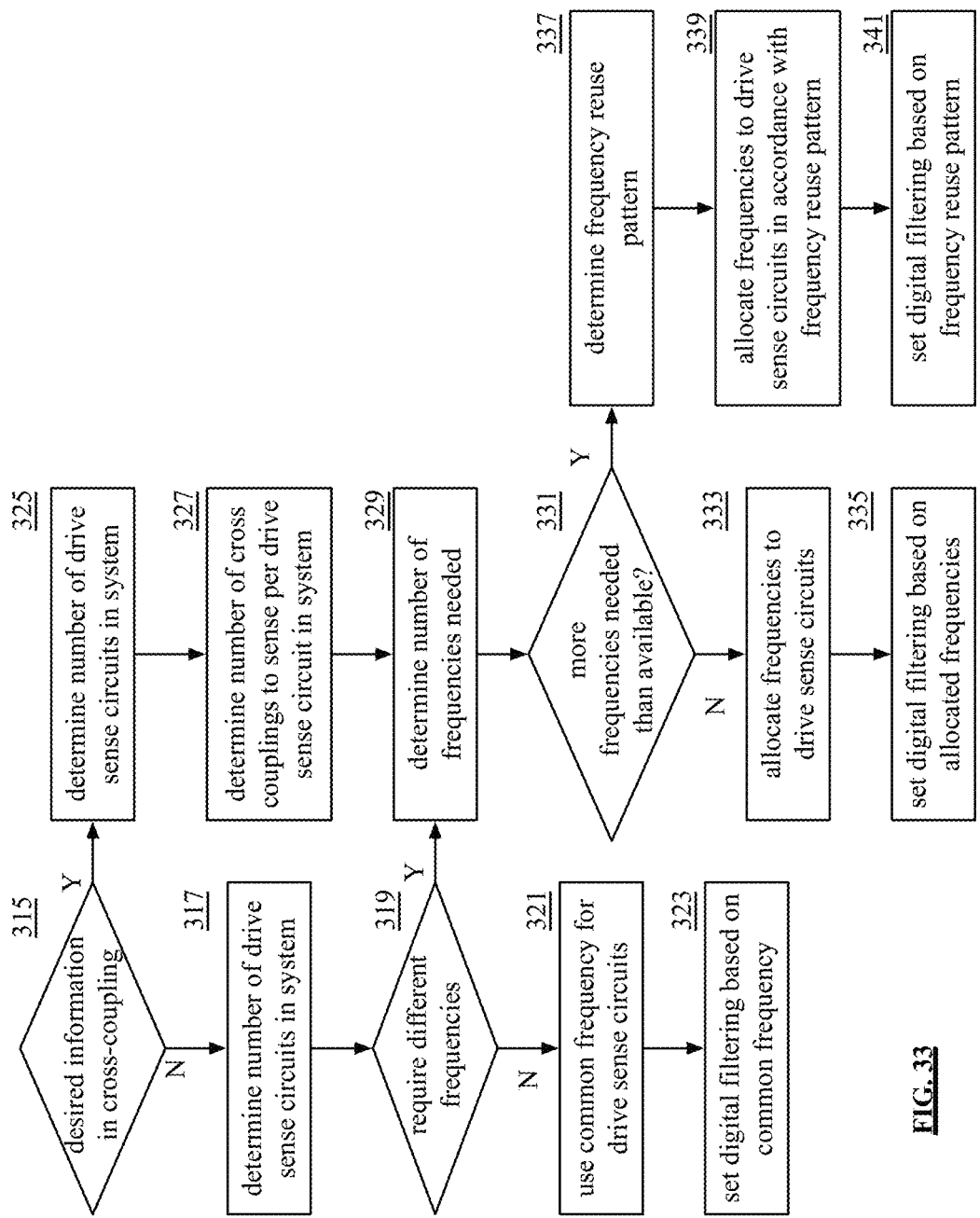
Figure 36:
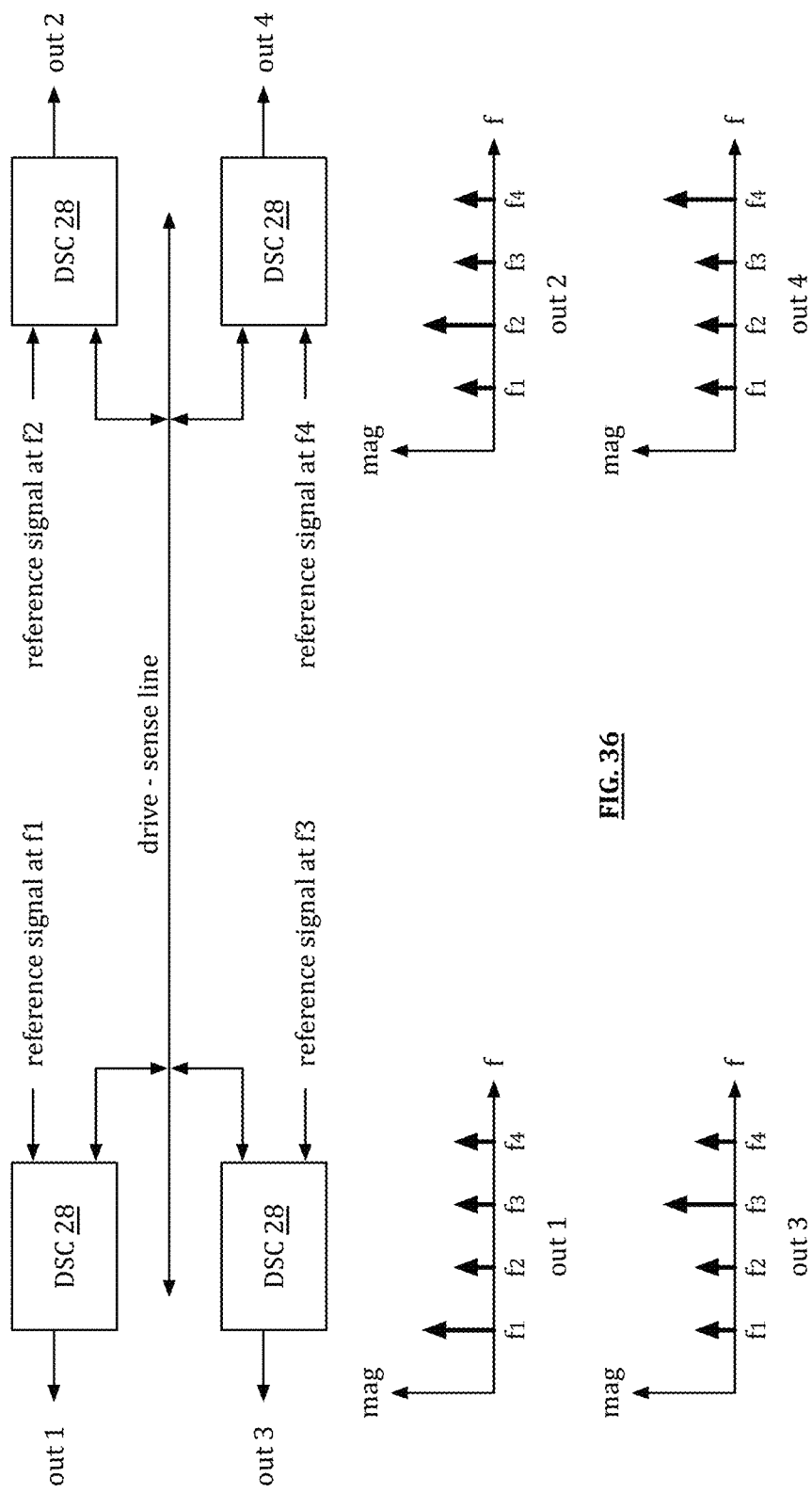
Figure 37:
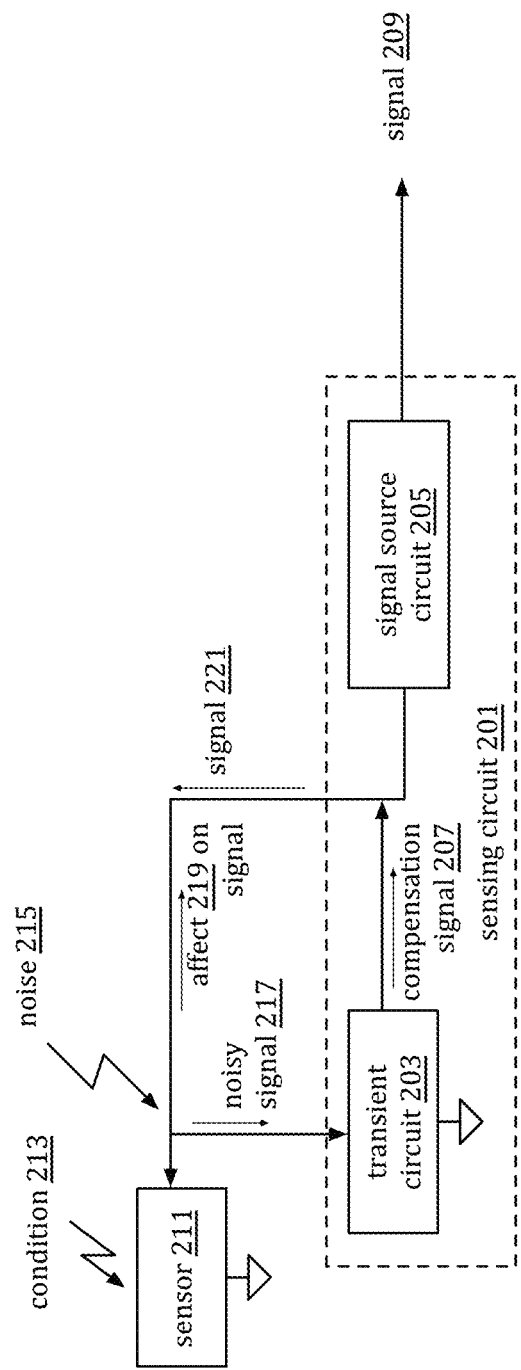
Figure 38:
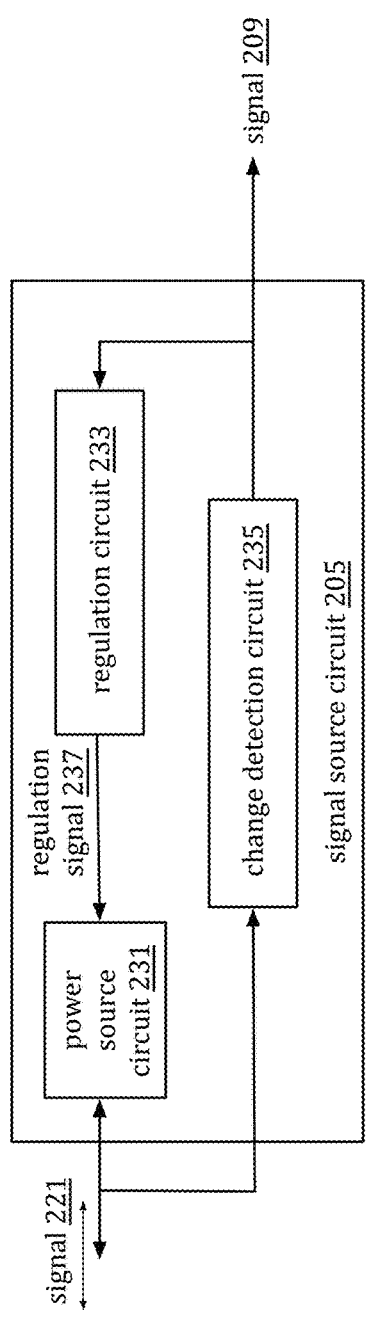
Figure 39:
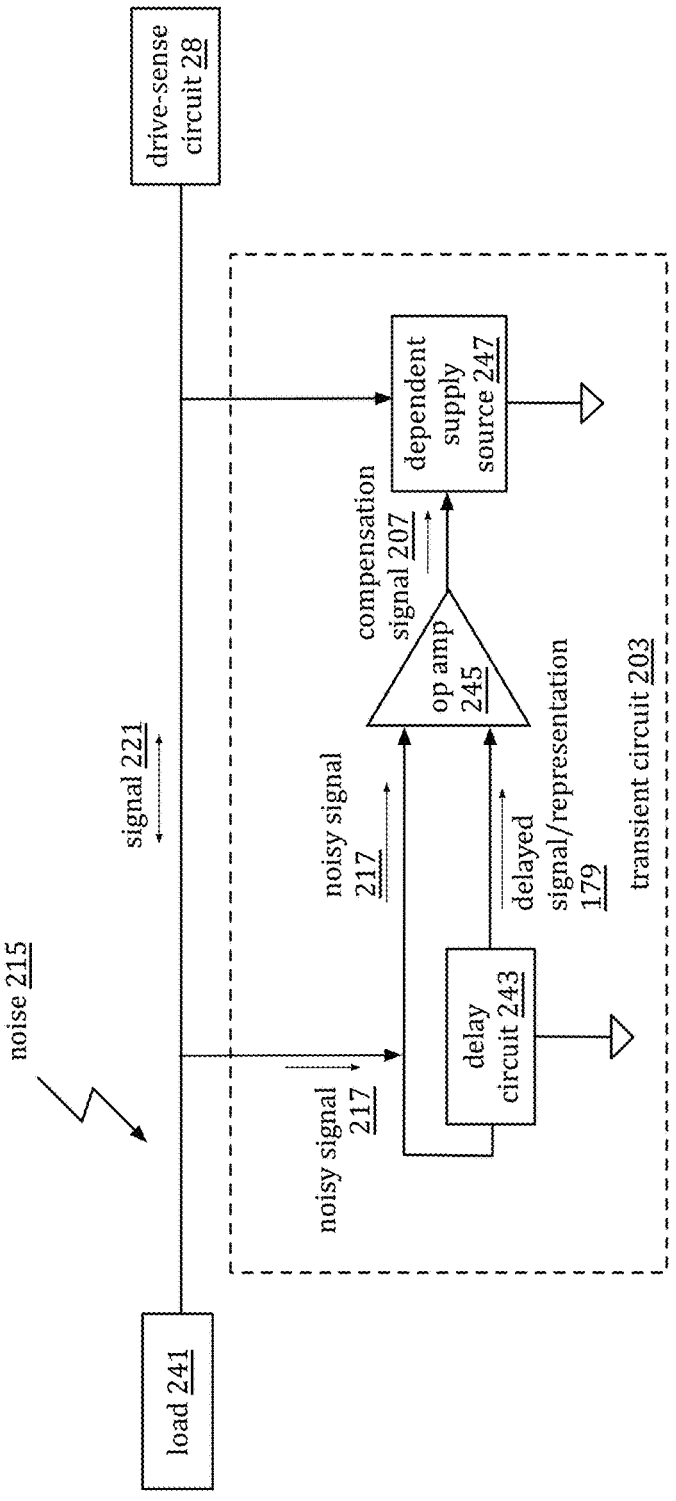
Figure 40:
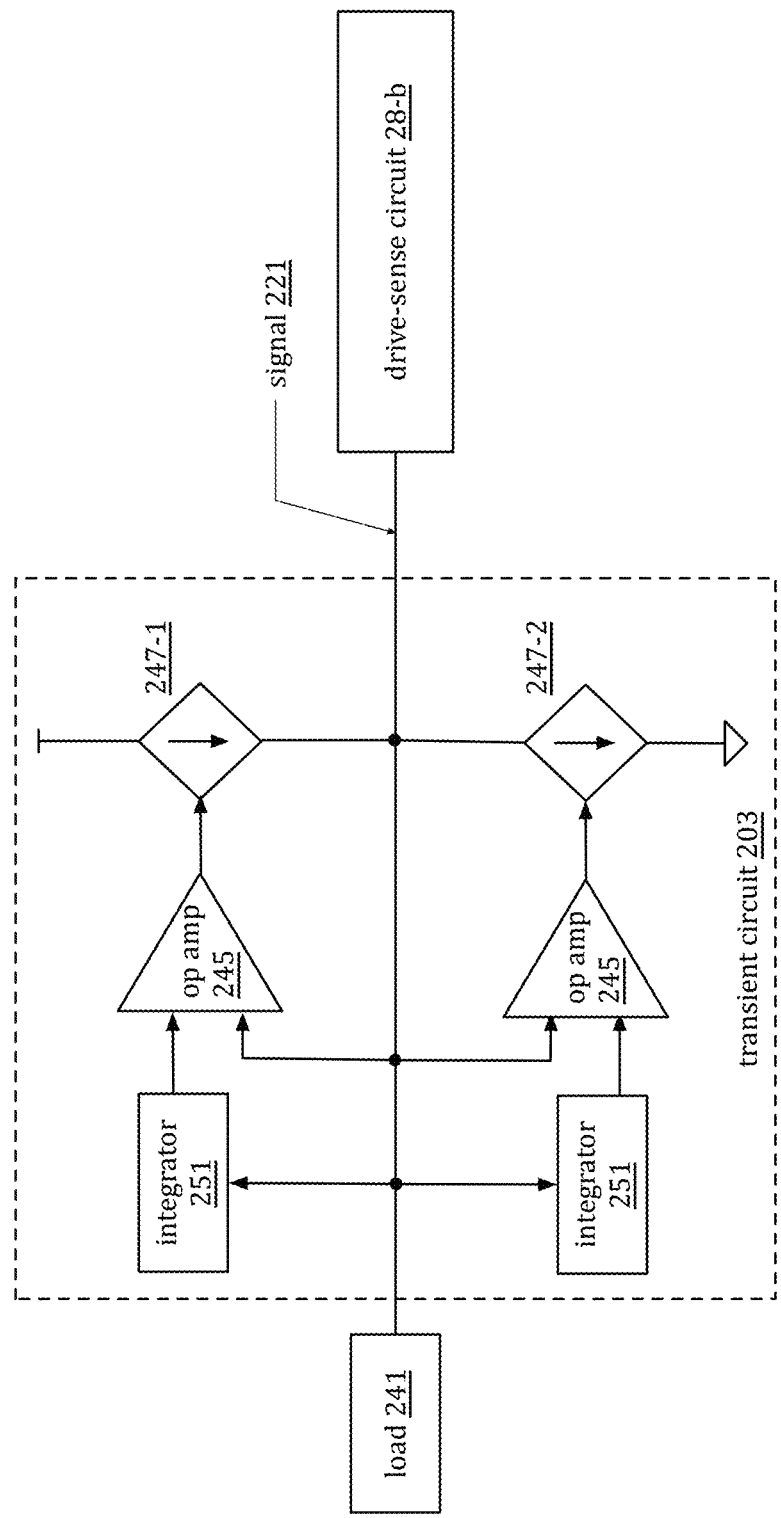
Figure 41:
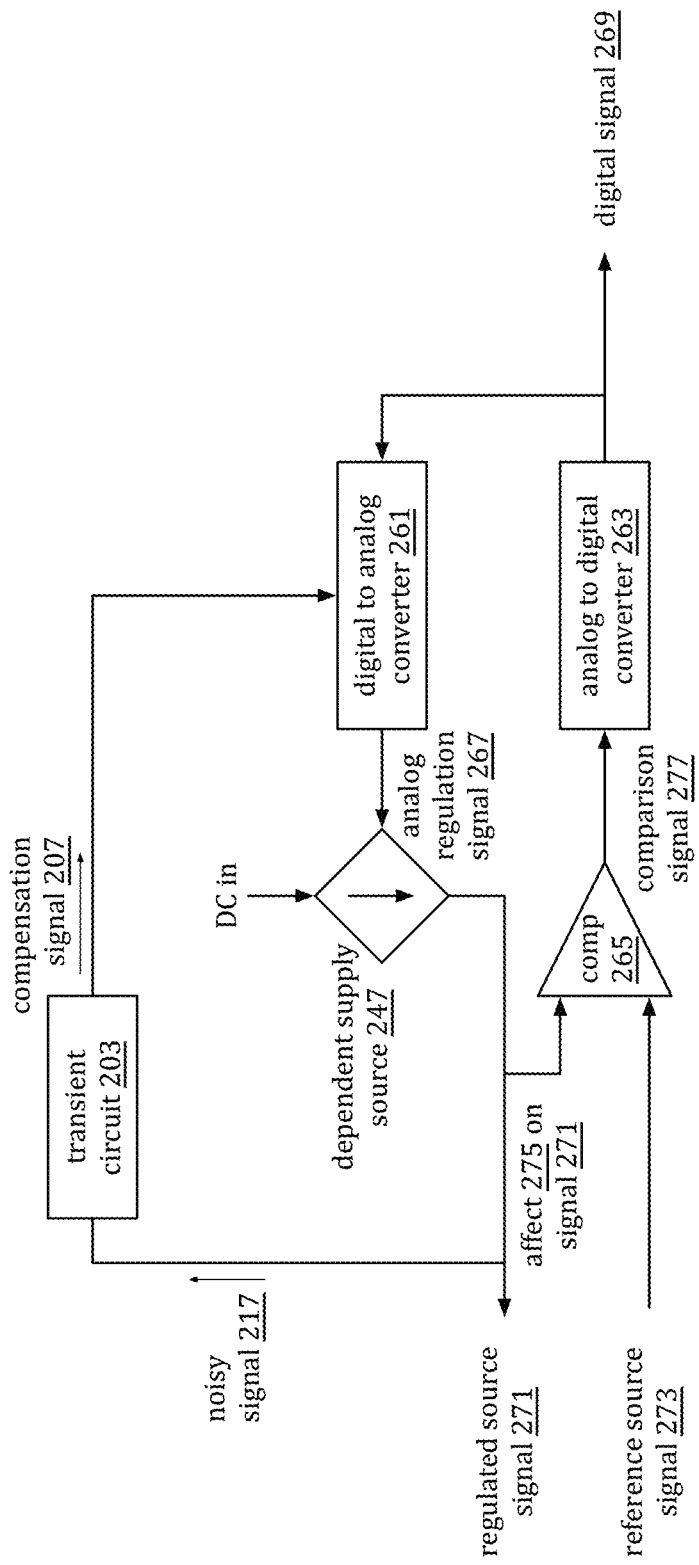
Figure 42:
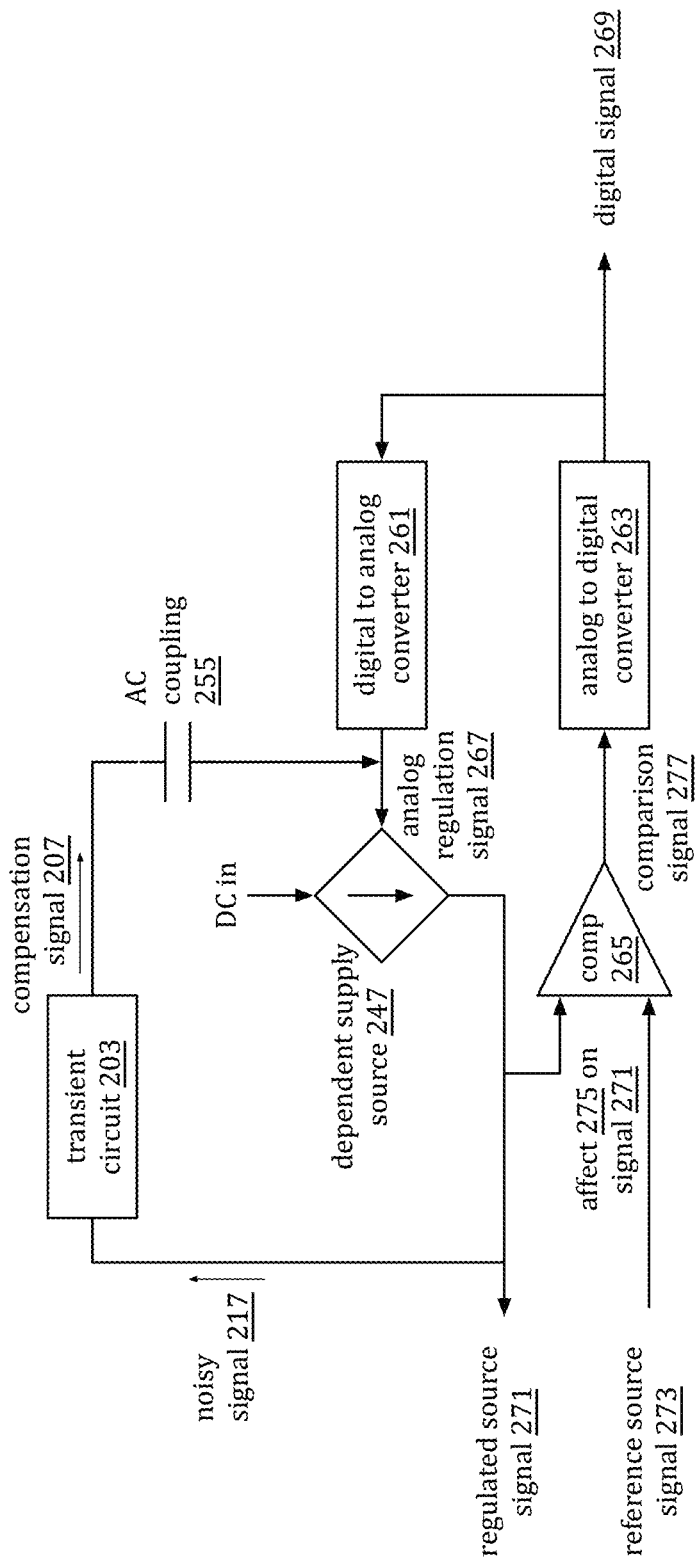
Figure 43:
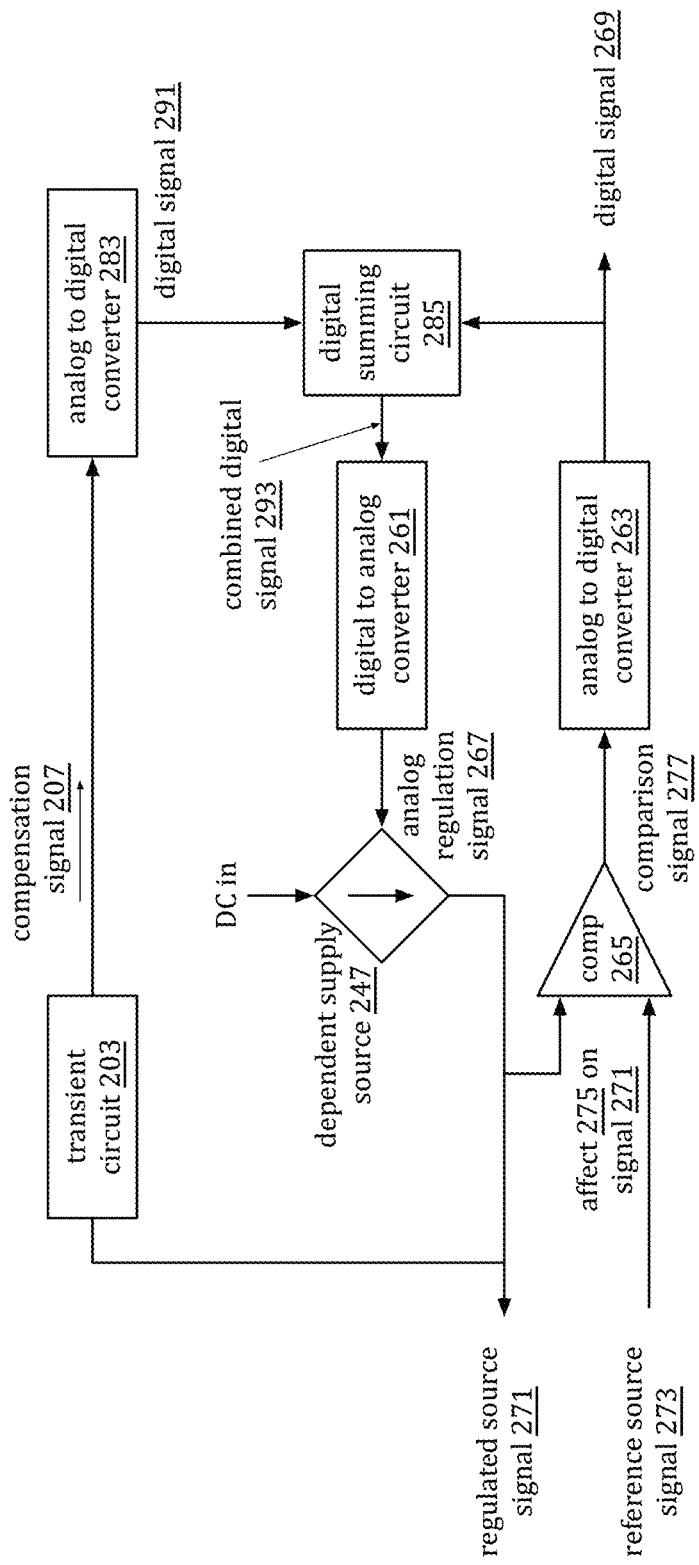
Figure 44:
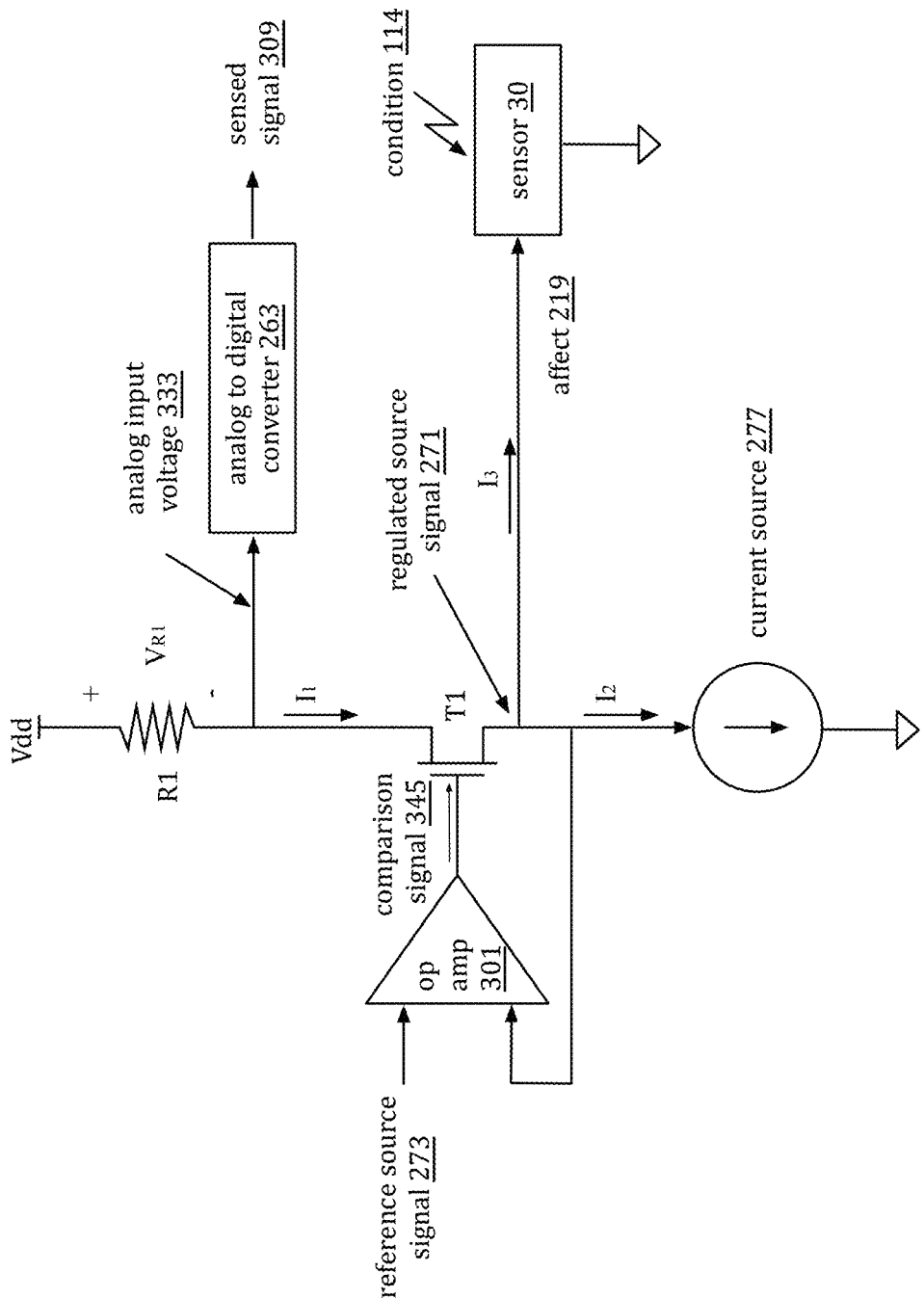
Figure 45:
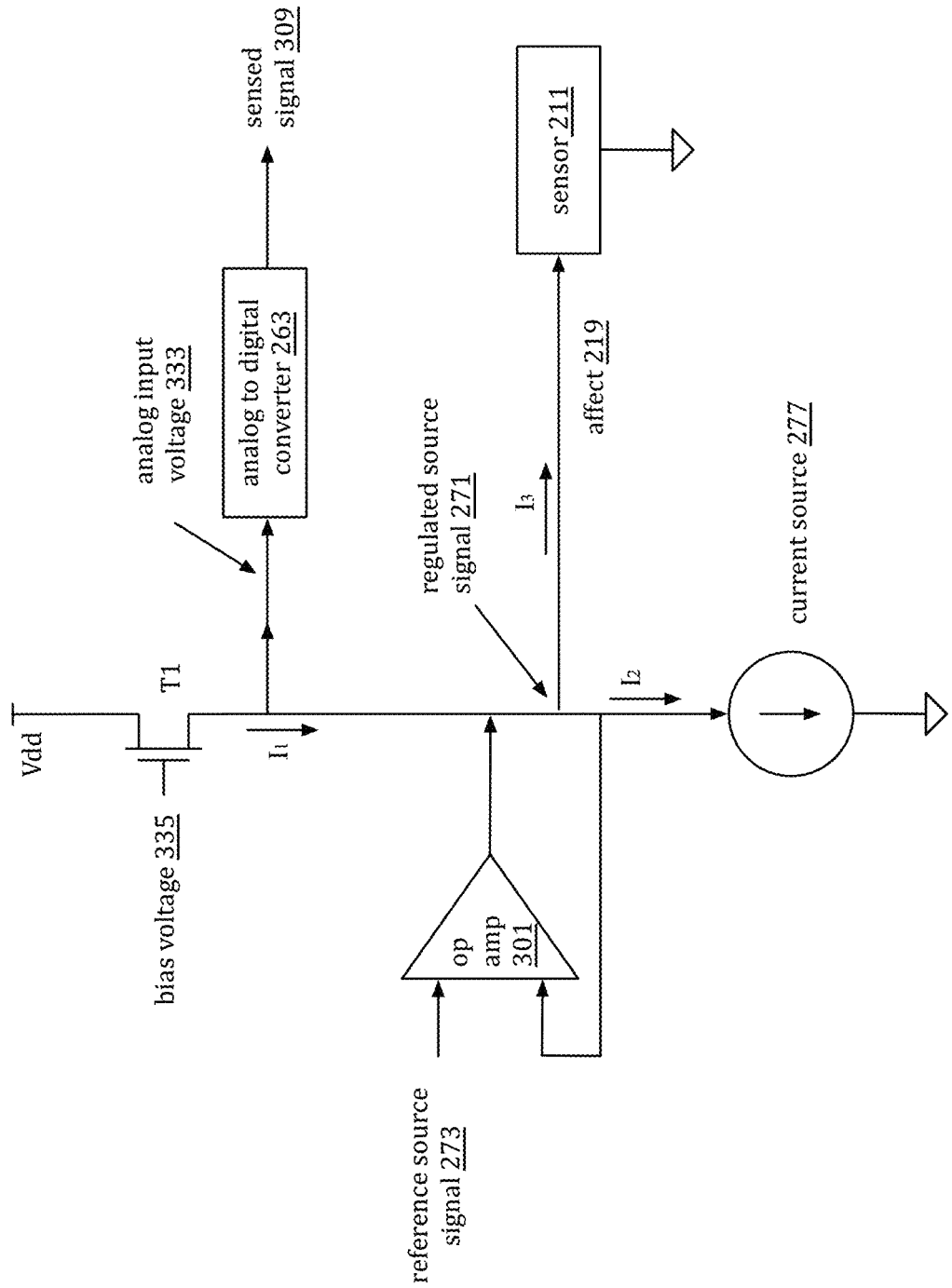

FIGS. 23-26A, and 26B are schematic block diagrams of examples of variable circuits of the data communication circuit in accordance with the present invention;

FIG. 27 is a schematic block diagram of another embodiment of a data circuit in accordance with the present invention;

FIG. 28 is a schematic block diagram of another embodiment of a data sensing circuit of a touch screen display in accordance with the present invention;

FIG. 29 is a schematic block diagram of an embodiment of a configurable sensing system in accordance with the present invention;

FIG. 30 is a schematic block diagram of another embodiment of a configurable sensing system in accordance with the present invention;

FIG. 31A is a schematic block diagram of an embodiment of a coupling network of a configurable sensing system in accordance with the present invention;

FIG. 31B is a schematic block diagram of an embodiment of a programmable reference signal unit of a configurable sensing system in accordance with the present invention;

FIG. 32A is a diagram of an example of creating a reference signal in accordance with the present invention;

FIG. 32B is a schematic diagram of an example select signal combination for a programmable sensing system in accordance with the present invention;

FIG. 33 is a logic diagram of a method of an example of determining a frequency mapping for a sensing system in accordance with the present invention;

FIG. 34 is a schematic block diagram of an example of a frequency band including a plurality of channels available for a sensing system in accordance with the present invention;

FIG. 35 is a schematic block diagram of an example of a sensing system using frequencies based on a frequency mapping in accordance with the present invention;

FIG. 36 is a schematic block diagram of another example of a sensing system using frequencies based on a frequency mapping in accordance with the present invention;

FIG. 37 is a schematic block diagram of an embodiment of a sensing circuit in accordance with the present invention;

FIG. 38 is a schematic block diagram of an embodiment of a signal source circuit of the sensing circuit in accordance with the present invention;

FIG. 39 is a schematic block diagram of an embodiment of a transient circuit of the sensing circuit in accordance with the present invention;

FIG. 40 is a schematic block diagram of another embodiment of a transient circuit of the sensing circuit in accordance with the present invention;

FIG. 41 is a schematic block diagram of another embodiment of a sensing circuit in accordance with the present invention;

FIG. 42 is a schematic block diagram of another embodiment of a sensing circuit in accordance with the present invention;

FIG. 43 is a schematic block diagram of another embodiment of a sensing circuit in accordance with the present invention;

FIG. 44 is a schematic block diagram of another embodiment of a drive sense circuit in accordance with the present invention; and FIG. 45 is a schematic block diagram of another embodiment of a drive sense circuit in accordance with the present invention.

DETAILED DESCRIPTION OF THE INVENTION

Figure 1:
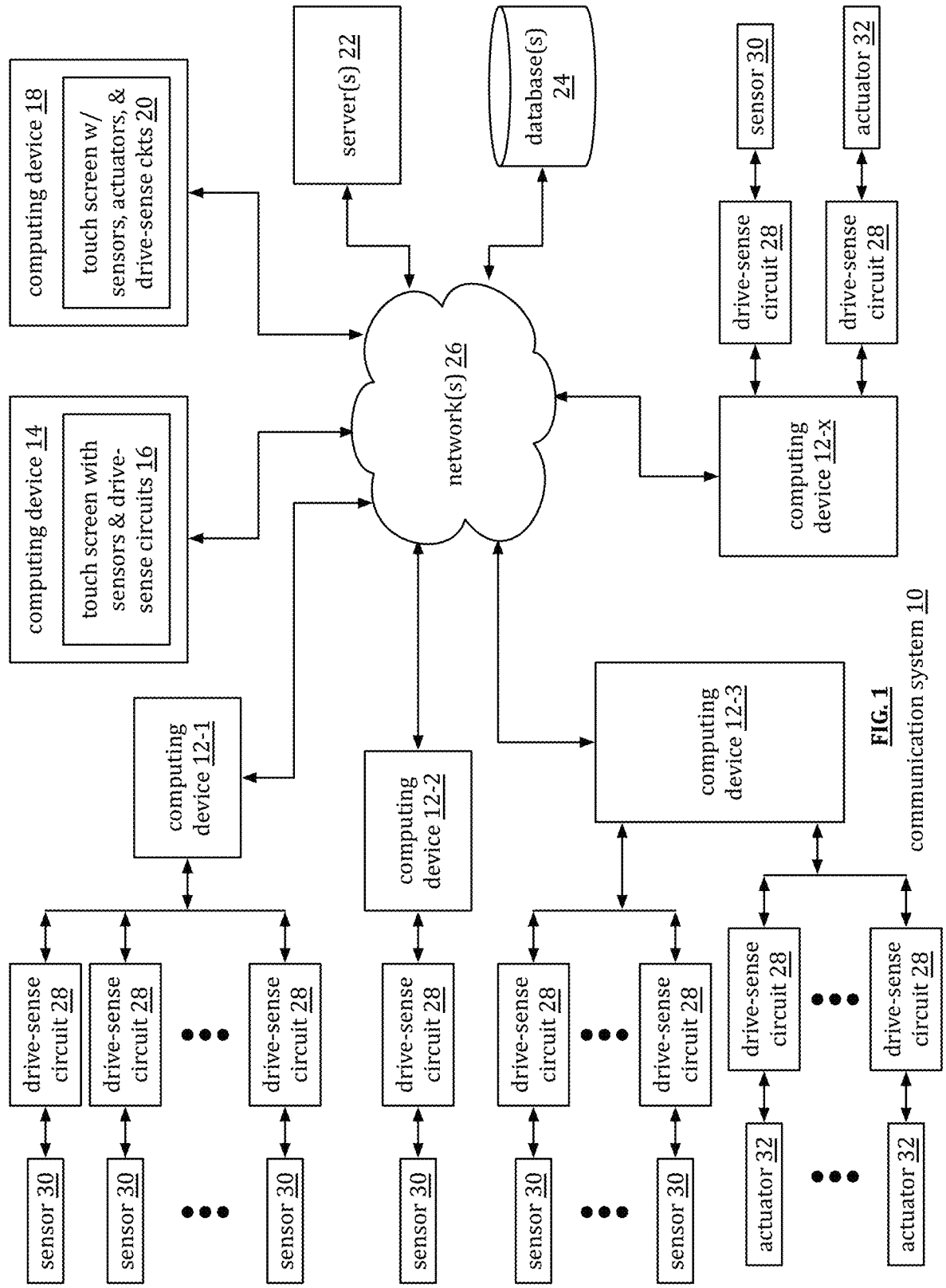
FIG. 1 is a schematic block diagram of an embodiment of a communication system in accordance with the present invention.

FIG. 1 is a schematic block diagram of an embodiment of a communication system 10 that includes a plurality of computing. devices 12-10, one or more servers 22, one or more databases 24, one or more networks 26, a plurality of drive-sense circuits 28, a plurality of sensors 30, and a plurality of actuators 32. Computing devices 14 include a touch screen 16 with sensors and drive-sensor circuits and computing devices 18 include a touch & tactic screen 20 that includes sensors, actuators, and drive-sense circuits.

A sensor 30 functions to convert a physical input into an electrical output and/or an optical output. The physical input of a sensor may be one of a variety of physical input conditions. For example, the physical condition includes one or more of, but is not limited to, acoustic waves (e.g., amplitude, phase, polarization, spectrum, and/or wave velocity); a biological and/or chemical condition (e.g., fluid concentration, level, composition, etc.); an electric condition (e.g., charge, voltage, current, conductivity, permittivity, eclectic field, which includes amplitude, phase, and/or polarization); a magnetic condition (e.g., flux, permeability, magnetic field, which amplitude, phase, and/or polarization); an optical condition (e.g., refractive index, reflectivity, absorption, etc.); a thermal condition (e.g., temperature, flux, specific heat, thermal conductivity, etc.); and a mechanical condition (e.g., position, velocity, acceleration, force, strain, stress, pressure, torque, etc.). For example, piezoelectric sensor converts force or pressure into an eclectic signal. As another example, a microphone converts audible acoustic waves into electrical signals.

There are a variety of types of sensors to sense the various types of physical conditions. Sensor types include, but are not limited to, capacitor sensors, inductive sensors, accelerometers, piezoelectric sensors, light sensors, magnetic field sensors, ultrasonic sensors, temperature sensors, infrared (IR) sensors, touch sensors, proximity sensors, pressure sensors, level sensors, smoke sensors, and gas sensors. In many ways, sensors function as the interface between the physical world and the digital world by converting real world conditions into digital signals that are then processed by computing devices for a vast number of applications including, but not limited to, medical applications, production automation applications, home environment control, public safety, and so on.

The various types of sensors have a variety of sensor characteristics that are factors in providing power to the sensors, receiving signals from the sensors, and/or interpreting the signals from the sensors. The sensor characteristics include resistance, reactance, power requirements, sensitivity, range, stability, repeatability, linearity, error, response time, and/or frequency response. For example, the resistance, reactance, and/or power requirements are factors in determining drive circuit requirements. As another example, sensitivity, stability, and/or linear are factors for interpreting the measure of the physical condition based on the received electrical and/or optical signal (e.g., measure of temperature, pressure, etc.).

An actuator 32 converts an electrical input into a physical output. The physical output of an actuator may be one of a variety of physical output conditions. For example, the physical output condition includes one or more of, but is not limited to, acoustic waves (e.g., amplitude, phase, polarization, spectrum, and/or wave velocity); a magnetic condition (e.g., flux, permeability, magnetic field, which amplitude, phase, and/or polarization); a thermal condition (e.g., temperature, flux, specific heat, thermal conductivity, etc.); and a mechanical condition (e.g., position, velocity, acceleration, force, strain, stress, pressure, torque, etc.). As an example, a piezoelectric actuator converts voltage into force or pressure. As another example, a speaker converts electrical signals into audible acoustic waves.

An actuator 32 may be one of a variety of actuators. For example, an actuator 32 is one of a comb drive, a digital micro-mirror device, an electric motor, an electroactive polymer, a hydraulic cylinder, a piezoelectric actuator, a pneumatic actuator, a screw jack, a servomechanism, a solenoid, a stepper motor, a shape-memory allow, a thermal bimorph, and a hydraulic actuator.

The various types of actuators have a variety of actuators characteristics that are factors in providing power to the actuator and sending signals to the actuators for desired performance. The actuator characteristics include resistance, reactance, power requirements, sensitivity, range, stability, repeatability, linearity, error, response time, and/or frequency response. For example, the resistance, reactance, and power requirements are factors in determining drive circuit requirements. As another example, sensitivity, stability, and/or linear are factors for generating the signaling to send to the actuator to obtain the desired physical output condition.

The computing devices 12, 14, and 18 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. The computing devices 12, 14, and 18 will be discussed in greater detail with reference to one or more of FIGS. 2-4.

A server 22 is a special type of computing device that is optimized for processing large amounts of data requests in parallel. A server 22 includes similar components to that of the computing devices 12, 14, and/or 18 with more robust processing modules, more main memory, and/or more hard drive memory (e.g., solid state, hard drives, etc.). Further, a server 22 is typically accessed remotely; as such it does not generally include user input devices and/or user output devices. In addition, a server may be a standalone separate computing device and/or may be a cloud computing device.

A database 24 is a special type of computing device that is optimized for large scale data storage and retrieval. A database 24 includes similar components to that of the computing devices 12, 14, and/or 18 with more hard drive memory (e.g., solid state, hard drives, etc.) and potentially with more processing modules and/or main memory. Further, a database 24 is typically accessed remotely; as such it does not generally include user input devices and/or user output devices. In addition, a database 24 may be a standalone separate computing device and/or may be a cloud computing device.

The network 26 includes one more local area networks (LAN) and/or one or more wide area networks WAN), which may be a public network and/or a private network. A LAN may be a wireless-LAN (e.g., Wi-Fi access point, Bluetooth, ZigBee, etc.) and/or a wired network (e.g., Firewire, Ethernet, etc.). A WAN may be a wired and/or wireless WAN. For example, a LAN may be a personal home or business's wireless network and a WAN is the Internet, cellular telephone infrastructure, and/or satellite communication infrastructure.

In an example of operation, computing device 12-1 communicates with a plurality of drive-sense circuits 28, which, in turn, communicate with a plurality of sensors 30. The sensors 30 and/or the drive-sense circuits 28 are within the computing device 12-1 and/or external to it. For example, the sensors 30 may be external to the computing device 12-1 and the drive-sense circuits are within the computing device 12-1. As another example, both the sensors 30 and the drive-sense circuits 28 are external to the computing device 12-1. When the drive-sense circuits 28 are external to the computing device, they are coupled to the computing device 12-1 via wired and/or wireless communication links as will be discussed in greater detail with reference to one or more of FIGS. 5A-5C.

The computing device 12-1 communicates with the drive-sense circuits 28 to; (a) turn them on, (b) obtain data from the sensors (individually and/or collectively), (c) instruct the drive sense circuit on how to communicate the sensed data to the computing device 12-1, (d) provide signaling attributes (e.g., DC level, AC level, frequency, power level, regulated current signal, regulated voltage signal, regulation of an impedance, frequency patterns for various sensors, different frequencies for different sensing applications, etc.) to use with the sensors, and/or (e) provide other commands and/or instructions.

As a specific example, the sensors 30 are distributed along a pipeline to measure flow rate and/or pressure within a section of the pipeline. The drive-sense circuits 28 have their own power source (e.g., battery, power supply, etc.) and are proximally located to their respective sensors 30. At desired time intervals (milliseconds, seconds, minutes, hours, etc.), the drive-sense circuits 28 provide a regulated source signal or a power signal to the sensors 30. An electrical characteristic of the sensor 30 affects the regulated source signal or power signal, which is reflective of the condition (e.g., the flow rate and/or the pressure) that sensor is sensing.

The drive-sense circuits 28 detect the effects on the regulated source signal or power signals as a result of the electrical characteristics of the sensors. The drive-sense circuits 28 then generate signals representative of change to the regulated source signal or power signal based on the detected effects on the power signals. The changes to the regulated source signals or power signals are representative of the conditions being sensed by the sensors 30.

The drive-sense circuits 28 provide the representative signals of the conditions to the computing device 12-1. A representative signal may be an analog signal or a digital signal. In either case, the computing device 12-1 interprets the representative signals to determine the pressure and/or flow rate at each sensor location along the pipeline. The computing device may then provide this information to the server 22, the database 24, and/or to another computing device for storing and/or further processing.

As another example of operation, computing device 12-2 is coupled to a drive-sense circuit 28, which is, in turn, coupled to a senor 30. The sensor 30 and/or the drive-sense circuit 28 may be internal and/or external to the computing device 12-2. In this example, the sensor 30 is sensing a condition that is particular to the computing device 12-2. For example, the sensor 30 may be a temperature sensor, an ambient light sensor, an ambient noise sensor, etc. As described above, when instructed by the computing device 12-2 (which may be a default setting for continuous sensing or at regular intervals), the drive-sense circuit 28 provides the regulated source signal or power signal to the sensor 30 and detects an effect to the regulated source signal or power signal based on an electrical characteristic of the sensor. The drive-sense circuit generates a representative signal of the affect and sends it to the computing device 12-2.

In another example of operation, computing device 12-3 is coupled to a plurality of drive-sense circuits 28 that are coupled to a plurality of sensors 30 and is coupled to a plurality of drive-sense circuits 28 that are coupled to a plurality of actuators 32. The generally functionality of the drive-sense circuits 28 coupled to the sensors 30 in accordance with the above description.

Since an actuator 32 is essentially an inverse of a sensor in that an actuator converts an electrical signal into a physical condition, while a sensor converts a physical condition into an electrical signal, the drive-sense circuits 28 can be used to power actuators 32. Thus, in this example, the computing device 12-3 provides actuation signals to the drive-sense circuits 28 for the actuators 32. The drive-sense circuits modulate the actuation signals on to power signals or regulated control signals, which are provided to the actuators 32. The actuators 32 are powered from the power signals or regulated control signals and produce the desired physical condition from the modulated actuation signals.

As another example of operation, computing device 12-x is coupled to a drive-sense circuit 28 that is coupled to a sensor 30 and is coupled to a drive-sense circuit 28 that is coupled to an actuator 32. In this example, the sensor 30 and the actuator 32 are for use by the computing device 12-x. For example, the sensor 30 may be a piezoelectric microphone and the actuator 32 may be a piezoelectric speaker.

Figure 2:
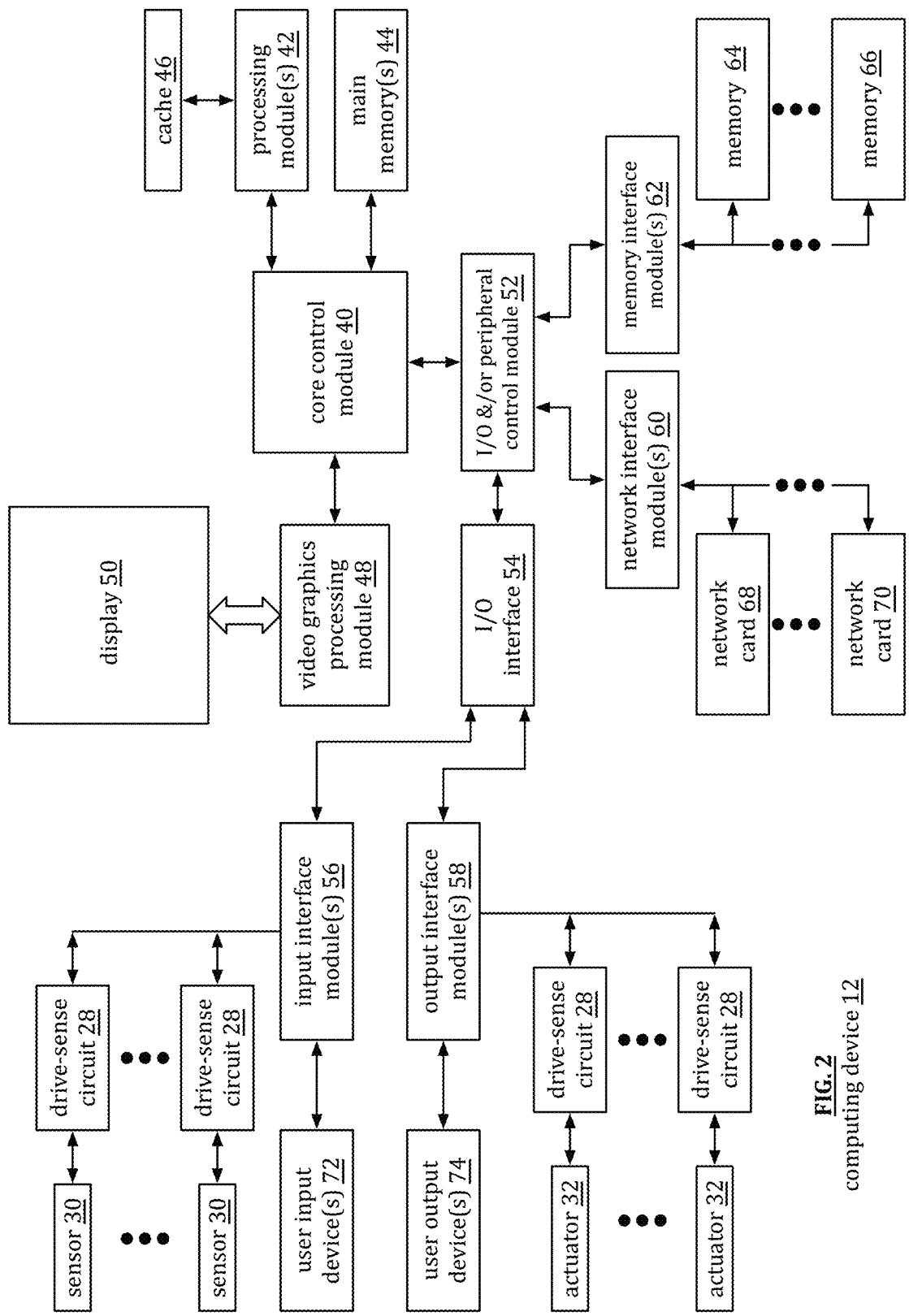
FIG. 2 is a schematic block diagram of an embodiment of a computing device in accordance with the present invention.

FIG. 2 is a schematic block diagram of an embodiment of a computing device 12 (e.g., any one of 12-1 through 12-x). The computing device 12 includes a core control module 40, one or more processing modules 42, one or more main memories 44, cache memory 46, a video graphics processing module 48, a display 50, an Input-Output (I/O) peripheral control module 52, one or more input interface modules 56, one or more output interface modules 58, one or more network interface modules 60, and one or more memory interface modules 62. A processing module 42 is described in greater detail at the end of the detailed description of the invention section and, in an alternative embodiment, has a direction connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 ($4^{th}$ generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieve from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 includes one or more hard drives, one or more solid state memory chips, and/or one or more other large capacity storage devices that, in comparison to cache memory and main memory devices, is/are relatively inexpensive with respect to cost per amount of data stored. The memory 64-66 is coupled to the core control module 40 via the I/O and/or peripheral control module 52 and via one or more memory interface modules 62. In an embodiment, the I/O and/or peripheral control module 52 includes one or more Peripheral Component Interface (PCI) buses to which peripheral components connect to the core control module 40. A memory interface module 62 includes a software driver and a hardware connector for coupling a memory device to the I/O and/or peripheral control module 52. For example, a memory interface 62 is in accordance with a Serial Advanced Technology Attachment (SATA) port.

The core control module 40 coordinates data communications between the processing module(s) 42 and the network(s) 26 via the I/O and/or peripheral control module 52, the network interface module(s) 60, and a network card 68 or 70. A network card 68 or 70 includes a wireless communication unit or a wired communication unit. A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 60 includes a software driver and a hardware connector for coupling the network card to the I/O and/or peripheral control module 52. For example, the network interface module 60 is in accordance with one or more versions of IEEE 802.11, cellular telephone protocols, 10/100/1000 Gigabit LAN protocols, etc.

The core control module 40 coordinates data communications between the processing module(s) 42 and input device(s) 72 via the input interface module(s) 56 and the I/O and/or peripheral control module 52. An input device 72 includes a keypad, a keyboard, control switches, a touchpad, a microphone, a camera, etc. An input interface module 56 includes a software driver and a hardware connector for coupling an input device to the I/O and/or peripheral control module 52. In an embodiment, an input interface module 56 is in accordance with one or more Universal Serial Bus (USB) protocols.

The core control module 40 coordinates data communications between the processing module(s) 42 and output device(s) 74 via the output interface module(s) 58 and the I/O and/or peripheral control module 52. An output device 74 includes a speaker, etc. An output interface module 58 includes a software driver and a hardware connector for coupling an output device to the I/O and/or peripheral control module 52. In an embodiment, an output interface module 56 is in accordance with one or more audio codec protocols.

The processing module 42 communicates directly with a video graphics processing module 48 to display data on the display 50. The display 50 includes an LED (light emitting diode) display, an LCD (liquid crystal display), and/or other type of display technology. The display has a resolution, an aspect ratio, and other features that affect the quality of the display. The video graphics processing module 48 receives data from the processing module 42, processes the data to produce rendered data in accordance with the characteristics of the display, and provides the rendered data to the display 50.

FIG. 2 further illustrates sensors 30 and actuators 32 coupled to drive-sense circuits 28, which are coupled to the input interface module 56 (e.g., USB port). Alternatively, one or more of the drive-sense circuits 28 is coupled to the computing device via a wireless network card (e.g., WLAN) or a wired network card (e.g., Gigabit LAN). While not shown, the computing device 12 further includes a BIOS (Basic Input Output System) memory coupled to the core control module 40.

Figure 3:
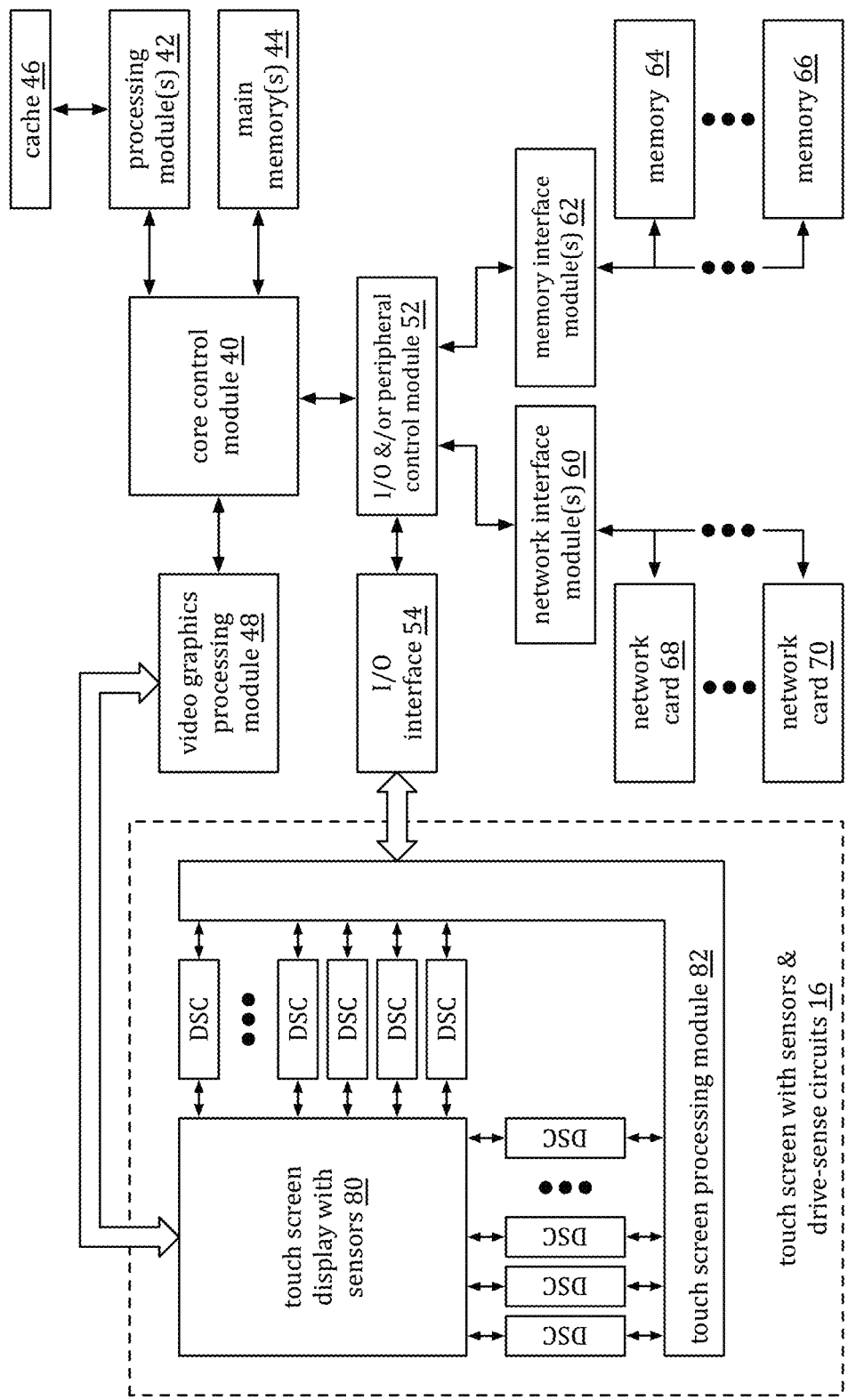
FIG. 3 is a schematic block diagram of another embodiment of a computing device in accordance with the present invention.

FIG. 3 is a schematic block diagram of another embodiment of a computing device 14 that includes a core control module 40, one or more processing modules 42, one or more main memories 44, cache memory 46, a video graphics processing module 48, a touch screen 16, an Input-Output (I/O) peripheral control module 52, one or more input interface modules 56, one or more output interface modules 58, one or more network interface modules 60, and one or more memory interface modules 62. The touch screen 16 includes a touch screen display 80, a plurality of sensors 30, a plurality of drive-sense circuits (DSC), and a touch screen processing module 82.

Computing device 14 operates similarly to computing device 12 of FIG. 2 with the addition of a touch screen as an input device. The touch screen includes a plurality of sensors (e.g., electrodes, capacitor sensing cells, capacitor sensors, inductive sensor, etc.) to detect a proximal touch of the screen. For example, when one or more fingers touches the screen, capacitance of sensors proximal to the touch(es) are affected (e.g., impedance changes). The drive-sense circuits (DSC) coupled to the affected sensors detect the change and provide a representation of the change to the touch screen processing module 82, which may be a separate processing module or integrated into the processing module 42.

The touch screen processing module 82 processes the representative signals from the drive-sense circuits (DSC) to determine the location of the touch(es). This information is inputted to the processing module 42 for processing as an input. For example, a touch represents a selection of a button on screen, a scroll function, a zoom in-out function, etc.

Figure 4:
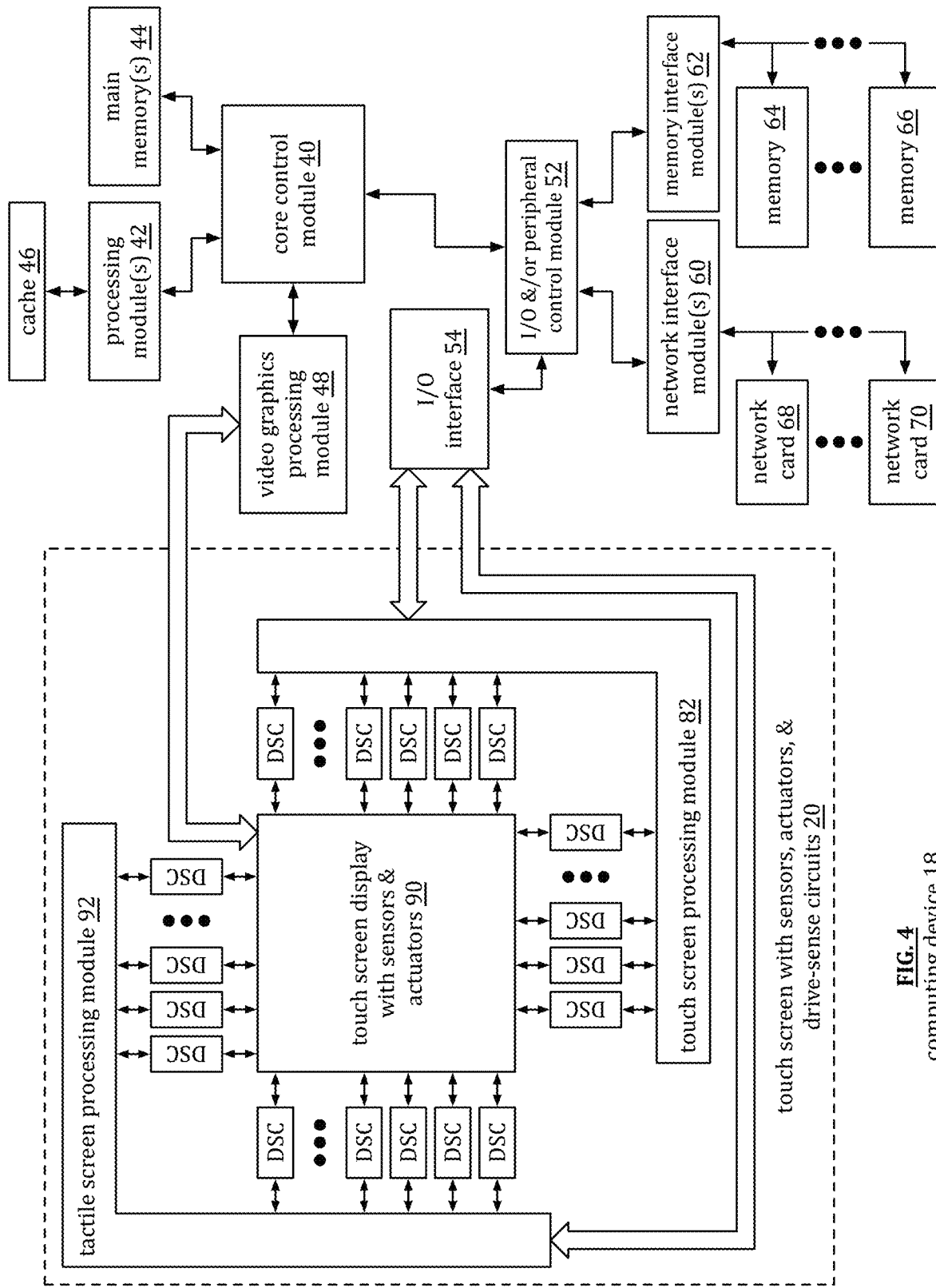
FIG. 4 is a schematic block diagram of another embodiment of a computing device in accordance with the present invention.

FIG. 4 is a schematic block diagram of another embodiment of a computing device 18 that includes a core control module 40, one or more processing modules 42, one or more main memories 44, cache memory 46, a video graphics processing module 48, a touch and tactile screen 20, an Input-Output (I/O) peripheral control module 52, one or more input interface modules 56, one or more output interface modules 58, one or more network interface modules 60, and one or more memory interface modules 62. The touch and tactile screen 20 includes a touch and tactile screen display 90, a plurality of sensors 30, a plurality of actuators 32, a plurality of drive-sense circuits (DSC), a touch screen processing module 82, and a tactile screen processing module 92.

Computing device 18 operates similarly to computing device 14 of FIG. 3 with the addition of a tactile aspect to the screen 20 as an output device. The tactile portion of the screen 20 includes the plurality of actuators (e.g., piezoelectric transducers to create vibrations, solenoids to create movement, etc.) to provide a tactile feel to the screen 20. To do so, the processing module creates tactile data, which is provided to the appropriate drive-sense circuits (DSC) via the tactile screen processing module 92, which may be a stand-alone processing module or integrated into processing module 42. The drive-sense circuits (DSC) convert the tactile data into drive-actuate signals and provide them to the appropriate actuators to create the desired tactile feel on the screen 20.

FIG. 5A is a schematic plot diagram of a computing subsystem 25 that includes a sensed data processing module 65, a plurality of communication modules 61A-x, a plurality of processing modules 42A-x, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing devices in which processing modules 42A-x reside.

A drive-sense circuit 28 (or multiple drive-sense circuits), a processing module (e.g., 41A), and a communication module (e.g., 61A) are within a common computing device. Each grouping of a drive-sense circuit(s), processing module, and communication module is in a separate computing device. A communication module 61A-x is constructed in accordance with one or more wired communication protocol and/or one or more wireless communication protocols that is/are in accordance with the one or more of the Open System Interconnection (OSI) model, the Transmission Control Protocol/Internet Protocol (TCP/IP) model, and other communication protocol module.

In an example of operation, a processing module (e.g., 42A) provides a control signal to its corresponding drive-sense circuit 28. The processing module 42A may generate the control signal, receive it from the sensed data processing module 65, or receive an indication from the sensed data processing module 65 to generate the control signal. The control signal enables the drive-sense circuit 28 to provide a drive signal to its corresponding sensor. The control signal may further include a reference signal having one or more frequency components to facilitate creation of the drive signal and/or interpreting a sensed signal received from the sensor.

Based on the control signal, the drive-sense circuit 28 provides the drive signal to its corresponding sensor (e.g., 1) on a drive & sense line. While receiving the drive signal (e.g., a power signal, a regulated source signal, etc.), the sensor senses a physical condition 1-$x$ (e.g., acoustic waves, a biological condition, a chemical condition, an electric condition, a magnetic condition, an optical condition, a thermal condition, and/or a mechanical condition). As a result of the physical condition, an electrical characteristic (e.g., impedance, voltage, current, capacitance, inductance, resistance, reactance, etc.) of the sensor changes, which affects the drive signal. Note that if the sensor is an optical sensor, it converts a sensed optical condition into an electrical characteristic.

The drive-sense circuit 28 detects the effect on the drive signal via the drive & sense line and processes the affect to produce a signal representative of power change, which may be an analog or digital signal. The processing module 42A receives the signal representative of power change, interprets it, and generates a value representing the sensed physical condition. For example, if the sensor is sensing pressure, the value representing the sensed physical condition is a measure of pressure (e.g., x PSI (pounds per square inch)).

In accordance with a sensed data process function (e.g., algorithm, application, etc.), the sensed data processing module 65 gathers the values representing the sensed physical conditions from the processing modules. Since the sensors 1-$x$ may be the same type of sensor (e.g., a pressure sensor), may each be different sensors, or a combination thereof; the sensed physical conditions may be the same, may each be different, or a combination thereof. The sensed data processing module 65 processes the gathered values to produce one or more desired results. For example, if the computing subsystem 25 is monitoring pressure along a pipeline, the processing of the gathered values indicates that the pressures are all within normal limits or that one or more of the sensed pressures is not within normal limits.

As another example, if the computing subsystem 25 is used in a manufacturing facility, the sensors are sensing a variety of physical conditions, such as acoustic waves (e.g., for sound proofing, sound generation, ultrasound monitoring, etc.), a biological condition (e.g., a bacterial contamination, etc.) a chemical condition (e.g., composition, gas concentration, etc.), an electric condition (e.g., current levels, voltage levels, electro-magnetic interference, etc.), a magnetic condition (e.g., induced current, magnetic field strength, magnetic field orientation, etc.), an optical condition (e.g., ambient light, infrared, etc.), a thermal condition (e.g., temperature, etc.), and/or a mechanical condition (e.g., physical position, force, pressure, acceleration, etc.).

The computing subsystem 25 may further include one or more actuators in place of one or more of the sensors and/or in addition to the sensors. When the computing subsystem 25 includes an actuator, the corresponding processing module provides an actuation control signal to the corresponding drive-sense circuit 28. The actuation control signal enables the drive-sense circuit 28 to provide a drive signal to the actuator via a drive & actuate line (e.g., similar to the drive & sense line, but for the actuator). The drive signal includes one or more frequency components and/or amplitude components to facilitate a desired actuation of the actuator.

In addition, the computing subsystem 25 may include an actuator and sensor working in concert. For example, the sensor is sensing the physical condition of the actuator. In this example, a drive-sense circuit provides a drive signal to the actuator and another drive sense signal provides the same drive signal, or a scaled version of it, to the sensor. This allows the sensor to provide near immediate and continuous sensing of the actuator's physical condition. This further allows for the sensor to operate at a first frequency and the actuator to operate at a second frequency.

In an embodiment, the computing subsystem is a stand-alone system for a wide variety of applications (e.g., manufacturing, pipelines, testing, monitoring, security, etc.). In another embodiment, the computing subsystem 25 is one subsystem of a plurality of subsystems forming a larger system. For example, different subsystems are employed based on geographic location. As a specific example, the computing subsystem 25 is deployed in one section of a factory and another computing subsystem is deployed in another part of the factory. As another example, different subsystems are employed based function of the subsystems. As a specific example, one subsystem monitors a city's traffic light operation and another subsystem monitors the city's sewage treatment plants.

Regardless of the use and/or deployment of the computing system, the physical conditions it is sensing, and/or the physical conditions it is actuating, each sensor and each actuator (if included) is driven and sensed by a single line as opposed to separate drive and sense lines. This provides many advantages including, but not limited to, lower power requirements, better ability to drive high impedance sensors, lower line to line interference, and/or concurrent sensing functions.

FIG. 5B is a schematic block diagram of another embodiment of a computing subsystem 25 that includes a sensed data processing module 65, a communication module 61, a plurality of processing modules 42A-x, a plurality of drive sense circuits 28, and a plurality of sensors 1-$x$, which may be sensors 30 of FIG. 1. The sensed data processing module 65 is one or more processing modules within one or more servers 22 and/or one more processing modules in one or more computing devices that are different than the computing device, devices, in which processing modules 42A-x reside.

In an embodiment, the drive-sense circuits 28, the processing modules, and the communication module are within a common computing device. For example, the computing device includes a central processing unit that includes a plurality of processing modules. The functionality and operation of the sensed data processing module 65, the communication module 61, the processing modules 42A-x, the drive sense circuits 28, and the sensors 1-$x$ are as discussed with reference to FIG. 5A.

FIG. 5C is a schematic block diagram of another embodiment of a computing subsystem 25 that includes a sensed data processing module 65, a communication module 61, a processing module 42, a plurality of drive sense circuits 28, and a plurality of sensors 1-$x$, which may be sensors 30 of FIG. 1. The sensed data processing module 65 is one or more processing modules within one or more servers 22 and/or one more processing modules in one or more computing devices that are different than the computing device in which the processing module 42 resides.

In an embodiment, the drive-sense circuits 28, the processing module, and the communication module are within a common computing device. The functionality and operation of the sensed data processing module 65, the communication module 61, the processing module 42, the drive sense circuits 28, and the sensors 1-x are as discussed with reference to FIG. 5A.

FIG. 5D is a schematic block diagram of another embodiment of a computing subsystem 25 that includes a processing module 42, a reference signal circuit 100, a plurality of drive sense circuits 28, and a plurality of sensors 30. The processing module 42 includes a drive-sense processing block 104, a drive-sense control block 102, and a reference control block 106. Each block 102-106 of the processing module 42 may be implemented via separate modules of the processing module, may be a combination of software and hardware within the processing module, and/or may be field programmable modules within the processing module 42.

In an example of operation, the drive-sense control block 104 generates one or more control signals to activate one or more of the drive-sense circuits 28. For example, the drive-sense control block 102 generates a control signal that enables of the drive-sense circuits 28 for a given period of time (e.g., 1 second, 1 minute, etc.). As another example, the drive-sense control block 102 generates control signals to sequentially enable the drive-sense circuits 28. As yet another example, the drive-sense control block 102 generates a series of control signals to periodically enable the drive-sense circuits 28 (e.g., enabled once every second, every minute, every hour, etc.).

Continuing with the example of operation, the reference control block 106 generates a reference control signal that it provides to the reference signal circuit 100. The reference signal circuit 100 generates, in accordance with the control signal, one or more reference signals for the drive-sense circuits 28. For example, the control signal is an enable signal, which, in response, the reference signal circuit 100 generates a pre-programmed reference signal that it provides to the drive-sense circuits 28. In another example, the reference signal circuit 100 generates a unique reference signal for each of the drive-sense circuits 28. In yet another example, the reference signal circuit 100 generates a first unique reference signal for each of the drive-sense circuits 28 in a first group and generates a second unique reference signal for each of the drive-sense circuits 28 in a second group.

The reference signal circuit 100 may be implemented in a variety of ways. For example, the reference signal circuit 100 includes a DC (direct current) voltage generator, an AC voltage generator, and a voltage combining circuit. The DC voltage generator generates a DC voltage at a first level and the AC voltage generator generates an AC voltage at a second level, which is less than or equal to the first level. The voltage combining circuit combines the DC and AC voltages to produce the reference signal. As examples, the reference signal circuit 100 generates a reference signal similar to the signals shown in FIG. 7, which will be subsequently discussed.

As another example, the reference signal circuit 100 includes a DC current generator, an AC current generator, and a current combining circuit. The DC current generator generates a DC current a first current level and the AC current generator generates an AC current at a second current level, which is less than or equal to the first current level. The current combining circuit combines the DC and AC currents to produce the reference signal.

Returning to the example of operation, the reference signal circuit 100 provides the reference signal, or signals, to the drive-sense circuits 28. When a drive-sense circuit 28 is enabled via a control signal from the drive sense control block 102, it provides a drive signal to its corresponding sensor 30. As a result of a physical condition, an electrical characteristic of the sensor is changed, which affects the drive signal. Based on the detected effect on the drive signal and the reference signal, the drive-sense circuit 28 generates a signal representative of the effect on the drive signal.

The drive-sense circuit provides the signal representative of the effect on the drive signal to the drive-sense processing block 104. The drive-sense processing block 104 processes the representative signal to produce a sensed value 97 of the physical condition (e.g., a digital value that represents a specific temperature, a specific pressure level, etc.). The processing module 42 provides the sensed value 97 to another application running on the computing device, to another computing device, and/or to a server 22.

Figure 5E:
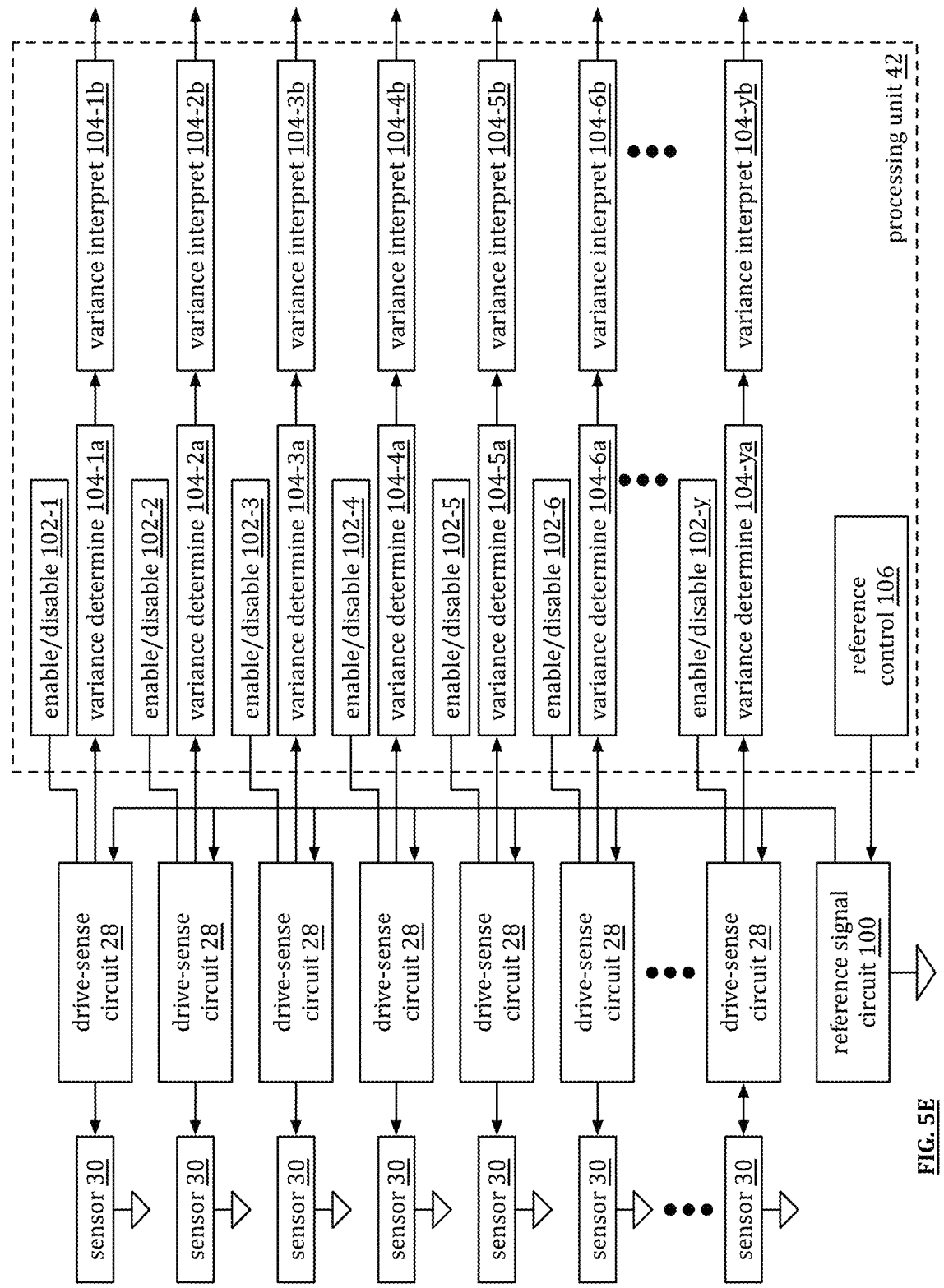
FIG. 5E is a schematic block diagram of another embodiment of a computing subsystem in accordance with the present invention.

FIG. 5E is a schematic block diagram of another embodiment of a computing subsystem 25 that includes a processing module 42, a plurality of drive sense circuits 28, and a plurality of sensors 30. This embodiment is similar to the embodiment of FIG. 5D with the functionality of the drive-sense processing block 104, a drive-sense control block 102, and a reference control block 106 shown in greater detail. For instance, the drive-sense control block 102 includes individual enable/disable blocks 102-1 through 102-y. An enable/disable block functions to enable or disable a corresponding drive-sense circuit in a manner as discussed above with reference to FIG. 5D.

The drive-sense processing block 104 includes variance determining modules 104-1a through y and variance interpreting modules 104-2a through y. For example, variance determining module 104-1a receives, from the corresponding drive-sense circuit 28, a signal representative of a physical condition sensed by a sensor. The variance determining module 104-1a functions to determine a difference from the signal representing the sensed physical condition with a signal representing a known, or reference, physical condition. The variance interpreting module 104-1b interprets the difference to determine a specific value for the sensed physical condition.

As a specific example, the variance determining module 104-1a receives a digital signal of 1001 0110 (150 in decimal) that is representative of a sensed physical condition (e.g., temperature) sensed by a sensor from the corresponding drive-sense circuit 28. With 8-bits, there are $2^8$ (256) possible signals representing the sensed physical condition. Assume that the units for temperature is Celsius and a digital value of 0100 0000 (64 in decimal) represents the known value for 25 degree Celsius. The variance determining module 104-b1 determines the difference between the digital signal representing the sensed value (e.g., 1001 0110, 150 in decimal) and the known signal value of (e.g., 0100 0000, 64 in decimal), which is 0011 0000 (86 in decimal). The variance determining module 104-b1 then determines the sensed value based on the difference and the known value. In this example, the sensed value equals 25+86*(100/256) =25+33.6=58.6 degrees Celsius.

Figure 6A:
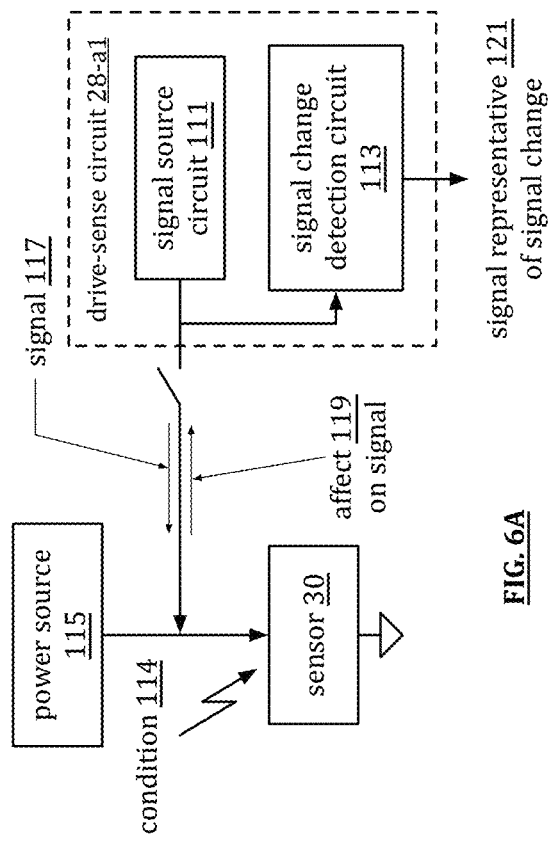
FIG. 6A is a schematic block diagram of another embodiment of a drive sense circuit in accordance with the present invention.
Figure 6:
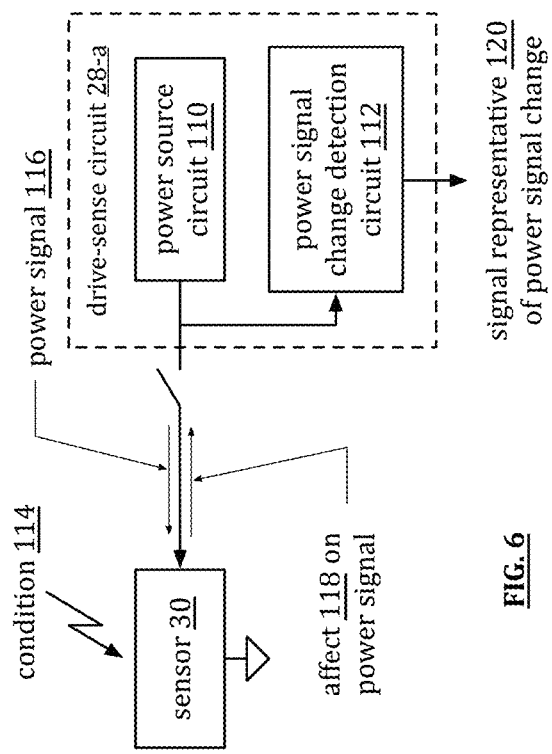
FIG. 6 is a schematic block diagram of an embodiment of a drive sense circuit in accordance with the present invention.

FIG. 6 is a schematic block diagram of a drive center circuit 28-a coupled to a sensor 30. The drive sense-sense circuit 28 includes a power source circuit 110 and a power signal change detection circuit 112. The sensor 30 includes one or more transducers that have varying electrical characteristics (e.g., capacitance, inductance, impedance, current, voltage, etc.) based on varying physical conditions 114 (e.g., pressure, temperature, biological, chemical, etc.), or vice versa (e.g., an actuator).

The power source circuit 110 is operably coupled to the sensor 30 and, when enabled (e.g., from a control signal from the processing module 42, power is applied, a switch is closed, a reference signal is received, etc.) provides a power signal 116 to the sensor 30. The power source circuit 110 may be a voltage supply circuit (e.g., a battery, a linear regulator, an unregulated DC-to-DC converter, etc.) to produce a voltage-based power signal, a current supply circuit (e.g., a current source circuit, a current mirror circuit, etc.) to produce a current-based power signal, or a circuit that provide a desired power level to the sensor and substantially matches impedance of the sensor. The power source circuit 110 generates the power signal 116 to include a DC (direct current) component and/or an oscillating component.

When receiving the power signal 116 and when exposed to a condition 114, an electrical characteristic of the sensor affects 118 the power signal. When the power signal change detection circuit 112 is enabled, it detects the affect 118 on the power signal as a result of the electrical characteristic of the sensor. For example, the power signal is a 1.5 voltage signal and, under a first condition, the sensor draws 1 milliamp of current, which corresponds to an impedance of 1.5 K Ohms. Under a second conditions, the power signal remains at 1.5 volts and the current increases to 1.5 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

As another example, the power signal is a 1.5 voltage signal and, under a first condition, the sensor draws 1 milliamp of current, which corresponds to an impedance of 1.5 K Ohms. Under a second conditions, the power signal drops to 1.3 volts and the current increases to 1.3 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

Figure 7:
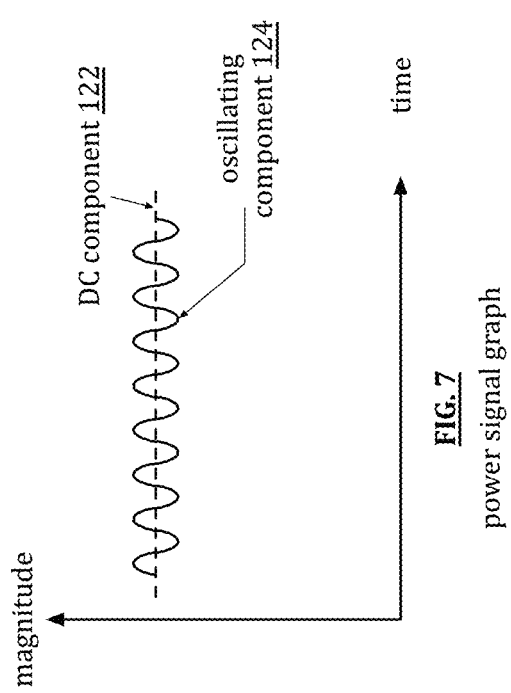
FIG. 7 is an example of a power signal graph in accordance with the present invention.

The power signal 116 includes a DC component 122 and/or an oscillating component 124 as shown in FIG. 7. The oscillating component 124 includes a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component). Note that the power signal is shown without affect from the sensor as the result of a condition or changing condition.

In an embodiment, power generating circuit 110 varies frequency of the oscillating component 124 of the power signal 116 so that it can be tuned to the impedance of the sensor and/or to be off-set in frequency from other power signals in a system. For example, a capacitance sensor's impedance decreases with frequency. As such, if the frequency of the oscillating component is too high with respect to the capacitance, the capacitor looks like a short and variances in capacitances will be missed. Similarly, if the frequency of the oscillating component is too low with respect to the capacitance, the capacitor looks like an open and variances in capacitances will be missed.

In an embodiment, the power generating circuit 110 varies magnitude of the DC component 122 and/or the oscillating component 124 to improve resolution of sensing and/or to adjust power consumption of sensing. In addition, the power generating circuit 110 generates the drive signal 110 such that the magnitude of the oscillating component 124 is less than magnitude of the DC component 122.

FIG. 6A is a schematic block diagram of a drive center circuit 28-*a*1 coupled to a sensor 30. The drive sense-sense circuit 28-*a*1 includes a signal source circuit 111, a signal change detection circuit 113, and a power source 115. The power source 115 (e.g., a battery, a power supply, a current source, etc.) generates a voltage and/or current that is combined with a signal 117, which is produced by the signal source circuit 111. The combined signal is supplied to the sensor 30.

The signal source circuit 111 may be a voltage supply circuit (e.g., a battery, a linear regulator, an unregulated DC-to-DC converter, etc.) to produce a voltage-based signal 117, a current supply circuit (e.g., a current source circuit, a current mirror circuit, etc.) to produce a current-based signal 117, or a circuit that provide a desired power level to the sensor and substantially matches impedance of the sensor. The signal source circuit 111 generates the signal 117 to include a DC (direct current) component and/or an oscillating component.

When receiving the combined signal (e.g., signal 117 and power from the power source) and when exposed to a condition 114, an electrical characteristic of the sensor affects 119 the signal. When the signal change detection circuit 113 is enabled, it detects the affect 119 on the signal as a result of the electrical characteristic of the sensor.

Figure 8:
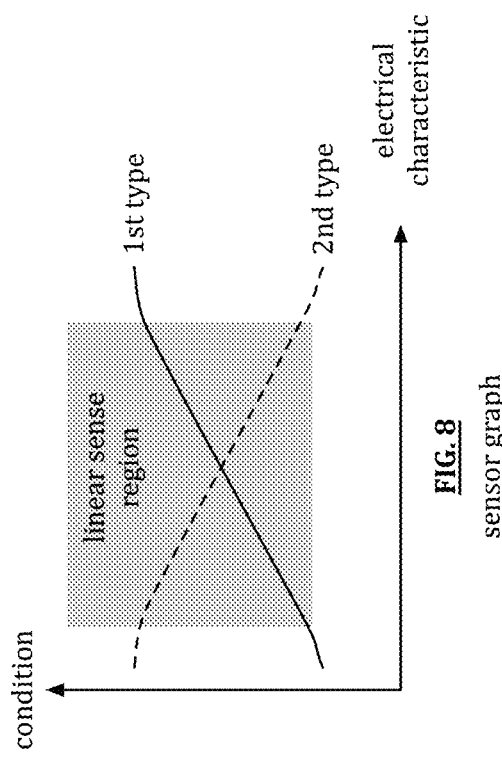
FIG. 8 is an example of a sensor graph in accordance with the present invention.

FIG. 8 is an example of a sensor graph that plots an electrical characteristic versus a condition. The sensor has a substantially linear region in which an incremental change in a condition produces a corresponding incremental change in the electrical characteristic. The graph shows two types of electrical characteristics: one that increases as the condition increases and the other that decreases and the condition increases. As an example of the first type, impedance of a temperature sensor increases and the temperature increases. As an example of a second type, a capacitance touch sensor decreases in capacitance as a touch is sensed.

Figure 9:
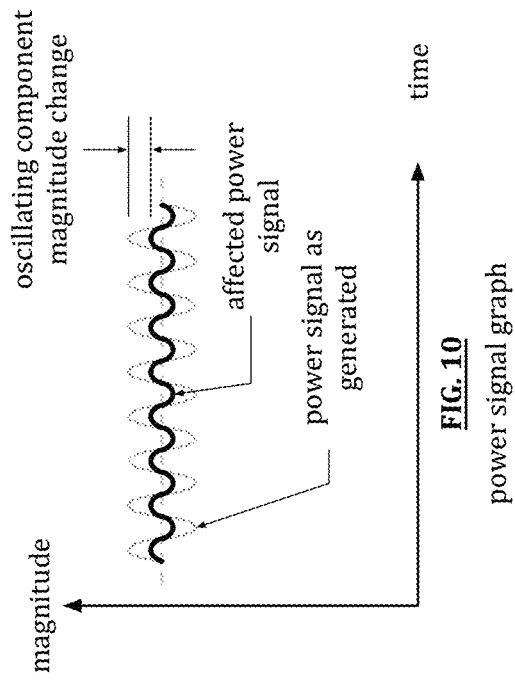
FIG. 9 is a schematic block diagram of another example of a power signal graph in accordance with the present invention.

FIG. 9 is a schematic block diagram of another example of a power signal graph in which the electrical characteristic or change in electrical characteristic of the sensor is affecting the power signal. In this example, the effect of the electrical characteristic or change in electrical characteristic of the sensor reduced the DC component but had little to no effect on the oscillating component. For example, the electrical characteristic is resistance. In this example, the resistance or change in resistance of the sensor decreased the power signal, inferring an increase in resistance for a relatively constant current.

Figure 10:
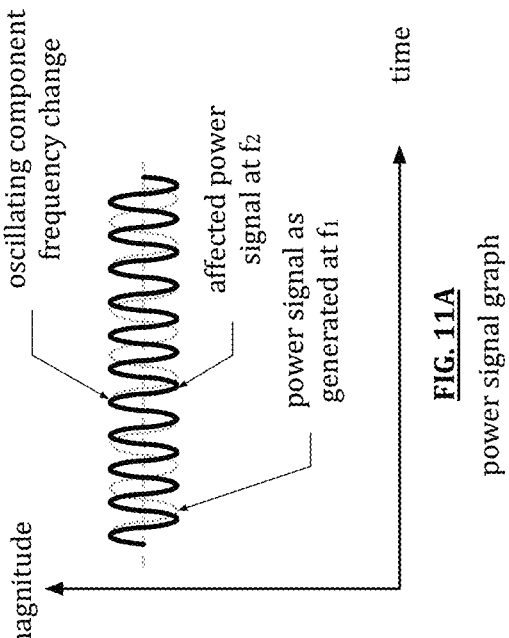
FIG. 10 is a schematic block diagram of another example of a power signal graph in accordance with the present invention.

FIG. 10 is a schematic block diagram of another example of a power signal graph in which the electrical characteristic or change in electrical characteristic of the sensor is affecting the power signal. In this example, the effect of the electrical characteristic or change in electrical characteristic of the sensor reduced magnitude of the oscillating component but had little to no effect on the DC component. For example, the electrical characteristic is impedance of a capacitor and/or an inductor. In this example, the impedance or change in impedance of the sensor decreased the magnitude of the oscillating signal component, inferring an increase in impedance for a relatively constant current.

Figure 11:
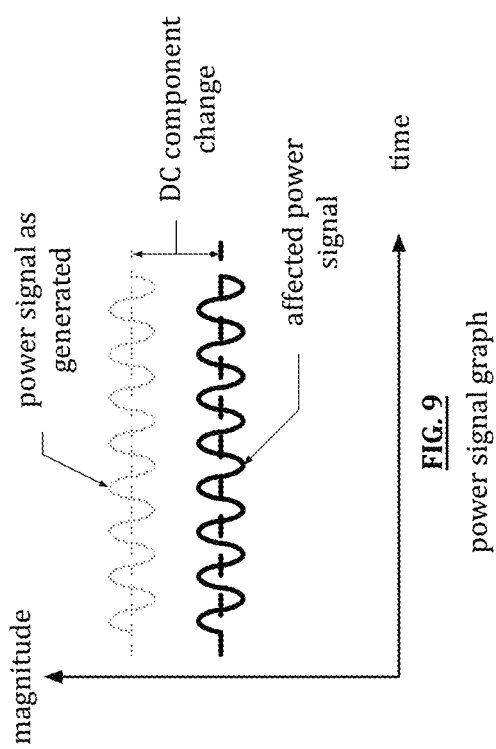
FIG. 11 is a schematic block diagram of another example of a power signal graph in accordance with the present invention.

FIG. 11 is a schematic block diagram of another example of a power signal graph in which the electrical characteristic or change in electrical characteristic of the sensor is affecting the power signal. In this example, the effect of the electrical characteristic or change in electrical characteristic of the sensor shifted frequency of the oscillating component but had little to no effect on the DC component. For example, the electrical characteristic is reactance of a capacitor and/or an inductor. In this example, the reactance or change in reactance of the sensor shifted frequency of the oscillating signal component, inferring an increase in reactance (e.g., sensor is functioning as an integrator or phase shift circuit).

Figure 11A:
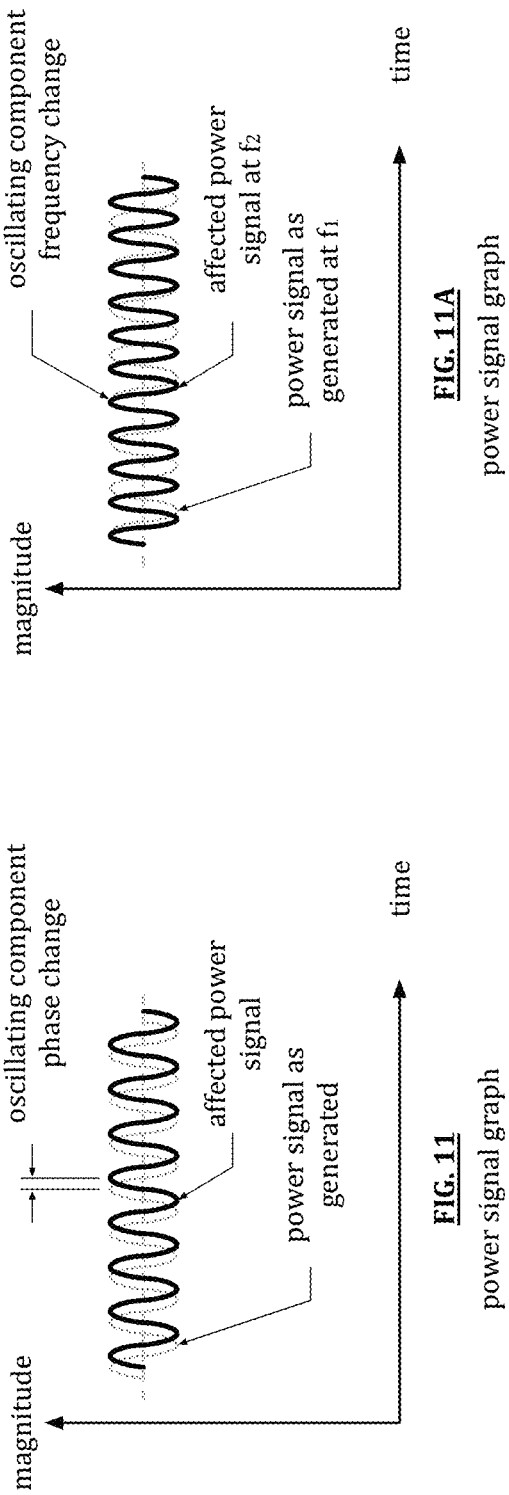
FIG. 11A is a schematic block diagram of another example of a power signal graph in accordance with the present invention.

FIG. 11A is a schematic block diagram of another example of a power signal graph in which the electrical characteristic or change in electrical characteristic of the sensor is affecting the power signal. In this example, the effect of the electrical characteristic or change in electrical characteristic of the sensor changes the frequency of the oscillating component but had little to no effect on the DC component. For example, the sensor includes two transducers that oscillate at different frequencies. The first transducer receives the power signal at a frequency of $f_1$ and converts it into a first physical condition. The second transducer is stimulated by the first physical condition to create an electrical signal at a different frequency $f_2$. In this example, the first and second transducers of the sensor change the frequency of the oscillating signal component, which allows for more granular sensing and/or a broader range of sensing.

Figure 12:
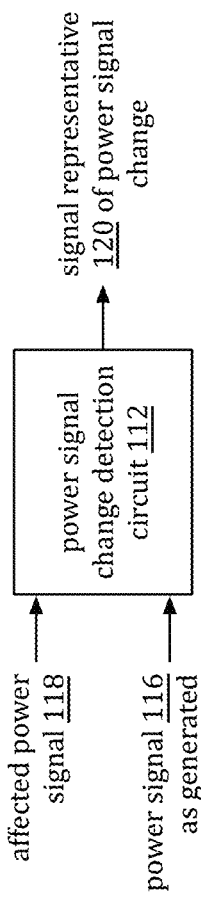
FIG. 12 is a schematic block diagram of an embodiment of a power signal change detection circuit in accordance with the present invention.

FIG. 12 is a schematic block diagram of an embodiment of a power signal change detection circuit 112 receiving the affected power signal 118 and the power signal 116 as generated to produce, therefrom, the signal representative 120 of the power signal change. The affect 118 on the power signal is the result of an electrical characteristic and/or change in the electrical characteristic of a sensor; a few examples of the affects are shown in FIGS. 8-11A.

In an embodiment, the power signal change detection circuit 112 detect a change in the DC component 122 and/or the oscillating component 124 of the power signal 116. The power signal change detection circuit 112 then generates the signal representative 120 of the change to the power signal based on the change to the power signal. For example, the change to the power signal results from the impedance of the sensor and/or a change in impedance of the sensor. The representative signal 120 is reflective of the change in the power signal and/or in the change in the sensor's impedance.

In an embodiment, the power signal change detection circuit 112 is operable to detect a change to the oscillating component at a frequency, which may be a phase shift, frequency change, and/or change in magnitude of the oscillating component. The power signal change detection circuit 112 is also operable to generate the signal representative of the change to the power signal based on the change to the oscillating component at the frequency. The power signal change detection circuit 112 is further operable to provide feedback to the power source circuit 110 regarding the oscillating component. The feedback allows the power source circuit 110 to regulate the oscillating component at the desired frequency, phase, and/or magnitude.

Figure 13:
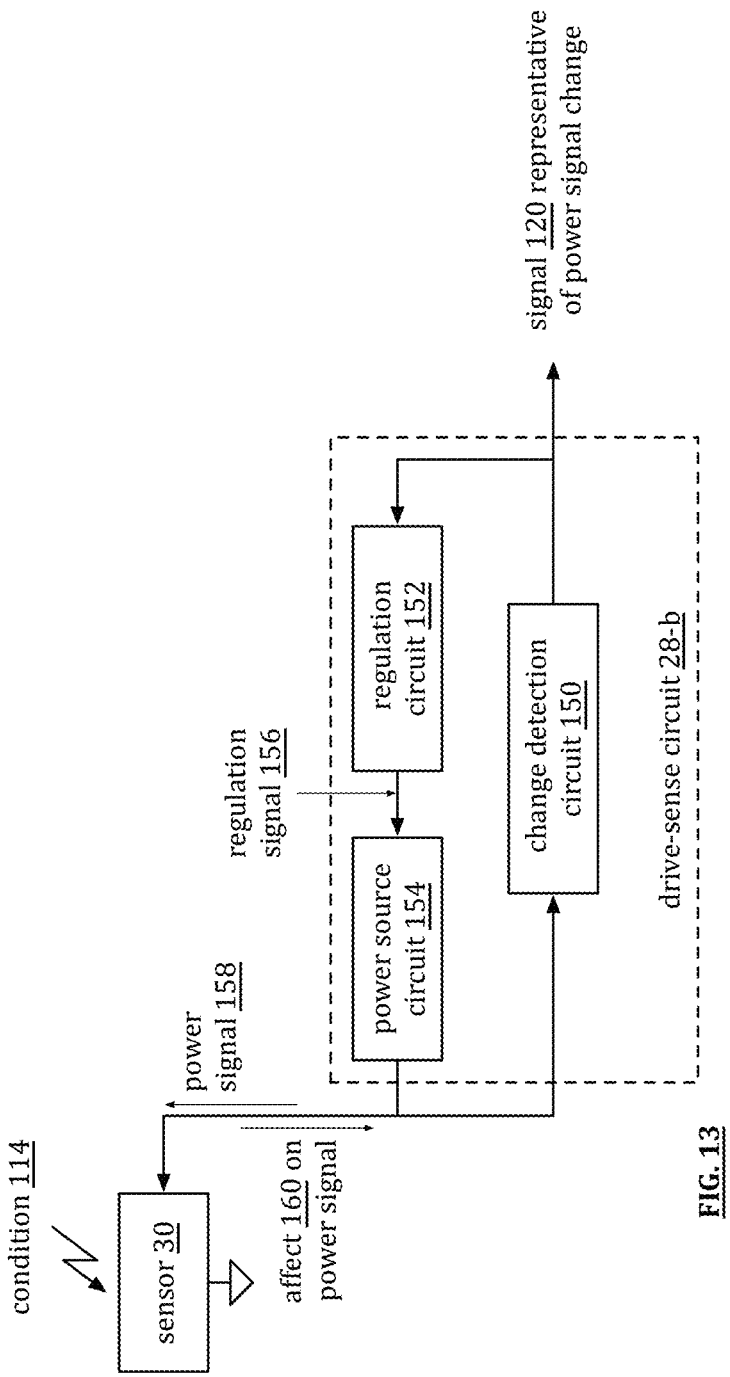
FIG. 13 is a schematic block diagram of another embodiment of a drive sense circuit in accordance with the present invention.

FIG. 13 is a schematic block diagram of another embodiment of a drive sense circuit 28-b includes a change detection circuit 150, a regulation circuit 152, and a power source circuit 154. The drive-sense circuit 28-b is coupled to the sensor 30, which includes a transducer that has varying electrical characteristics (e.g., capacitance, inductance, impedance, current, voltage, etc.) based on varying physical conditions 114 (e.g., pressure, temperature, biological, chemical, etc.).

The power source circuit 154 is operably coupled to the sensor 30 and, when enabled (e.g., from a control signal from the processing module 42, power is applied, a switch is closed, a reference signal is received, etc.) provides a power signal 158 to the sensor 30. The power source circuit 154 may be a voltage supply circuit (e.g., a battery, a linear regulator, an unregulated DC-to-DC converter, etc.) to produce a voltage-based power signal or a current supply circuit (e.g., a current source circuit, a current mirror circuit, etc.) to produce a current-based power signal. The power source circuit 154 generates the power signal 158 to include a DC (direct current) component and an oscillating component.

When receiving the power signal 158 and when exposed to a condition 114, an electrical characteristic of the sensor affects 160 the power signal. When the change detection circuit 150 is enabled, it detects the affect 160 on the power signal as a result of the electrical characteristic of the sensor 30. The change detection circuit 150 is further operable to generate a signal 120 that is representative of change to the power signal based on the detected effect on the power signal.

The regulation circuit 152, when its enabled, generates regulation signal 156 to regulate the DC component to a desired DC level and/or regulate the oscillating component to a desired oscillating level (e.g., magnitude, phase, and/or frequency) based on the signal 120 that is representative of the change to the power signal. The power source circuit 154 utilizes the regulation signal 156 to keep the power signal at a desired setting 158 regardless of the electrical characteristic of the sensor. In this manner, the amount of regulation is indicative of the affect the electrical characteristic had on the power signal.

In an example, the power source circuit 158 is a DC-DC converter operable to provide a regulated power signal having DC and AC components. The change detection circuit 150 is a comparator and the regulation circuit 152 is a pulse width modulator to produce the regulation signal 156. The comparator compares the power signal 158, which is affected by the sensor, with a reference signal that includes DC and AC components. When the electrical characteristics is at a first level (e.g., a first impedance), the power signal is regulated to provide a voltage and current such that the power signal substantially resembles the reference signal.

When the electrical characteristics changes to a second level (e.g., a second impedance), the change detection circuit 150 detects a change in the DC and/or AC component of the power signal 158 and generates the representative signal 120, which indicates the changes. The regulation circuit 152 detects the change in the representative signal 120 and creates the regulation signal to substantially remove the effect on the power signal. The regulation of the power signal 158 may be done by regulating the magnitude of the DC and/or AC components, by adjusting the frequency of AC component, and/or by adjusting the phase of the AC component.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

Figure 14:
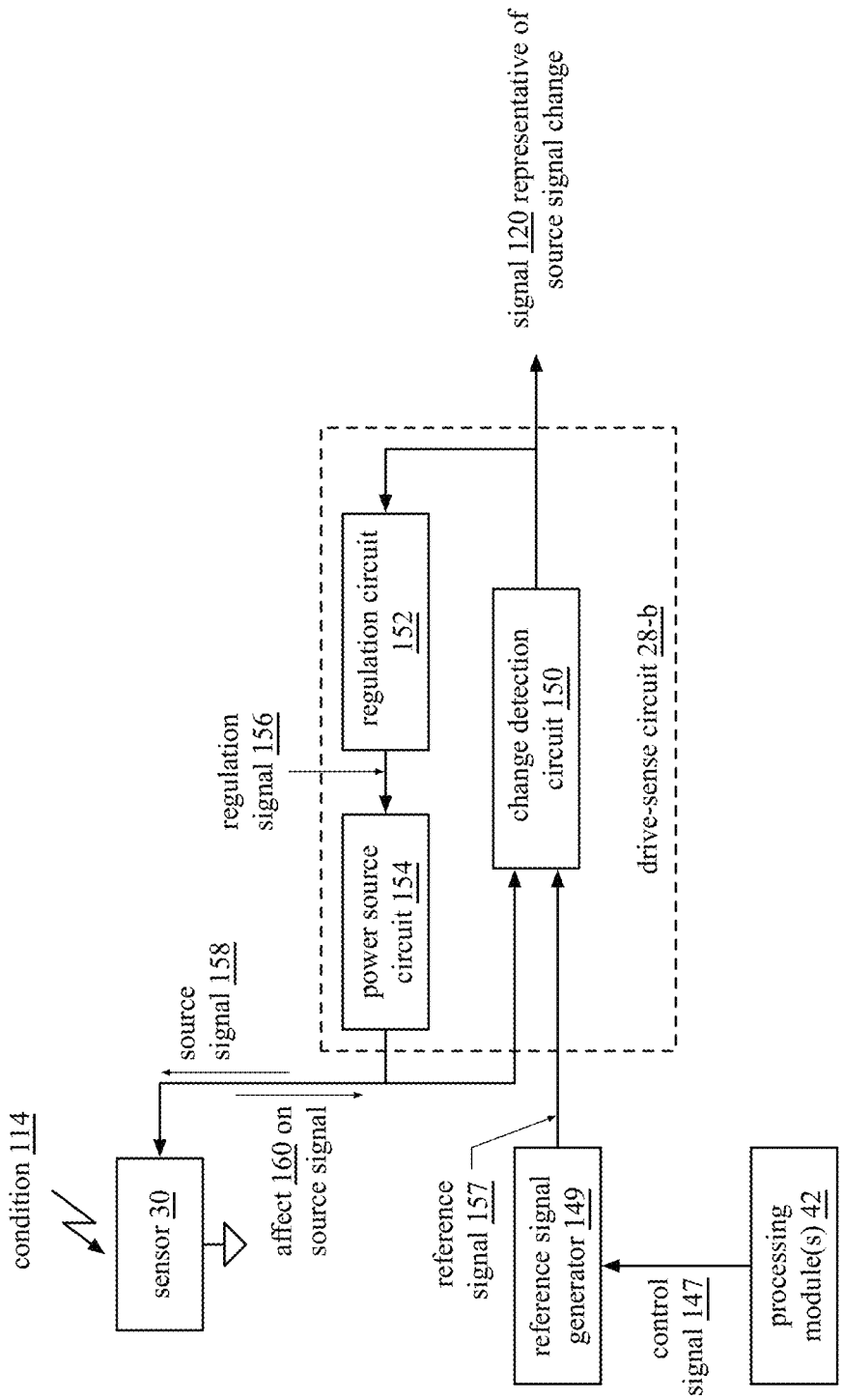
FIG. 14 is a schematic block diagram of another embodiment of a drive sense circuit with a programmable reference signal generator in accordance with the present invention.

FIG. 14 is a schematic block diagram of an embodiment for providing different reference signal waveforms for a drive-sense circuit. The drive-sense circuit 28-b includes power source circuit 154, regulation circuit 152 and change detection circuit 150. Reference signal generator 149 is coupled to change detection circuit 150 in order to provide reference signal 157. Change detection circuit 150 also receives an affect 160 of source signal 158 that is caused by sensor 30. The drive sense circuit functions to create a signal 120 that is representative of the affect the changes to the sensor 30 have on the source signal 158. The signal 120 is subsequently processed to interpret the changes of the sensor to determine conditions to which the sensor is exposed.

Depending on the environment of the sensor, the type of sensor, and/or the data desired from the sensor, different refinements to stimulating and gathering data from the sensor may be desired. For example, if binary data is needed from the sensor (e.g., it's on or off, the condition its sensing is either "a" or "b", etc.), then the sensitivity, linearity, and/or resolution are less significant factors. Thus, the processing module can program the reference signal generator 149 to produce a reference signal 157 that is good for detecting binary data with less regard for sensitivity, linearity, and/or resolution of the sensed data.

As another example, when the data from the sensor is more granular than binary data (e.g., multi-bit data, phase shift data, frequency shift data, etc.), then the sensitivity (e.g., signal to noise ratio, signal level, etc.), linearity (e.g., substantially linear spacing between interpretations of data values), and/or resolution (e.g., amount of change in the sensor as it corresponds to a different value of a measured condition) of the sensed data becomes more significant. Accordingly, the processing module 42 can program the reference signal generator 149 to produce a reference signal 157 that enables the drive sense circuit to obtain a desired level of sensitivity, linearity, and/or resolution for the sensed data.

In an example of operation, the processing module 42 programs the reference signal generator 149 via one or more control signals 147 to output one of a plurality of reference signals 157. The processing module generates the control signal(s) 147 based on sensing factors of sensor 30, which correlates to a desired level(s) of sensitivity, linearity, and/or resolution. In an embodiment, as the operating environment changes for sensor 30, the processing module changes the waveform of reference signal 157. The drive sense circuit 28 adjusts its operation to regulate the source signal 158 to substantially match the adjusted reference signal 157.

The sensing factors include one or more of correlated and uncorrelated noise, sensor linearity, sensor sensitivity attributes (such as sensor sensitivity granularity), type of data being gathered (e.g., the presence of moisture (such as a wet finger on a capacitive touch screen sensor), a change in atmosphere, (such as the relative components of air exposed to sensor 30), humidity, etc.) degradation of the sensor 30 over time, etc. Sensing factors can vary based on a sensing environment and/or type of sensing by sensor 30. For example, if sensor 30 is associated with a touch screen, a sensing factor is sensing the presence or absence of finger capacitance, and/or the presence or absence of a pen capacitance.

As a further example, a sensing factor can change when a user initiates use of a pen or use of a finger for touch sensing to provide more granular information such as pressure, speed of movement, orientation of the finger or pen. In another example, noise attributes can be important when sensor 30 is sensing pressure, accordingly a change in noise can have an impact on the accuracy of the pressure determination and is, therefor a useful sense factor. Additional factors, such as the linearity associated with sensor 30 over its range will be a consideration that can be used to influence reference signal 157 from reference signal generator 149.

Drive-sense circuit 28-b can also be coupled to multiple sensors and incorporate multiple combinations of reference signals 157 from reference signal generator 149 to enable drive-sense circuit 28-b to sense and/or accommodate differing conditions for sensors 30. In an example, processing module(s) 42 generate control signals 147 that cause the reference signal generator 149 to generate a plurality of reference signals 157; one for each sensing factor associated with one or more sensors. For example, a reference signal for detecting the presence or absence for each of a plurality of sensing factors and/or the level of each of the plurality of sensing factors. In another example, a single sensor 30 may be sensed with a plurality of reference signals, allowing the drive sense circuit to obtain different levels of information and/or different information from a sensor. In an example, processing module 42 generates a time and/or frequency divided control signal 147 to enable to the drive-sense circuit to accomplish multiple objectives. In another example, multiple sensors 30 are coupled to drive-sense circuit 28-b in a time and/or frequency divided manner.

Figure 15:
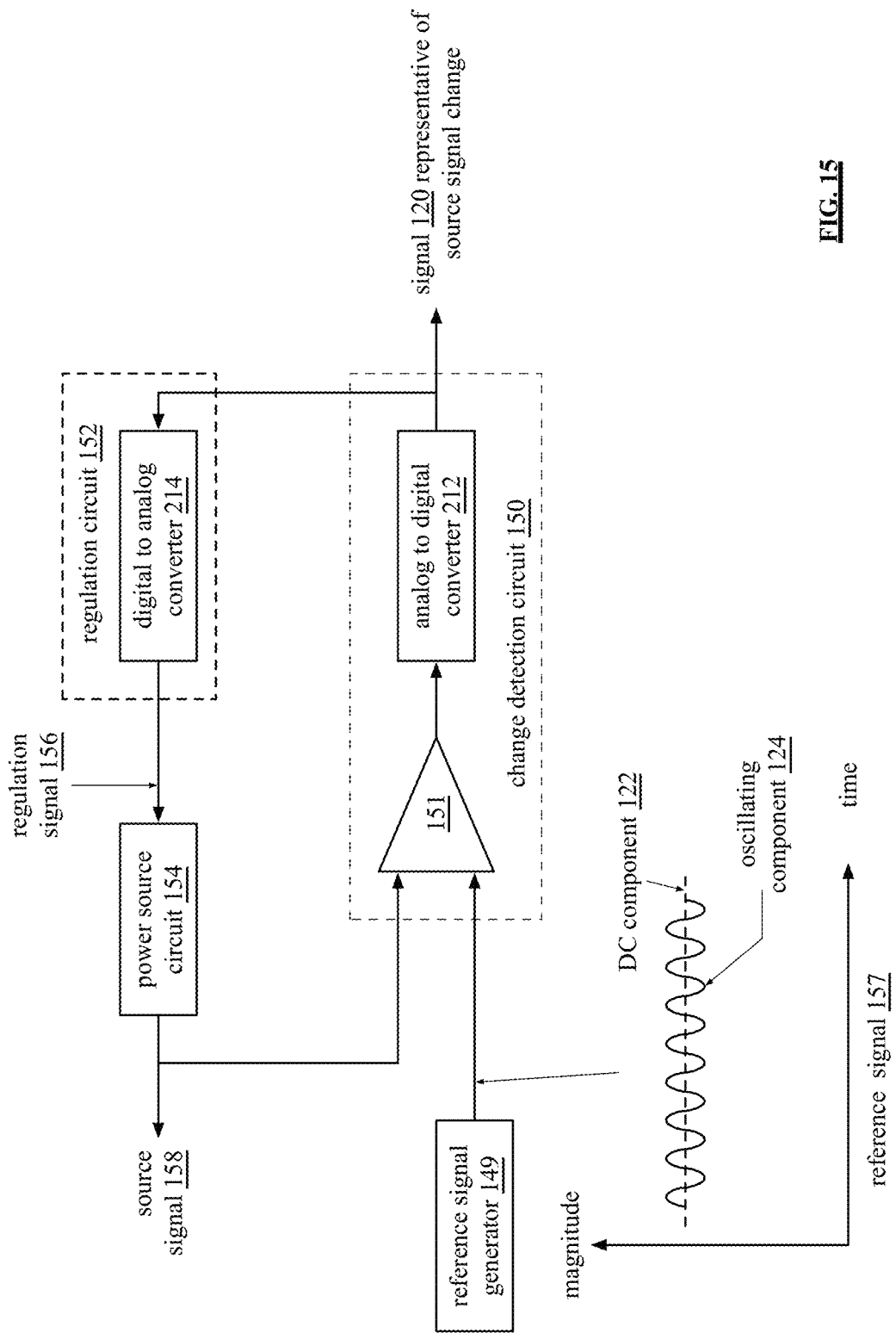
FIG. 15 is a schematic block diagram of an example of a drive sense circuit with a programmed reference signal generator in accordance with the present invention.

FIG. 15 is a schematic block diagram of an embodiment for providing a reference signal waveform for a drive-sense circuit. In an example, a sinusoidal waveform, such as oscillating component 124 is generated by reference signal generator 149, which is coupled to change detection circuit 150. Reference signal generator 149 can be a phase-locked loop (PLL) a crystal oscillator, a digital frequency synthesizer, and/or any other signal source that can provide a sinusoidal signal of desired frequency, phase shift, and/or magnitude.

In general, a power source circuit 154 produces a source signal 158 that is regulated to substantially match the sinusoidal reference signal 157. For example, the sinusoidal signal generated by reference signal generator 149 is useful when sensor 30 (such as from FIG. 14) is one of a plurality of sensors sensing capacitance changes of a touch screen display. In such an environment, the use of a sinusoidal reference signal is readily generating and also does not introduce harmonics that may adversely affect the operation of the drive sense circuit, the touch screen operation of the display, and/or the display operation of the display.

The output of power source circuit 154 (source signal 158) and reference signal generator output (such as reference signal 157 of FIG. 14) are coupled to the inputs of Op-amp 151, the output of which is coupled to analog to digital converter (ADC) 212. Signal 120, which represents the source signal change is output by ADC 212 which output is also input to regulation circuit 152 and converted by digital to analog converter (DAC) 214; the output of regulation circuit 152 is coupled to power source circuit 154 to provide regulation signal 156 to power source circuit 154.

Figure 16:
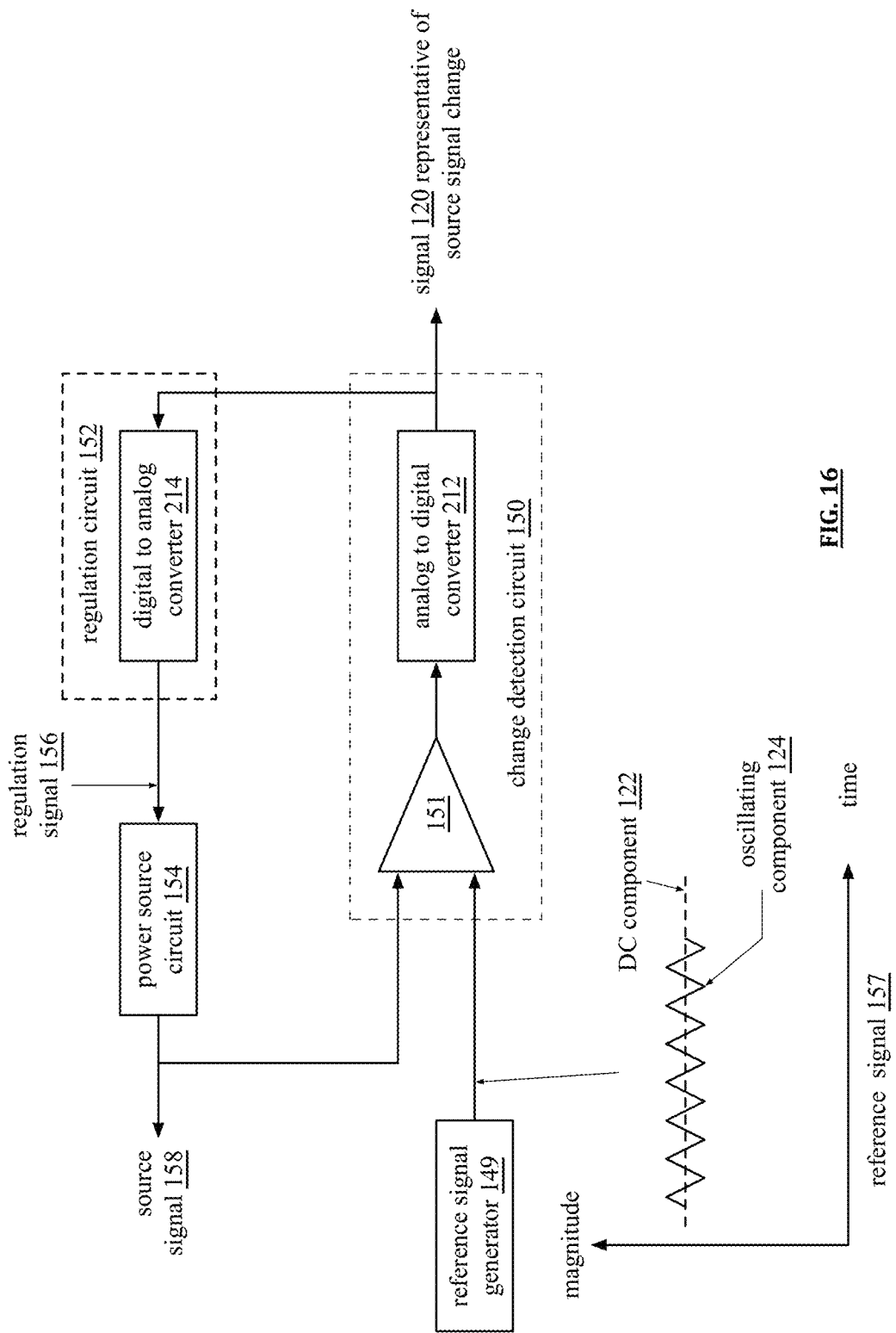
FIG. 16 is a schematic block diagram of another example of a drive sense circuit with a programmed reference signal generator in accordance with the present invention.

The sinusoidal signal generated by reference signal generator 149 of FIG. 14 is non-linear signal and therefore has non-linear resolution. FIG. 16 is a schematic block diagram of another embodiment for providing a reference signal waveform for a drive-sense circuit. In this embodiment, the reference signal generator 149 generates a triangular waveform. The triangle wave is a periodic, piecewise linear, a continuous real function that contains only odd harmonics and can be generated by using the convolution property of Fourier transforms to provide better resolution with a linear waveform.

A reference signal 157 having a triangular waveform is beneficial when the drive sense circuit is measuring more than binary granularity data of the sensor. For example, of the sensor is detecting humidity, a humidity value is one of a plurality of potential values. With a triangular waveform, sensed values of humidity are more equally spaced in comparison to a sinusoidal waveform, thus providing better sensitivity and/or resolution when interpreting the sensed value to obtain a humidity value.

Figure 17:
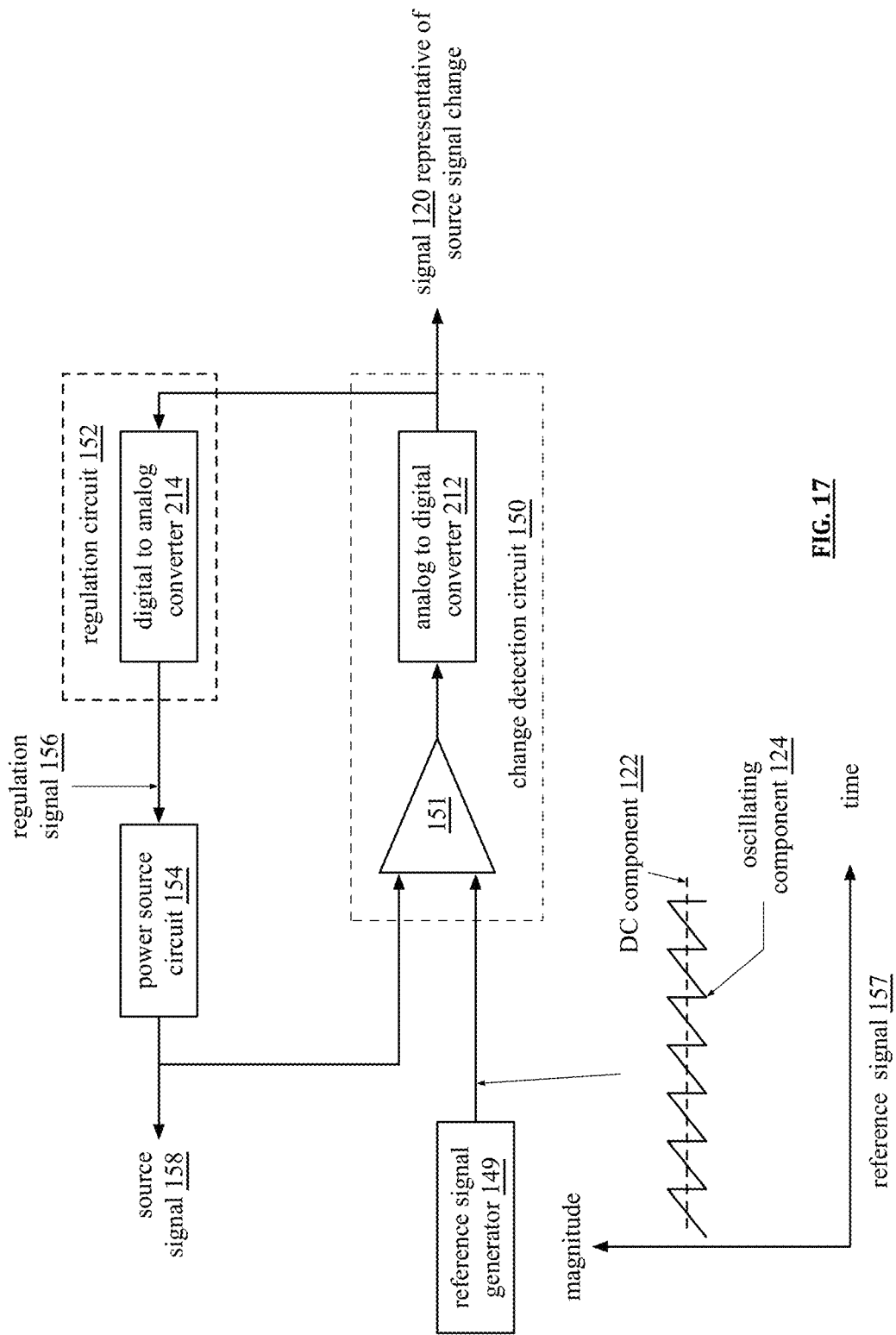
FIG. 17 is a schematic block diagram of another example of a drive sense circuit with a programmed reference signal generator in accordance with the present invention.

FIG. 17 is a schematic block diagram of another embodiment for providing a reference signal waveform for a drive-sense circuit. Reference signal generator 149 generates a sawtooth waveform, which is another form of non-sinusoidal waveform illustrated in FIG. 16. The sawtooth waveform, which can be considered an asymmetric triangle wave form, is similarly linear and is relatively easy to generate and provides relatively higher resolution and/or sensitivity than a sinusoidal signal.

Figure 18:
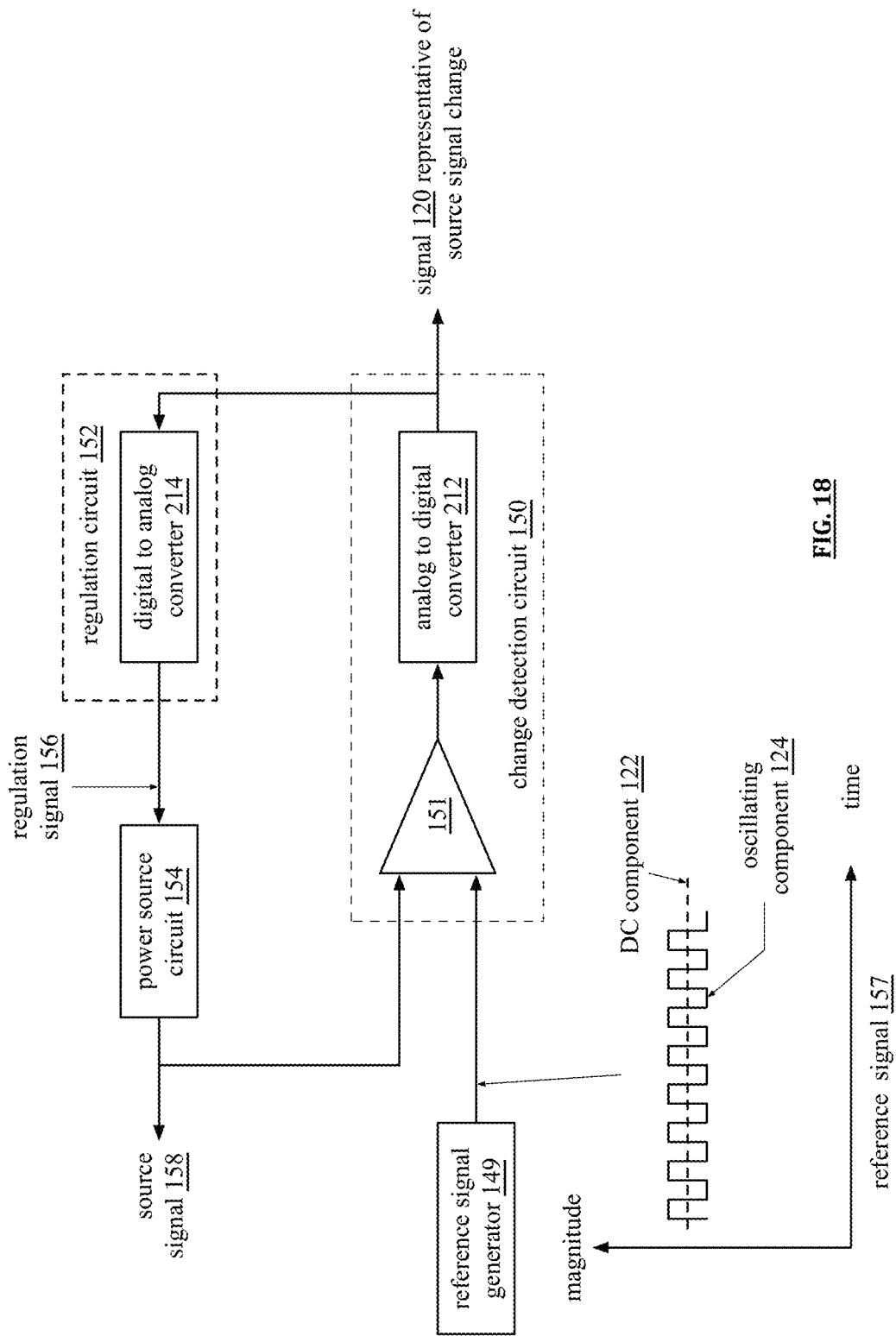
FIG. 18 is a schematic block diagram of another example of a drive sense circuit with a programmed reference signal generator in accordance with the present invention.

FIG. 18 is a schematic block diagram of another embodiment for providing a reference signal waveform for a drive-sense circuit. Reference signal generator 149 generates a square-wave signal, which is another form of the non-sinusoidal waveform illustrated in FIG. 16. With the square-wave waveform, amplitude alternates at a steady frequency between fixed minimum and maximum values, with the same duration at minimum and maximum. The square-wave waveform has linear resolution and is also relatively easy to generate.

For example, a square wave reference signal is beneficial when the drive sense circuit is measuring phase responses of the sensor 30. With each transition of the square wave, the sensor's electrical characteristics will likely product a phase shift. As a specific example, when the sensor has a capacitor component, the voltage of a capacitor cannot instantaneously change, but the capacitor's current can. This difference produces a phase shift that causes a transient adjustment to the source signal. The signal 120 represents the transient adjustment, which can subsequently be interpreted to determine a phase shift.

Figure 19:
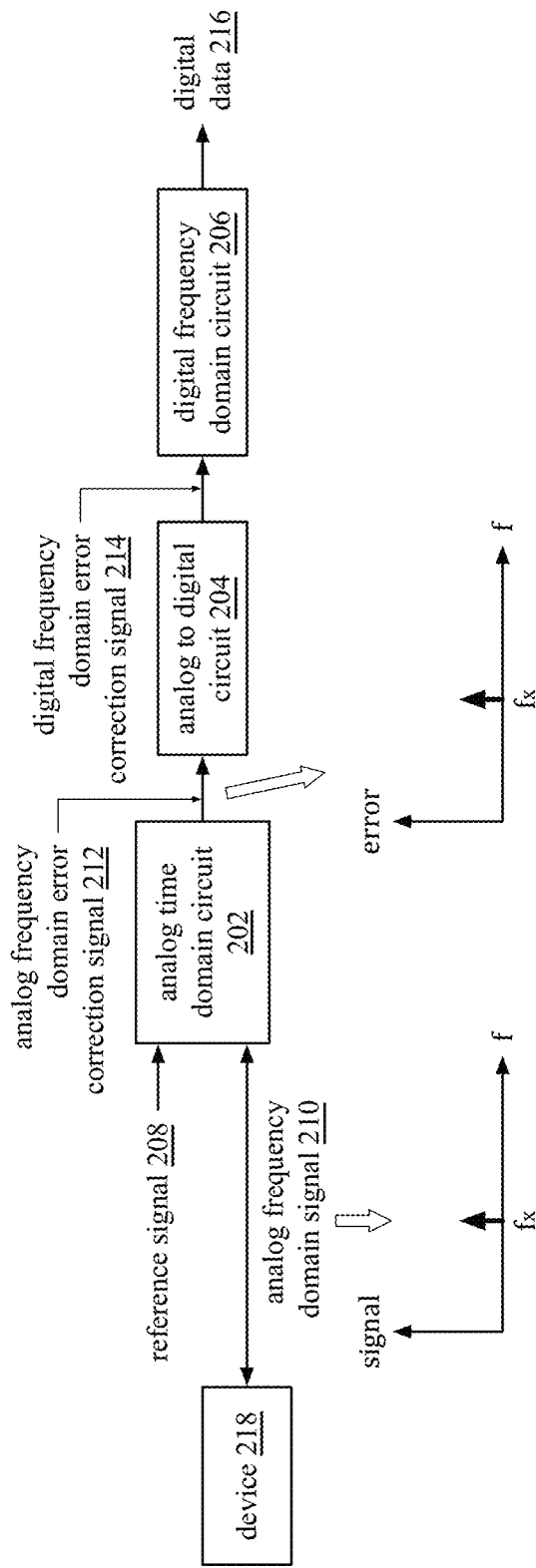
FIG. 19 is a schematic block diagram of an embodiment of a data sensing circuit in accordance with the present invention.

FIG. 19 is a schematic block diagram of an embodiment of a data sensing circuit 200 that includes an analog time domain circuit 202, an analog to digital circuit 204, and a digital frequency domain circuit 206. The data sensing circuit 200 operates in the time domain on information that is in the frequency domain. In general, the data sensing circuit 200 generates digital data 216 based on an analog frequency domain signal 210 (e.g., an analog signal with data in the frequency domain) and a reference signal 208. The resulting digital data 216 may be the desired output data or may require further processing to obtain the desired data output.

In an example of operation, the analog time domain circuit 202 outputs a signal component of the analog frequency domain signal 210 to a device 218. The analog time domain circuit 202 includes a regulated source circuit to generate the signal component. In one embodiment, the regulated source circuit is a dependent current source that is regulated to a specific current value based on the reference signal 208. In another embodiment, the regulated source circuit is a voltage circuit (e.g., a linear regulator, a DC-DC converter, a battery, etc.) that generates a regulated voltage based on the reference signal 208.

The device 218 alters the signal component to produce the analog frequency domain signal 210, where the altering of the signal component at a particular rate to represent input data. The inverse of the data rate corresponds to the frequency of the analog frequency domain signal 210; thus, the signal in the analog domain and the data is in the frequency domain. As an example, the signal component produced by the analog time domain circuit 202 is a DC voltage (e.g., 0.25 volts to 5 volts or more), which corresponds to the reference signal 208. The device 218 alters the signal component by varying the loading on the signal component to affect the voltage and/or current of the signal component thereby created the analog frequency domain signal 210 (e.g., the signal component plus the effects of altering).

As a specific example, the device 218 changes its resistance at a particular rate (e.g., 10 Hz to 100 MHz or more) to represent the input data. An increase in resistance decreases voltage for a constant current, decreases current for a constant voltage, or decreases both voltage and current of the signal component. A decrease in resistance increases the voltage for a constant current, increases the current for a constant voltage, or increases both voltage and current of the signal component. The increasing and decreasing of the resistance of the device at the particular rate is representative of the input data. The number of different resistance levels corresponds to the data level, where N equals the number of unique data values per cycle of the data rate, where N is an integer of 2 or more. For instance, when N=2, there are two data levels (e.g., a logic "0" for a first resistance and a logic "1" for a second resistance) and when N=10, there are ten data levels (e.g., 0 through 9).

As another example of producing the analog frequency domain signal 210, the signal component produced by the analog time domain circuit 202 includes an oscillating component (e.g., a sine wave, a triangular wave, square wave, saw-tooth wave, etc. with a peak to peak voltage of a few millivolts to 5 volts or more having a frequency of a 100 Hz to 1 MHz or more), which corresponds to the reference signal 208. In this example, the device changes its impedance (e.g., capacitance, inductance, and/or resistance) at a particular rate (e.g., fx of 10 Hz to 100 MHz or more) to represent the input data. An increase in impedance decreases voltage for a constant current, decreases current for a constant voltage, or decreases both voltage and current of the signal component. A decrease in impedance increases the voltage for a constant current, increases the current for a constant voltage, or increases both voltage and current of the signal component. The increasing and decreasing of the impedance of the device at the particular rate is representative of the input data.

Continuing with the example of operation, the analog time domain circuit 202 uses the reference signal 208 in comparison to the analog frequency domain signal 210 to create an analog frequency domain error correction signal 212. The analog frequency domain error correction signal 212 is representative of the error correction needed to keep the signal component and hence the analog frequency domain signal 210 substantially matching the reference signal. The error correction is representative of the frequency domain data that is embedded in the altering of the signal component.

The analog to digital circuit 204 (e.g., an "n"-bit analog to digital converter, where n is an integer equal to or greater than 1) converts the analog frequency domain error correction signal 212 into a digital frequency domain error correction signal 214. The error correction, which is representative of the frequency domain data, is substantially preserved in the digital domain.

The digital frequency domain circuit 206 operates in the frequency domain to recover the digital data 216. For example, the digital frequency domain circuit 206 includes one or more finite impulse response (FIR) filters, one or more cascaded integrated comb (CIC) filters, one or more infinite impulse response (FIR) filters, one or more decimation stages, one or more fast Fourier transform (FFT) filters, and/or one or more discrete Fourier transform (DFT) filters.

Figure 20:
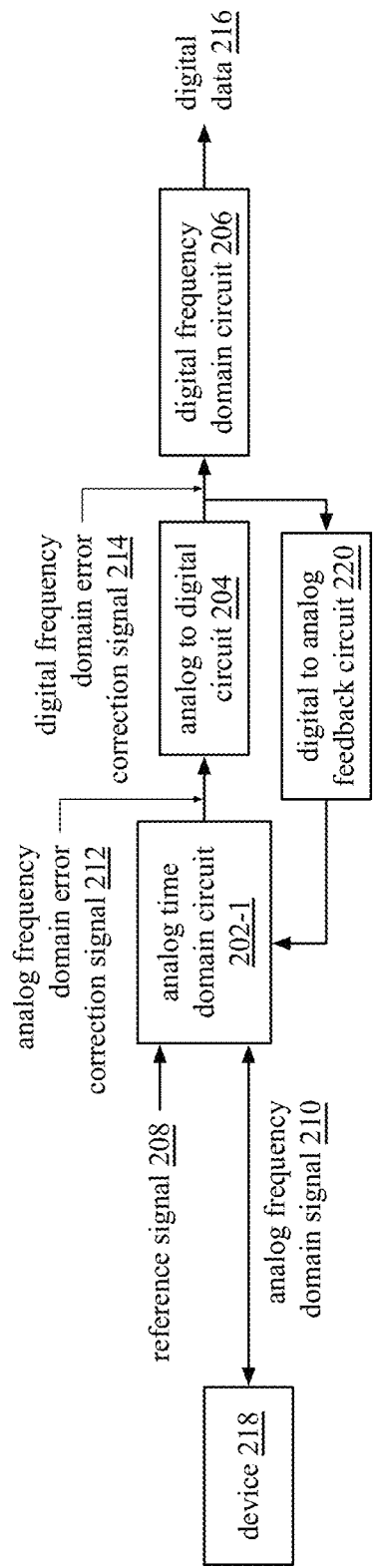
FIG. 20 is a schematic block diagram of another embodiment of a data sensing circuit in accordance with the present invention.

FIG. 20 is a schematic block diagram of another embodiment of a data sensing circuit 200 that includes an analog time domain circuit 202-1, an analog to digital circuit 204, a digital frequency domain circuit 206; and a digital to analog feedback circuit 220. This data sensing circuit 200 operates similarly to the data sensing circuit 200 of FIG. 10 with the following differences. The feedback for regulating the signal component via the regulated source circuit within the analog time domain circuit 201-1 is from the digital to analog feedback circuit 220 (e.g., an "n"-bit digital to analog converter, when n is an integer equal to or greater than 1).

Figure 21:
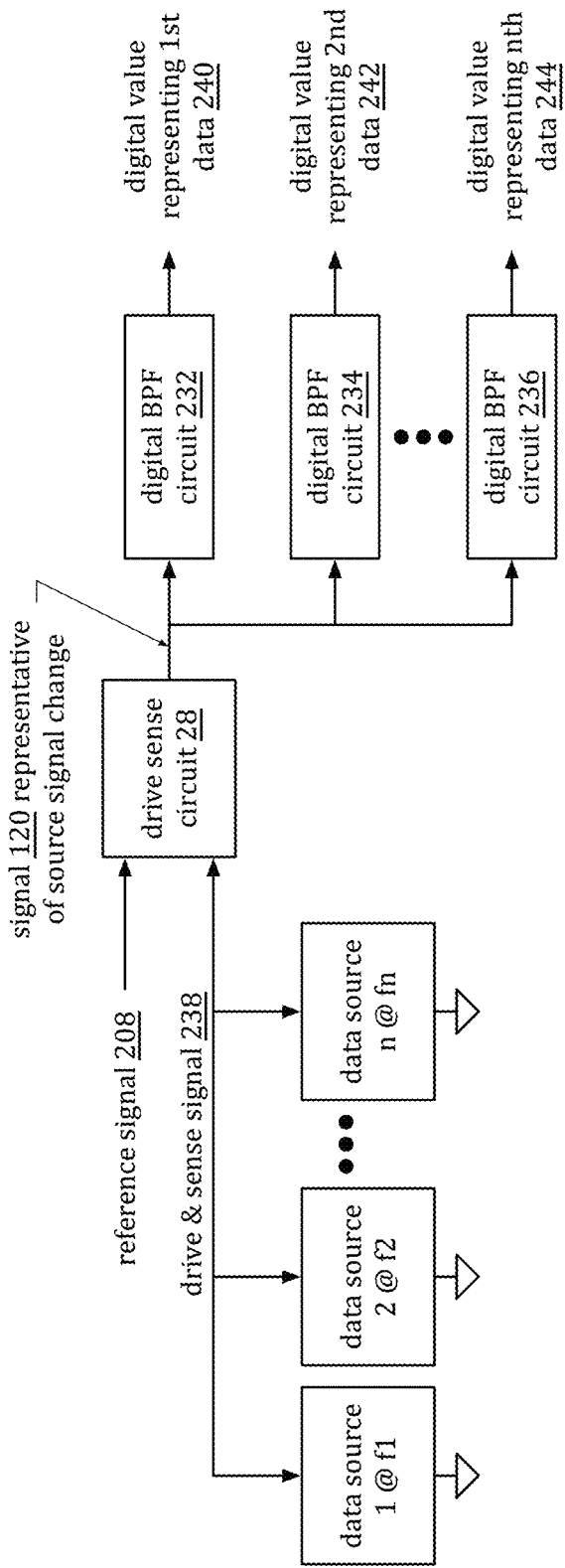
FIG. 21 is a schematic block diagram of an embodiment of a data circuit in accordance with the present invention.

FIG. 21 is a schematic block diagram of another embodiment of a data circuit 230 that includes a drive sense circuit 28, a plurality of digital bandpass filters (BPF) circuits 232-236, and a plurality of data sources (1 through n). The drive sense circuit 28 produces a drive signal component of a drive & sense signal 238 (e.g., the drive part of signal 238) based on the reference signal 208 as previously discussed. The data sources operate at different frequencies to embed frequency domain data into the drive & sense signal 238 (e.g., the sense part of signal 238). Each of the data sources operates similarly to the device 218 of FIG. 10 to embed the data into the signal 238 by varying the loading on the drive component of signal 238.

In an example of operation, data source 1 alters the drive signal component of the drive & sense signal 238 at a first frequency f1; data source 2 alters the drive signal component of the drive & sense signal 238 at a second frequency f2; and data source n alters the drive signal component of the drive & sense signal 238 at an "nth" frequency fn. The drive sense circuit 28 regulates the drive & sense signal 238 to substantially match the reference signal 208, which may be similar to reference signal 157 of one or more of FIGS. 14-18.

The drive sense circuit 28 outputs a signal 120 that is representative of changes to the drive & sense signal 238 based on the regulation of the drive & sense signal 238. Each of the digital BPF circuits 232 receives the signal 120 and is tuned to extract data therefrom corresponding to one of the data sources. For example, digital BPF circuit 232 is tuned to extract the data at frequency f1 of the data source 1 to produce one or more digital values representing the first data 240. The second digital BPF circuit 234 is tuned to extract the data at frequency f2 of the data source 2 to produce one or more digital values representing the second data 242. The nth digital BPF circuit 236 is tuned to extract the data at frequency fn of the data source n to produce one or more digital values representing the nth data 244. Each of the digital BPF circuits 232-236 includes one or more finite impulse response (FIR) filters, one or more cascaded integrated comb (CIC) filters, one or more infinite impulse response (FIR) filters, one or more decimation stages, one or more fast Fourier transform (FFT) filters, and/or one or more discrete Fourier transform (DFT) filters.

FIG. 22 is a schematic block diagram of an embodiment of a data communication circuit 101 that includes a drive circuit 103, a variable circuit 105, and a drive sense circuit 107. The drive circuit 103 may be implemented in a variety of ways. For example, the drive circuit includes one or more of an operational amplifier (op-amp), a comparator, a level shift circuit, another drive sense circuit, a digital to analog converter, a modulator, an encoder, etc. The variable circuit 105 may be implemented via one or more electrical components having one or more variable electrical characteristics (e.g., resistance, reactance, impedance, voltage, current, capacitance, inductance, etc.) examples of which are discussed in FIGS. 23-26B.

In an example of operation, the drive sense circuit 28 (which may be implemented as previously discussed) generates a source signal 113 that powers the variable circuit 105. The variable circuit 105 varies loading on the source signal 113 based on a drive signal 111 received from the drive circuit 103. For example, the variable circuit changes an electrical characteristic in accordance with the drive signal 111 to vary the loading on the source signal.

As a particular example, the variable circuit is a variable capacitor and varies its capacitance based on the drive signal. With the drive signal 111 at a particular frequency, the impedance of the capacitor is changing based on the drive signal. The drive sense circuit 28 detects the impedance change as a variance in the load on the source signal 113. The drive sense circuit 28 includes a closed loop feedback to regulate the source signal 113; the amount of regulation is indicative of the change in impedance.

The drive circuit 103 generates the drive signal 111 based on the input data 109. For example, the data input 109 is a binary stream of data at a given bit rate, where frequency of the drive signal 109 equals one over the bit rate. The drive circuit 103 converts the binary stream of data into the drive signal where a logic "0" of the binary bit stream is represented by a first magnitude and/or phase of the drive signal and a logic "1" of the binary bit stream is represented by a second magnitude and/or phase of the drive signal. Thus, the magnitude and/or phase of the drive signal toggles between the first level and the second level in accordance with the binary values of the binary but stream.

As another example, the input data 109 is a multiple-bit digital value (e.g., three bits or more) that is received at a data rate. As a specific example, the input data is a 4-bit word having 16 possible values. The drive circuit 103 converts each 4-bit word of the input data into one of sixteen magnitudes and/or phases based on the specific value of the 4-bit word to produce the drive signal 111. Thus, the magnitude and/or phase of the drive signal 111 varies between one of sixteen levels based on the specific value of a 4-bit word and the frequency of the drive signal corresponds to one over the data rate.

As yet another example, the input data 109 is again a multiple-bit digital value (e.g., three bits or more) that is received at a data rate. In this example, the drive circuit 103 converts a multiple-bit word of the input data into a number of single-bit words (e.g., creates a binary stream). As a specific example, a multiple-bit word includes 8 bits, which the drive circuit converts into eight 1-bit words. One 1-bit word for each bit in the 8-bit word. As such, the drive signal includes eight binary values for each 8-bit word of the input data. Accordingly, the magnitude and/or phase of the drive signal toggles between the first level and the second level in accordance with the binary values of the binary but stream and the frequency of the drive signal corresponds to one over eight times the data rate of the 8-bit word.

As a further example, the drive circuit 103 modulates the input data 109 in accordance with one or more modulation protocols (e.g., amplitude modulation (AM), amplitude shift keying (ASK), pulse width modulation (PWM), phase shift keying (PSK), quadrature PSK (QPSK), etc.) to produce one or more modulated signals. As a specific example, the drive circuit uses one or more modulation protocols to produce a modulated signal using a single carrier frequency (e.g., f1). As another specific example, the drive circuit 103 uses one or more modulation protocols to produce two modulates signals using two carrier frequencies (e.g., f1 and f2).

The drive circuit 103 provides the drive signal 111 to the variable circuit 105, which changes one or more electrical characteristics (e.g., impedance, voltage, current, resistance, reactance, phase, etc.) of the variable circuit 105. The change in electrical characteristics of the variable circuit 105 affects the source signal 113 by changing the loading on the drive sense circuit 107. The drive sense circuit 107 interprets the effect on the source signal 113 to determine the changing electrical characteristic(s) of the variable circuit 105. The changing electrical characteristic(s) of the variable circuit 105 can be subsequently interpreted as discussed herein to recover the data input 109.

FIGS. 23-26B are schematic block diagrams of examples of variable circuit 105. While FIGS. 23-26B depict individual electrical components operating as a variable circuit 105, variable circuit 105 may include one or more, or a combination of, the electricals components of FIGS. 23-26B depending on the nature of data (e.g., word size, data rate, etc.) the data communication circuit 101 is to receive.

In FIG. 23, the variable circuit 105 is a variable resistor receiving a drive signal at a frequency "f1." In an embodiment, the variable resistor includes one or more rheostats. The drive signal is an input to the rheostat(s) that adjusts its resistance. In another embodiment, the variable resistor includes a switching resistor network, where the switching resistor network couples, based on the drive signal 111, resistors of the resistor network in parallel and/or in series to produce desired resistance values.

In FIG. 24, the variable circuit 105 is a variable capacitor receiving a drive signal at a frequency "f2." In an embodiment, the variable capacitor includes one or more varactors. The drive signal is an input to the varactor(s) that adjusts its capacitance. In another embodiment, the variable capacitance includes a switching capacitance network, where the switching capacitance network couples, based on the drive signal 111, capacitors of the capacitor network in parallel and/or in series to produce desired capacitance values.

In FIG. 25, the variable circuit 105 is a variable inductor receiving a drive signal at a frequency "f3." In another embodiment, the variable capacitance includes a switching inductor network, where the switching inductor network couples, based on the drive signal 111, inductors of the inductor network in parallel and/or in series to produce desired inductance values.

In FIG. 26A, the variable circuit 105 is a transistor receiving a drive signal at a frequency "fn." In an embodiment, the transistor is a field effect transistor (FET) that varies the loading on the source signal 113 based on the drive signal 111 being applied to the gate-source of the FET. The drive signal 111 is within a range to keep the FET operating in the gain mode (e.g., in a linear mode prior to being fully turned on) and to avoid saturating the FET (e.g., avoid turning it fully on). In another embodiment, the variable circuit 105 includes a plurality of transistors coupled in series and/or in parallel. In the embodiment, the drive signal includes a plurality of components; one for each transistor.

With a transistor(s), the input signal can contain multiple frequency components representative of the input data 109. For example, in FIG. 26B, the variable circuit 105 is a transistor receiving a drive signal that includes two frequency components: one at frequency "f1" and the other at frequency "f2." As such, for a given word of the input data, a portion of the word is represented by the first frequency f1 and another portion of the word is represented by the second frequency f2.

FIG. 27 is a schematic block diagram of another embodiment of a data circuit 250 that includes a plurality of drive circuits 203, a plurality of variable circuits 205, and a drive sense circuit 28. A first drive circuit 203 drives a first variable circuit 205 with first input data 256 at a first frequency f1 and a second drive circuit 203 drives a second variable circuit 205 with second input data 256 at a second frequency f2. The variable circuits varying the loading on the drive & sense signal 252 based on the respective drive signals.

The drive sense circuit 28 regulates the drive & sense circuit 252 to substantially match the reference signal 254, which includes a DC component and/or an oscillating component. In accordance with the regulation, the drive sense circuit 28 produces a signal 120 that represents changes to the drive & sense signal. In this example, the signal 120 includes components at frequencies f1 and f2, which represent error correction corresponding to the two data inputs 256 and 258.

FIG. 28 is a schematic block diagram of another embodiment of a data sensing circuit of a touch screen display that includes a first drive sense circuit 28-1 coupled to a first electrode 85-c and a second drive sense circuit 28-2 coupled to a second electrode 85-r without a touch proximal to the electrodes. Each of the drive sense circuits include a comparator, an analog to digital converter (ADC) 130, a digital to analog converter (DAC) 132, a signal source circuit 133, and a driver. For additional embodiments of a drive sense circuit see pending patent application entitled, "Drive Sense Circuit with Drive-Sense Line" having a filing date of Aug. 27, 2018, and an application number of Ser. No. 16/113,379.

As an example, a first reference signal 122-1 (e.g., analog or digital) is provided to the first drive sense circuit 28-1 and a second reference signal 122-2 (e.g., analog or digital) is provided to the second drive sense circuit 28-2. The first reference signal includes a DC component and/or an oscillating at frequency $f_1$. The second reference signal includes a DC component and/or two oscillating components: the first at frequency $f_1$ and the second at frequency $f_2$.

The first drive sense circuit 28-1 generates a sensor signal 116 based on the reference signal 122-1 and provides the sensor signal to the column electrode 85-c. The second drive sense circuit generates another sensor signal 116 based on the reference signal 122-2 and provides the sensor signal to the column electrode.

In response to the sensor signals being applied to the electrodes, the first drive sense circuit 28-1 generates a first sensed signal 120-1, which includes a component at frequency $f_1$ and a component a frequency $f_2$. The component at frequency $f_1$ corresponds to the self-capacitance of the column electrode 85-c and the component a frequency $f_2$ corresponds to the mutual capacitance between the row and column electrodes 85-c and 85-r. The self-capacitance is expressed as $1/(2\pi f_1 C_{p1})$ and the mutual capacitance is expressed as $1/(2\pi f_2 C_{m\_0})$.

Also, in response to the sensor signals being applied to the electrodes, the second drive sense circuit 28-1 generates a second sensed signal 120-2, which includes a component at frequency $f_1$ and a component a frequency $f_2$. The component at frequency $f_1$ corresponds to a shielded self-capacitance of the row electrode 85-r and the component a frequency $f_2$ corresponds to an unshielded self-capacitance of the row electrode 85-r. The shielded self-capacitance of the row electrode is expressed as $1/(2\pi f_2 C_{p2})$ and the unshielded self-capacitance of the row electrode is expressed as $1/(2\pi f_2 C_{p2})$.

With each active drive sense circuit using the same frequency for self-capacitance (e.g., $f_1$), the row and column electrodes are at the same potential, which substantially eliminates cross-coupling between the electrodes. This provides a shielded (i.e., low noise) self-capacitance measurement for the active drive sense circuits. In this example, with the second drive sense circuit transmitting the second frequency component, it has a second frequency component in its sensed signal, but is primarily based on the row electrode's self-capacitance with some cross coupling from other electrodes carrying signals at different frequencies. The cross coupling of signals at other frequencies injects unwanted noise into this self-capacitance measurement and hence it is referred to as unshielded.

FIG. 29 is a schematic block diagram of a programmable sensing system 151 that includes one or more processing modules 42, a drive-sense circuit (DSC) array 141, a coupling network 145, a sensor array 143, and a programmable reference signal unit 147. The DSC array 141 includes a plurality of drive sense circuits (e.g., drive sense circuit 28 of one or more other figures of this patent application). The sensor array 143 includes a plurality of sensors 30 and/or a plurality of actuators 32. The sensors and/or actuators of the sensor array 143 may be affiliated with a single device (e.g., a touch screen, a touch screen display, an interactive white board, etc.), with a plurality of devices (e.g., various equipment of a manufacturing facility), or distributed throughout a geographic area to monitor a variety of conditions (e.g., temperature, humidity, atmospheric pressure, etc.).

The programmable reference signal unit 153 may be implemented in a variety of ways. For example, the programmable reference signal unit 153 includes a plurality of selectable signal generators; each operable to generate a different reference signal (e.g., different waveform, different frequency, different amplitude(s), etc.). The processing module enables one or more of the selectable signal generates based on the reference signals it wants generated. Another example of the programmable reference signal unit 153 will be discussed with reference to FIG. 31B. Yet another example of the reference signal unit 153 will be discussed with reference to FIGS. 32A and 32B.

Since the drive sense circuit using a single line to supply power to and sense a sensor, the coupling network 145 includes connections to support the single line connections between one or more drive sense circuits and one or more sensors or actuators. The coupling network 145 may be implemented in a variety of ways. For example, the coupling network 145 includes a switching network (e.g., a crossbar switch, cross-point switch, matrix switch, etc.) that allows any one of the drive sense circuits of the DSC array 141 to be coupled to any sensor or actuator of the sensor array 143. As another example, the coupling network 145 includes a plurality of connections and a plurality of switches (e.g., transistors, relays, etc.) coupling the drive sense circuits to the sensors and/or actuators. The processing module "opens" or "closes" the switches to enable the desired coupling between desired drive sense circuits and desired sensors and/or actuators. Yet another example of the coupling network will be discussed with reference to FIG. 31A.

In an embodiment, the processing module(s) 42, the drive-sense circuit (DSC) array 141, the coupling network 145, and the programmable reference signal unit 147 of the programmable sensing system 151 are implemented on one or more dies of an integrated circuit (IC). In another embodiment, the drive-sense circuit (DSC) array 141, the coupling network 145, and the programmable reference signal unit 147 of the programmable sensing system 151 are implemented on one or more dies of an integrated circuit (IC). In yet another embodiment, processing module(s) 42, the drive-sense circuit (DSC) array 141, the coupling network 145, at least one sensor or actuator of the sensor array 143, and the programmable reference signal unit 147 are implemented on one or more dies of an integrated circuit (IC).

In an example, the programmable reference signal unit 147 generates a separate reference signal (such as reference signal 157 from FIG. 14) to each desired drive-sense circuit in drive-sense circuit array 141 based on the desired operation of the programmable sensing system 151 and/or as the operating conditions of the system 151 changes. For example, the desired operation includes providing touch screen sensing for indoor conditions (e.g., temperature, ambient lighting, humidity, etc.). As a further example, when the touch screen is taken outside, the environment changes (e.g., temperature changes, ambient lighting changes, humidity changes, etc.). As a result of the environmental changes, the operating conditions are changed (e.g., change one or more reference signals (e.g., frequency, amplitude, shape, phase, etc.), using more sensors, use less sensors, coupling multiple drive sense circuits to a sensor to obtain different information from the sensor, create a multiple frequency reference signal for a drive sense circuit to obtain different information from a sensor, etc.).

FIG. 30 is a schematic block diagram of a programmable sensing system 151-1 that includes a digital filter circuit array 139, the processing module(s) 42, the drive-sense circuit (DSC) array 141, the coupling network 145, the sensor array 143, a second coupling network 149, and a programmable reference signal unit 147. The digital filter array 139 includes a plurality of digital filters that can be selectively coupled to drive sense circuits of the DSC array 141. A digital filter of the array 139 includes one or more digital filtering stages, where a digital filter stage includes one or more of a finite impulse response (FIR) filter, an infinite impulse response (IIR) filter, comb filter, a polyphase filter, cascaded integrator (CIC) filter, a decimator, an interpolator, bandpass filter, low pass filter, high pass filter, etc.

As a specific example, a digital filter is coupled to receive a signal from a drive sense circuit (e.g., a 1-bit output of a digital to analog converter of the drive sense circuit). The digital filter is programmed, or is fixed, to have a first stage and a second stage. The first stage includes an FIR filter and a decimator and the second stage includes one or more of a discrete Fourier transform (DFT) filter, a fast Fourier transform (FFT), a filter bank (such as an FFT filter bank), etc.

The second coupling network 149 includes selective coupling to couple one or more drive sense circuits to one or more digital filters of the digital filter array 139. The coupling network 149 may be implemented in a variety of ways. For example, the coupling network 149 includes a switching network (e.g., a crossbar switch, cross-point switch, matrix switch, etc.) that allows any one of the drive sense circuits of the DSC array 141 to be coupled to any digital filter of the digital filter array 143. As another example, the coupling network 149 includes a plurality of connections and a plurality of switches (e.g., transistors, relays, etc.) coupling the drive sense circuits to the digital filters. The processing module "opens" or "closes" the switches to enable the desired coupling between desired drive sense circuits and desired digital filters.

The coupling of drive sense circuits to sensors and/or actuators and the programming of the programmable reference signal unit 153 are as discussed with reference to FIG. 29. With this embodiment, the digital filtering is programmable and/or selectable to provide further programming options for setting up, using, and modifying the programmable sensing system 151-1.

FIG. 31A is a schematic block diagram of an example coupling network 145 and/or 149 for a programmable sensing system. In the example, coupling network uses a multiplexer/demultiplexer (mux/demux) arrangement to couple sensors from sensor array 143 (not shown) to drive-sense circuits of drive-sense circuit array 141 (not shown). The multiplexer (MUX) portion selectively forwards input signals from one or more sensors of the sensor array to the demux portion in serial and/or in parallel. The demultiplexer (demux) then forwards the input signals selectively to one or more desired drive-sense circuits of drive-sense circuit array 141.

FIG. 31B is a schematic block diagram of an example programmable reference signal unit for a programmable sensing system. In an example, responsive to an environmental change processing module 42 transmits control signal 147 to one or more reference signal generators 149 of programmable reference signal unit 153. A reference signal generator 149 may be implemented in a variety of ways as previously discussed with reference to FIGS. 14-18. In an embodiment, the reference signal generator 149 is fixed to provide a specific reference signal having a specific shape at a particular frequency, or frequencies. In another embodiment, the reference signal generator 149 is programmable by the processing module to provide a reference signal having a desired shape at a desired frequency, or frequencies.

FIG. 32A is a graphical representation of an example generating a non-sinusoidal reference signal 157 (e.g., a sawtooth waveform, a triangular waveform, a square waveform, etc.). In general, a non-sinusoidal signal is a function of a plurality of sinusoidal signals having different frequencies (e.g., f1, f2, f3, . . . fn). For instance, a square wave is a function of sinusoidal signals based on the following Fourier equation:

$$f(x) = \frac{4}{\pi} \sum_{n=1,3,5,\ldots}^{\infty} \frac{1}{n} \sin\left(\frac{n\pi x}{L}\right)$$

Within the programmable sensing system, the response of the digital filters is known either because it is or it is selected. With this knowledge, the frequencies of sinusoidal signals that sum together to form a non-sinusoidal signal can be selected to fall in the least attenuating frequency bands of the digital filter response (e.g., a raised cosine, a comb filter, sin(x)/x. etc.). This helps preserve information of the non-sinusoidal signal (at least to a degree due to the response of the filter).

FIG. 32B is a schematic diagram of an example of a programmable reference signal generator 149 that includes a plurality of sinusoidal signal generators (e.g., PLLs, digital frequency synthesizers, crystal oscillators, etc.), a plurality of switches, and an adder. Each of the sinusoidal signal generates may be fixed to produce a sinusoidal signal at a specific frequency or programmable to generate a sinusoidal signal having a desired frequency.

Depending on the desired waveform of a reference signal, one or more switches are closed. For example, for a sinusoidal signal at a particular frequency, one of the switches is closed for the corresponding sinusoidal signal generator. For a square wave reference signal, some or all of the switches are closed. The adder adds the sinusoidal signals to produce an approximate square wave signal. The exactness of the square wave signal depends on the number of sinusoidal signals used. In many applications for generating non-sinusoidal signals, 4 or more sinusoidal signals are summed together.

FIG. 33 is a logic diagram of an example of a method of frequency mapping for a communication system that includes drive sense circuits coupled to load devices, which includes sensors, actuators, and/or data source circuits. Within this communication system, each of the drive sense circuits uses a reference signal (e.g., 157 of one or more of FIGS. 14-18) that has one or more oscillating components and/or the drive sense circuit's corresponding load device(s) communicates using one or more oscillating components in their communication signals. For efficient operation of the communication system, reference signals and/or communication signals coupling to the drive sense circuits using frequencies such that the effects on each other is known and optimized for a desire result.

The method begins at step 315 where a processing module of the communication system determines whether there is desired information in cross-coupling between load devices of the sensing system and/or desired information in the cross-coupling between line of the drive sense circuit. Information via cross-coupling is desirable for a variety of reasons. For example, in a touch screen display, the electrodes of the touch screen have a self-capacitance with respect to a common reference (e.g., ground, a common voltage, etc.) and also have a mutual capacitance between physically proximal electrodes (e.g., crossing each other, parallel to each other, etc.). As such, there is useful information in the mutual capacitance, which is an effect of cross coupling of electrodes.

As another example, cross-coupling between the load devices and/or the lines of the drive sense circuits (e.g., the drive and sense line coupling a drive sense circuit to a load device) to determine a frequency spectrum noise pattern in the sensing system. As a specific example, some frequencies of a frequency band have significant interferers in the system, while other frequencies do not. As another specific example, some load devices are more susceptible to interference than other load devices. With this information, frequency sensitivities within the system are known and can be used to optimize the frequencies that are used. The frequency spectrum noise pattern can be updated as often as needed in the communication system.

As yet another example, a first type of data is carried on the lines between the drive sense circuits and the load devices and a second type of data is carried in the cross-coupling between the lines and/or between the load devices. As a specific example, data "x" is encoded into "a"+"b"+ "ab", where encoded part "a" is conveyed on a first line between a first drive sense circuit and a first load device, encoded part "b" is conveyed on a second line between a second drive sense circuit and a second load device, and encoded part "ab" is conveyed in the cross-coupling between the first and second lines and/or between the first and second load devices.

When information in cross-coupling between sensors of the sensing system is not desired, the method continues at step 317 where the processing module determines a number of drive sense circuits in the system that will be used for a current operation (e.g., touch screen sensing, data communication, frequency spectral analysis, environment sensing, tactile stimulation, etc.). In some instances, all of the drive sense circuits will be used. In other instances, less than all of the drive sense circuits will be used. In these instances, the processing module determines with drive sense circuits will be used in a variety of ways. For example, the processing module accesses a look up table where the operation functions as an index to the look up table. As another example, the processing module determines which drive sense circuits to use based on the load devices (e.g., the type of load device, the drive requirements of the load device, the sensitivity of the load device, etc.). Note that the drive sense circuits, while having a common topology, can have different power levels, sensitivity, frequency responses, etc.

The method continues at step 319 where the processing module determines whether different frequencies are required for the drive sense circuits. For example, the drive sense circuits may require different frequencies to sense different features/data points and/or if different types of sensors are present in the sensor array. As a specific example, when the load devices are independent capacitor sensors, the drives sense circuits can use a common frequency for the reference signal. As another specific example, when a drive sense circuit is coupled to a plurality of load devices that are data source circuits, then communication with each load device is allocated a unique frequency. As an extension of the current specific example, other drive sense circuit that are each coupled to multiple data source circuits use the same multiple frequencies as the first drive sense circuit. As an alternate extension of the current specific example, other drive sense circuit that are each coupled to multiple data source circuits use different multiple frequencies from those used by the first drive sense circuit.

When different frequencies are not required, the method continues to step 321, where the processing module allocates a common frequency for use by the drive sense circuits. The method continues at step 323 where the processing module sets digital filtering parameters of the digital filtering circuitry based on the common frequency. The digital filtering circuit is discussed with reference to one or more of FIGS. 5A-5E, 19-21, 29, and 30.

When, at step 315, the processing module determines that there is desired information in the cross-coupling, the method continues at step 325 where the processing module determines the number of drive sense circuits in the system. This is similar to step 317 and further includes the consideration for cross-coupling information.

The method continues with step 327 where the processing module determines a number of cross-couplings to sense per drive sense circuit in the sensing system. The determination may be done in a variety of ways. For example, the processing module determines that cross-coupling between all of the load devices is desired. As another example, the processing module determines that the cross-coupling between some of the load devices is desired. Selecting which cross-couplings of which load devices can be done in a variety of ways. For example, in a touch screen display, cross-coupling of electrodes (e.g., touch screen sensors) is selected when the electrodes are experiencing a change in self-capacitance due to a finger or pen touch. As another example, the processing module determines physical distance between the load devices. For load devices that are within a particular distance with respect to one and other, they are included in the count for cross-coupling. For load devices that are not within the particular distance with respect to one and other, they are not included in the count for cross-coupling.

Continuing from step 327 or when different frequencies are required at step 319, the method continues to step 329 where the processing module determines the number of frequencies needed. The method continues at step 331 where the processing module determines whether there are more frequencies needed than there are available frequencies. A frequency band 347 as shown in FIG. 34 includes a plurality of channels 349 and each channel is centered at its own frequency (f1, f2, . . . fn). The channels are typically equally spaced (e.g., the difference in frequency between two adjacent channels is a fixed frequency offset). For example, the frequency band includes 120 channels, each spaced at 300 Hz starting at 300 Hz or an integer multiple thereof.

For a variety of reasons, one or more channels may be unavailable at a given time. For example, the channel has a frequency that corresponds to the frequency of a large interferer. As another example, a channel has been allocated for a specific function. The remaining channels 349 within the frequency band 347 are deemed to be available.

Returning to the logic diagram of FIG. 34, when the there are enough frequencies (e.g., channels) the method continues at step 333 wherein the processing module allocates frequencies to the drive sense circuits in accordance with data sensing requirements. The method continues at step 239 where the processing module sets digital filtering based on the allocated frequencies. This is similar to step 323, but for a plurality of digital filters.

When more frequencies are required than available, the method continues at step 337 where the processing module determines a frequency reuse pattern. The frequency reuse pattern can be determined in a variety of ways. For example, the processing module accesses a look up table to determine the frequency reuse pattern. As another example, in a large touch screen display, the touch screen is divided into regions, where each region includes a sufficient number of drive sense circuits to use most, if not, all of the available frequencies. In an embodiment, the regions of the touch screen are activated in a time division multiplexed manner. In another embodiment, the regions of the touch screen are activated in a spatial division multiplexed manner (e.g., they are physically separate and the physical separation is used to identify a region). As a further example, the load devices are grouped into regions, where each region includes a sufficient number of drive sense circuits to use most, if not, all of the available frequencies. The regions can be activated in a time division multiplexed manner and/or a spatial division multiplexed manner.

The method continues with step 339 where the processing module allocates frequencies in accordance with the frequency reuse pattern. The method continues with step 341 where the processing module sets digital filtering based on the frequency reuse pattern. This is similar to step 323, but for a plurality of digital filters.

FIG. 35 is a schematic block diagram of an example of a sensing system that includes a plurality of drive sense circuits (DSCs) 28 and a plurality of sensors 353. A sensor 353 functions to convert a physical input into an electrical output and/or an optical output (e.g., capacitor sensors, inductive sensors, accelerometers, piezoelectric sensors, light sensors, etc.). The drive sense circuits 28 provide a regulated source signal or a power signal to the sensors 353 via the drive-sense line. An electrical characteristic of the sensor 353 affects the regulated source signal or power signal, which is reflective of the condition (e.g., the flow rate, temperature, impedance change, pressure, etc.) that the sensor is sensing. The drive sense circuit 28 detects the effect on the reference signal via the drive-sense line and processes the affect to produce a signal representative of power change, which may be an analog or digital signal.

Cross-coupling (e.g., due to the proximity of the sensors 353, parasitic capacitance, etc.) can also affect the signal on the drive sense line of the drive sense circuits 28. Here, each drive sense circuit 28 has a reference signal at a different frequency (e.g., f1, f2, f3, and f4) in accordance with a frequency mapping plan such that the signal provided on its drive sense line has a corresponding frequency. Each drive sense circuit 28 interprets the effect on the signal it provides to a corresponding sensor plus the effects of cross-coupling information. For example, out 1 is a signal including a dominant frequency f1 (e.g., the frequency of its reference signal) and non-dominant cross-coupling frequencies f2, f3, and f4 (e.g., the frequencies of the reference signals of the other drive sense circuits); out 2 is a signal including a dominant frequency f2 and non-dominant cross-coupling frequencies f1, f3, and f4; out 3 is a signal including a dominant frequency f3 and non-dominant cross-coupling frequencies f1, f2, and f4; and out 4 is a signal including a dominant frequency f4 and non-dominant cross-coupling frequencies f1, f2, and f3.

The non-dominant frequencies provide information regarding cross-coupling and the environment. For example, in output 1, the f2 frequency component provides information regarding the cross-coupling between sensors 353-1 and 353-2; the f3 frequency component provides information regarding the cross-coupling between sensors 353-1 and 353-3; and the f4 frequency component provides information regarding the cross-coupling between sensors 353-1 and 353-4. Note only does the non-dominant frequencies provide information about the cross-coupling, it provides information about the reference signals of the other drive sense circuits. Note that data may be modulated into the reference signals for conveyance to one or more other drive sense circuits.

FIG. 36 is a schematic block diagram of an example of the sensing system that includes a plurality of drive sense circuits (DSCs) 28. Each drive sense circuit 28 interprets the effects on the common drive-sense line caused by the other drive sense circuits. A drive sense circuit 28 provides data onto the drive-sense line via its reference signal. For example, each reference signal has its own frequency (f1-f4 in this example) and modulates data onto its reference signal. As a specific example, reference signal at f1 includes a sinusoidal signal having a frequency at f1. Data is modulated on the sinusoidal signal by amplitude modulation (AM), by amplitude shift keying (ASK), phase shift keying (PSK), or other modulation scheme.

The other drive sense circuits "regulate out" the effects of the reference signal at f1 as previously discussed. The amount of regulation corresponds to the changing of the reference signal at f1, which equates to the data modulated thereon. Each drive sense circuit performs similarly with respect to the others' modulated reference signal to receive the modulated data from the other drive sense circuits. The frequencies allocated to the drive sense circuits are done in accordance with a frequency mapping plan.

FIG. 37 is a schematic block diagram of a sensing circuit 201 that includes a transient circuit 203 and a signal source circuit 205 coupled to a sensor 211. The signal source circuit 205, when enabled, provides a signal 221 to the sensor 211 via a conductor (e.g., a wire, a metal trace on printed circuit board, etc.). The signal 221 includes one or more of a direct current (DC) component and an oscillating component. The signal 221 is similar to power signal 116 as discussed with reference to FIGS. 6-7 and 9-11A.

In an example of operation, the sensor is exposed to one or more conditions 213. The condition may be one or more of a physical condition, an electrical condition, a biological condition, a mechanical condition and an optical condition. For example, the sensor 211 is a capacitance sensor that, when exposed to a touch of a finger, changes its impedance. When the sensor 211 is exposed to the condition 213 and is receiving the signal 221, an electrical characteristic (e.g., an impedance, a voltage, a current, etc.) of the sensor 211 affects 219 the signal 221. For example, with the impedance of a capacitive sensor changing due to the touch of a finger and the current of the signal being regulated, the voltage across the sensor changes.

Further, when the sensing circuit 201 is in a noisy environment, transient noise 215 is created. For example, in a liquid crystal display (LCD) touch screen display, the toggling of gate lines (e.g., 25 volts) and/or data lines (e.g., 15 volts) of sub-pixels creates noise. This noise couples into the signal 221 via sub-pixel electrodes. When the noise is of sufficient level (e.g., within 80 dBm or less of the signal, which can adversely affect the signal to noise ratio), it causes the signal 221 to be a noisy signal 217.

In furtherance of the above example, an LCD touch screen display for a tablet, a phone, a television, a monitor, etc., has a resolution of 1080×1920, which means it has 1080 rows of pixels and 1920 columns of pixels. Each pixel includes a plurality of sub-pixels, so that there are 3×1920=5,760 drive lines. In operation, one row of pixels is enabled at a time and all of 5,760 drives lines being enabled at the same time. With a refresh rate of 60 Hz, the 1080 rows are cycled through every $1/60^{th}$ of a second. This creates a very noisy environment for touch screen sensing.

As a specific example, a sensing circuit 201 that drives and senses one electrode of the LCD touch screen display produces the signal 221 to have a power of −20 dBm. Without noise 215, the noise floor for the sensing circuit 201 is of −120 dBm. Thus, a signal to noise ratio (SNR) is 100 dB. When noise 215 is present and it has a magnitude of 40 dBm, the noise floor (a sum of noise and interferers) increases to −80 dBm, which causes the SNR to decrease by 40 dB to 60 dB. As the SNR decreases, the sensing circuit's ability to accurately sense the affect 219 on the signal 221 is reduced.

The transient circuit 203 operates to produce a compensation signal 207 to mitigate the effects of the noise 215 on the conductor when the noise exceeds a threshold (e.g., −100 dBm or greater). For example, the transient circuit 203 produces the compensation signal 207 by comparing the noisy signal 217 with a representation of the noisy signal (e.g., a delayed representation of the noisy signal 217). When the noisy signal compares unfavorably with the representation of the noisy signal (e.g., is greater than the representation signal by a threshold value), the transient circuit supplies the compensation signal 207 to the conductor that is carrying the signal 221 to the sensor. The compensation signal 207 (which has a level corresponding to the level at which the noisy signal compares unfavorably with the representation of the noisy signal) combines with the noisy signal 217 to mitigate the adverse effects of the noise 215.

When the noisy signal compares unfavorably with the representation of the noisy signal at a first level, the transient circuit supplies a first level of the compensation signal (e.g., a first level of current) to the conductor. As another example, when the noisy signal compares unfavorably with the representation of the noisy signal at a second level, the transient circuit supplies a second level (e.g., different than the first) of the compensation signal to the conductor. The transient circuit is described in further detail in reference to FIGS. 39-40.

FIG. 38 is a schematic block diagram of an example of a signal source circuit 205 that includes a power source circuit 231, a change detection circuit 235 and a regulation circuit 233. The power source circuit 231 is operable to source at least one of a voltage and a current to the sensor to produce a signal 221 or to produce a power signal as the signal 221. For instance, the power source circuit 231 produces signal 221 based on a regulation signal 237. The change detection circuit 235, when enabled, is operable to detect the effects on the signal as a result of the electrical characteristic (e.g., an impedance, a voltage, a current, etc.). The change detection circuit 235 is further operable to generate a signal 209 that is representative of change to the signal based on the detected effect on the signal. When enabled, the regulation circuit 233 is operable to generate a regulation signal 237. The regulation signal 237 regulates one or more of the DC component to a desired DC level and the oscillating component to a desired oscillating level. In general, the signal source circuit 205 operates similarly to the drive sense circuit 28 as discussed herein.

FIG. 39 is a schematic block diagram of an example of a sensing system that includes a load 241 (e.g., a sensor 30), a drive sense circuit 28, and a transient circuit 203. The transient circuit 203 includes a delay circuit 243, an operational amplifier (op amp) 245, and a dependent supply source 247. The delay circuit 243 may be implemented in a variety of ways. As an example, the delay circuit 243 includes one or more resistors, one or more inductors and capacitors one or more. As a specific example, the delay circuit is one of a low-pass filter, a bandpass filter, a comb filter, a notch filter, a Chebyshev filter, a Butterworth filter, a Bessel filter and an Elliptic filter. In another example, the delay circuit includes a resistor and a capacitor.

In an example of operation, noise (e.g., thermal, excess charge, gate line switching noise, drive line switching noise, etc.) couples to a signal to produce a noisy signal 217. The delay circuit 243 delays the noisy signal 217 in accordance with its delay properties to produce a delayed signal 179. For example, the delay circuit includes a resistor-capacitor (RC) circuit, which has a time constant of R*C and a cutoff frequency of $1/(2*\pi*RC)$ (i.e., its delay properties). As a specific example, if R=80 K Ohms and C=1 picofarad (pF) capacitor, then the cutoff frequency is about 2 megahertz (MHz) and the time constant (RC) is approximately 80 nanoseconds.

Continuing with the example of operation, the operational amplifier 245 produces a compensation signal 207 based on the noisy signal 217 and its delayed representation 179. For example, the compensation signal 207 will be negligible in comparison to the signal 221 when the noise 215 is low (e.g., less than −100 dBm). As the noise 215 increases, its effect on the signal 221 increases to the point where transients are present on the noisy signal 217. When the transients are of sufficient size (e.g., are not filtered out by the delay circuit 243), the compensation signal increases in value.

As the compensation signal increases in value (or decreases in value depending on the polarity of the op amp 245), the dependent supply source 247 produces a supply (e.g., a current, a voltage, etc.). The produced supply is inversely proportional to the transients on the noisy signal 217; thereby effectively cancelling the transients. As the transients increase, the produced supply increases to continue to substantially cancel the transients, or at least render the transients negligible.

FIG. 40 is a schematic block diagram of another embodiment of a transient circuit 203. The transient circuit 203 includes a plurality of integrators 251 (alternatively a plurality of low pass filters), a plurality of operational amplifiers 245, and a plurality of dependent supply sources 247-1 and -2. In an example of operation, when a supply (e.g., voltage) on the line changes rapidly (e.g. transient) the differential circuit operates to mitigate the rapid change so that the drive sense circuit 28-b maintains a normal operating condition. The mitigation may be done by pulling up on the signal 221 by supply source 247-1 (e.g., sourcing a current) or by pulling down on the signal 221 by supply source 247-2 (e.g., sinking a current).

In a specific example, toggling of data lines or gate lines adds an amount of charge onto a capacitance of the load 241 (e.g., capacitance associated with electrodes of an LCD touch screen display). A drive-sense circuit 28-b provides the signal 221 to one of the electrodes (e.g., load 241 in the present figure), which is subject to the noise produced by the toggling of gate and data lines. The transient circuit 203 operates to track the excess charge in the capacitance of the electrode due to the noise and remove at least some of the excess charge before it can substantially affect operation of the drive-sense circuit.

FIG. 41 is a schematic block diagram of an example of a sensing circuit that includes a transient circuit 203, a comparator 265, a dependent current source 247, an analog to digital converter (ADC) 263 and a digital to analog converter (DAC) 261. The ADC 263 is one of: a flash ADC, a successive approximation ADC, a ramp-compare ADC, a Wilkinson ADC, an integrating ADC, a delta encoded ADC, and/or a sigma-delta ADC. The DAC 261 is one of a sigma-delta DAC, a pulse width modulator DAC, a binary weighted DAC, a successive approximation DAC, and/or a thermometer-coded DAC.

In an example of operation, the dependent supply source 247 is powered by a DC source (e.g., DC in) and generates a regulated source signal 271 based the analog regulation signal 267. The regulated source signal 271 is provided to a load (e.g., a sensor, an electrode of a touch screen display, etc.). The load affects 271 the signal 271, which is compared to a reference source signal 273 by the comparator 265. The comparator 265, the ADC 263, and the DAC 216 function to keep the regulated signal 271 substantially matching the reference source signal 273. The error correction to do this is representative of the effect on the signal, which corresponds to a change of the load.

The analog to digital converter 263 converts the comparison signal 277 into a digital signal 269, which corresponds to the error correction and is representative of the affect 275 on the signal 271. The DAC 261 converts the digital signal 269 into an analog regulated signal 267 based on the compensation signal 207. The transient circuit 203 operates as previously discussed to produce the compensation signal 207.

FIG. 42 is a schematic block diagram of another embodiment of a sensing circuit that includes the transient circuit 203, the comparator 265, the dependent current source 247, the analog to digital converter (ADC) 263 and the digital to analog converter (DAC) 261 of FIG. 41. The sensing circuit further includes an alternating current (AC) coupling capacitor 255. The AC coupling capacitor 255 couples the transient circuit 203 with the output of the DAC 261 to produce the analog regulation signal 267. The dependent supply source 247 generates the regulated source signal 271 to include inverse components of the noise transients, thereby rendering them negligible.

FIG. 43 is a schematic block diagram of another embodiment of a sensing circuit that includes the transient circuit 203, the comparator 265, the dependent current source 247, the analog to digital converter (ADC) 263 and the digital to analog converter (DAC) 261 of FIG. 41. The sensing circuit further includes a second analog to digital converter (ADC) 283 and a digital summing circuit 285. The ADC 283 converts the compensation signal 207 to a digital signal 291. The digital summing circuit 285 sums (e.g., adds, averages, etc.) the digital signal 291 and the digital signal 269 to produce a combined digital signal 293. The digital summing circuit may be implemented in a variety of ways. For example, the digital summing circuit 285 includes an adder. As another example, the digital summing circuit 285 includes an adder and a digital root mean square (RMS) function. As another example, the digital summing circuit 285 is a digital averaging circuit. As yet another example, the digital summing circuit 285 is weighted average circuit.

As a further example, the digital summing circuit 285 includes a threshold circuit and one of the adder, the digital averaging circuit and the weighted averaging circuit. The threshold circuit functions to provide the digital signal 291 to the adder, digital averaging circuit, or the weighted averaging circuit when the digital signal 291 is above a threshold (e.g., representing a transient signal with an amplitude of 50 mV or more) and to provide a zero digital signal to the adder, digital averaging circuit, or the weighted averaging circuit when the digital signal 291 is at or below the threshold.

The DAC 261 converts the combined digital signal 293 into the analog regulation signal 267. The dependent supply source 247 generates the regulated source signal 271 to include inverse components of the noise transients, thereby rendering them negligible.

FIG. 44 is a schematic block diagram of another embodiment of a drive sense circuit 28-c coupled to a sensor 30. As previously discussed, the sensor 30 senses a condition 114 and causes an affect 219 on a reference source signal 273. The drive sense circuit 28-c includes an operational amplifier (op amp) 301, a current source 277, an analog to digital converter 263, a resistor R1 and a transistor T1.

The transistor T1 is coupled to op amp 301 as a source follower. As configured, the transistor T1 and the op amp 301 function to keep the voltage of the regulated source signal 273 substantially equal to the reference source signal 273. The reference source signal 273 is similar to reference signal 157 of one or more of FIGS. 14-18.

As the impedance of the sensor 30 changes due to changes in the condition 114, the impedance changes affect the current ($I_3$) of the regulated source signal 271. Since the voltage of the regulated source signal 271 is regulated to substantially match the voltage of the reference source signal 273, the current ($I_3$) of the regulated source signal 271 varies in accordance with the fixed voltage of the regulated source signal divided by the changing impedance of the sensor 30.

As the current ($I_3$) of the regulated source signal 271 changes, the op amp 301 adjusts the comparison signal 345 to keep the voltage of the regulated source signal 271 substantially matching the voltage of the reference source signal 273. With the transistor T1 operated in the Ohmic region, as the comparison signal 345 changes, the voltage ($V_{R1}$) across resistor R1 changes based on changes to the current ($I_1$) through the resistor R1. Current ($I_1$) equals the current ($I_3$) of the regulated source signal 271 plus the current ($I_2$) of the current source 277. Since the current ($I_2$) of the current source 277 is fixed, the current ($I_1$) through the resistor R1 varies proportionally to the varying of the current ($I_3$) of the regulated source signal 271.

Thus, the error correction to keep the voltage of the regulated source signal 271 substantially matching the voltage of the reference source signal 273 is reflected in the changes in the current ($I_1$) through resistor R1. As the current ($I_1$) varies, so does the voltage ($V_{R1}$) across the resistor R1. The supply voltage (Vdd) less the voltage ($V_{R1}$) provides an analog input voltage 333 for the analog to digital converter 263. The analog to digital converter 263 converts the voltage at the analog input voltage 333 into a digital sensed signal 309, which is representative of the affect 219 that the sensor 30 has on the reference source signal 273.

FIG. 45 is a schematic block diagram of another embodiment of a drive sense circuit 28-d coupled to a sensor 30. As previously discussed, the sensor 30 senses a condition 114 and causes an affect 219 on a reference source signal 273. The drive sense circuit 28-d includes an operational amplifier (op amp) 301, a current source 277, an analog to digital converter 263, and a transistor T1.

The op amp 301 is coupled as a unity gain amplifier. As configured, the op amp 301 functions to keep the voltage of the regulated source signal 273 substantially equal to the reference source signal 273. The reference source signal 273 is similar to reference signal 157 of one or more of FIGS. 14-18.

As the impedance of the sensor 30 changes due to changes in the condition 114, the impedance changes affect the current ($I_3$) of the regulated source signal 271. Since the voltage of the regulated source signal 271 is regulated to substantially match the voltage of the reference source signal 273, the current ($I_3$) of the regulated source signal 271 varies in accordance with the fixed voltage of the regulated source signal divided by the changing impedance of the sensor 30.

As the current ($I_3$) of the regulated source signal 271 changes, the op amp 301 operates to keep the voltage of the regulated source signal 271 substantially matching the voltage of the reference source signal 273. As shown, the current ($I_1$) through transistor T1 equals the current ($I_3$) of the regulated source signal 271 (e.g., the current of the sensor 30) plus the current ($I_2$) of the current source 277. Since the current ($I_2$) of the current source 277 is fixed, the current ($I_1$) through the transistor T1 varies proportionally to the varying of the current ($I_3$) of the regulated source signal 271 (e.g., current (I3) of the sensor 30).

Thus, the error correction to keep the voltage of the regulated source signal 271 substantially matching the voltage of the reference source signal 273 is reflected in the changes in the current ($I_1$) through transistor T1, which is biased to substantially remain the Ohmic region via the bias voltage 335. As the current ($I_1$) varies, so does the voltage ($V_{T1}$) across the transistor T1. The supply voltage (Vdd) less the voltage ($V_{T1}$) provides an analog input voltage 333 for the analog to digital converter 263. The analog to digital converter 263 converts the voltage at the analog input voltage 333 into a digital sensed signal 309, which is representative of the affect 219 that the sensor 30 has on the reference source signal 273.

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A data sense circuit comprises:
   an analog time domain circuit operable to:
      generate an analog frequency domain signal;
      provide, when operably coupled to a device, the analog frequency domain signal to the device; and
      generate an analog frequency domain error correction signal based on an effect the device has on the analog frequency domain signal, wherein the analog frequency domain error correction signal includes embedded frequency domain data representative of the effect;
   an analog to digital circuit operable to covert the analog frequency domain error correction signal into a digital frequency domain error correction signal; and
   a digital frequency domain circuit operable to generate digital data regarding the device based on the digital frequency domain error correction signal.

2. The data sense circuit of claim 1, wherein the analog time domain circuit is further operable to:
   generate the analog frequency domain signal based on a reference signal.

3. The data sense circuit of claim 1, wherein the analog time domain circuit is further operable to generate an analog frequency domain error correction signal by:
   adjusting a current level or a voltage level of the analog frequency domain signal based on a resistance change of the device;
   comparing the adjusting of the current level or the voltage level with a current component or a voltage component of a reference signal; and
   generating the analog frequency domain error correction signal based on the comparing of the adjusting of the current level or the voltage level with the current component or the voltage component of the reference signal, wherein the resistance change of the device corresponds to the digital data.

4. The data sense circuit of claim 3 further comprises:
   the resistance change of the device occurring at a particular rate that corresponds to a frequency of the embedded frequency domain data, and wherein the data sense circuit operates in time domain on information that is in the frequency domain.

5. The data sense circuit of claim 1, wherein the analog time domain circuit is further operable to generate an analog frequency domain error correction signal by:
   generating the analog frequency domain signal to include an oscillating component at a frequency;
   regulating a current level or a voltage level of the oscillating component of the analog frequency domain signal based on impedance of the device; and
   generating the analog frequency domain error correction signal based on the regulating of the current level or the voltage level of the oscillating component, wherein the impedance of the device corresponds to the digital data.

6. The data sense circuit of claim 1, wherein the analog time domain circuit comprises:
   an operational amplifier and further comprises:
   a dependent current source coupled to an input of the operational amplifier; or
   a dependent voltage source coupled to an input of the operational amplifier, wherein the input of operational amplifier is further operably coupled to the device.

7. The data sense circuit of claim 1, wherein the digital frequency domain circuit comprises:
   one or more finite impulse response (FIR) filters;
   one or more cascaded integrated comb (CIC) filters;
   one or more infinite impulse response (FIR) filters;
   one or more decimation stages;
   one or more fast Fourier transform (FFT) filters; and/or
   one or more discrete Fourier transform (DFT) filters.

8. The data sense circuit of claim 1 further comprises:
   a digital to analog feedback circuit operably coupled to an output of the analog to digital circuit and to the analog time domain circuit.

9. The data sense circuit of claim 1, wherein the analog time domain circuit is further operable to:

provide, when operably coupled to the device, the analog frequency domain signal to the device, wherein the device is a sensor that senses a condition.

10. The data sense circuit of claim 1 further comprises:
the analog time domain circuit operable to:
  generate a second analog frequency domain signal;
  provide, when operably coupled to a second device, the second analog frequency domain signal to the second device, wherein the second analog frequency domain signal has a second frequency component that is different than a frequency component of the analog frequency domain signal; and
  generate the analog frequency domain error correction signal based on the effect the device has on the analog frequency domain signal and based on a second effect the second device has on the second analog frequency domain signal;
the analog to digital circuit operable to covert the analog frequency domain error correction signal into a digital frequency domain error correction signal; and
the digital frequency domain circuit operable to:
  generate the digital data regarding the device based on the digital frequency domain error correction signal; and
  generate second digital data regarding the second device based on the digital frequency domain error correction signal and in accordance with the second frequency component.

11. A touch controller comprises:
a touch processing module; and
a plurality of drive sense circuits coupled to the touch processing module, wherein a drive sense circuit of the plurality of drive sense circuits includes:
  an analog time domain circuit operable to:
    generate an analog frequency domain signal;
    provide, when operably coupled to a sensor of a touch screen, the analog frequency domain signal to the sensor; and
    generate an analog frequency domain error correction signal based on an effect the sensor has on the analog frequency domain signal, wherein the analog frequency domain error correction signal includes embedded frequency domain data representative of the effect;
  an analog to digital circuit operable to covert the analog frequency domain error correction signal into a digital frequency domain error correction signal; and
  a digital frequency domain circuit operable to generate digital data regarding the sensor based on the digital frequency domain error correction signal; and
wherein the touch processing module is operable to process the digital data into touch sense data.

12. The touch controller of claim 11, wherein the analog time domain circuit is further operable to:
generate the analog frequency domain signal based on a reference signal.

13. The touch controller of claim 11, wherein the analog time domain circuit is further operable to generate an analog frequency domain error correction signal by:
adjusting a current level or a voltage level of the analog frequency domain signal based on a resistance change of the sensor;
comparing the adjusting of the current level or the voltage level with a current component or a voltage component of a reference signal; and
generating the analog frequency domain error correction signal based on the comparing of the adjusting of the current level or the voltage level with the current component or the voltage component of the reference signal, wherein the resistance change of the sensor corresponds to the digital data.

14. The touch controller of claim 13 further comprises:
the resistance change of the sensor occurring at a particular rate that corresponds to a frequency of the embedded frequency domain data, and wherein the drive sense circuit operates in time domain on information that is in the frequency domain.

15. The touch controller of claim 11, wherein the analog time domain circuit is further operable to generate an analog frequency domain error correction signal by:
generating the analog frequency domain signal to include an oscillating component at a frequency;
regulating a current level or a voltage level of the oscillating component of the analog frequency domain signal based on impedance of the sensor; and
generating the analog frequency domain error correction signal based on the regulating of the current level or the voltage level of the oscillating component, wherein the impedance of the sensor corresponds to the digital data.

16. The touch controller of claim 11, wherein the analog time domain circuit comprises:
an operational amplifier and further comprises:
  a dependent current source coupled to an input of the operational amplifier; or
  a dependent voltage source coupled to an input of the operational amplifier, wherein the input of operational amplifier is further operably coupled to the sensor.

17. The touch controller of claim 11, wherein the digital frequency domain circuit comprises:
one or more finite impulse response (FIR) filters;
one or more cascaded integrated comb (CIC) filters;
one or more infinite impulse response (FIR) filters;
one or more decimation stages;
one or more fast Fourier transform (FFT) filters; and/or
one or more discrete Fourier transform (DFT) filters.

18. The touch controller of claim 11 further comprises:
a digital to analog feedback circuit operably coupled to an output of the analog to digital circuit and to the analog time domain circuit.

19. The touch controller of claim 11, wherein the drive sense circuit further comprises:
the analog time domain circuit operable to:
  generate a second analog frequency domain signal;
  provide, when operably coupled to a second sensor, the second analog frequency domain signal to the second sensor, wherein the second analog frequency domain signal has a second frequency component that is different than a frequency component of the analog frequency domain signal; and
  generate the analog frequency domain error correction signal based on the effect the sensor has on the analog frequency domain signal and based on a second effect the second sensor has on the second analog frequency domain signal;
the analog to digital circuit operable to covert the analog frequency domain error correction signal into a digital frequency domain error correction signal; and
the digital frequency domain circuit operable to:
  generate the digital data regarding the sensor based on the digital frequency domain error correction signal; and generate second digital data regarding the second sensor based on the digital frequency domain error correction signal and in accordance with the second frequency component.

\* \* \* \* \*